(12) United States Patent
Kawano

(10) Patent No.: US 9,244,315 B2
(45) Date of Patent: Jan. 26, 2016

(54) ACTIVE MATRIX DISPLAY DEVICE

(76) Inventor: Hideo Kawano, Kawasaki (JP)

(*) Notice: Subject to any disclaimer, the term of this patent is extended or adjusted under 35 U.S.C. 154(b) by 134 days.

(21) Appl. No.: 14/343,419

(22) PCT Filed: May 30, 2012

(86) PCT No.: PCT/JP2012/063875
§ 371 (c)(1),
(2), (4) Date: May 7, 2014

(87) PCT Pub. No.: WO2013/035394
PCT Pub. Date: Mar. 14, 2013

(65) Prior Publication Data
US 2014/0253858 A1    Sep. 11, 2014

(30) Foreign Application Priority Data

Sep. 7, 2011  (JP) .................................. 2011-195384

(51) Int. Cl.
*G02F 1/1343* (2006.01)
*G09G 3/36* (2006.01)
*H01L 27/32* (2006.01)
*H01L 27/12* (2006.01)
*G02F 1/1362* (2006.01)
*H01L 29/417* (2006.01)

(52) U.S. Cl.
CPC ........ *G02F 1/134336* (2013.01); *G02F 1/1362* (2013.01); *G02F 1/13439* (2013.01); *G09G 3/3648* (2013.01); *H01L 27/1225* (2013.01); *H01L 27/1255* (2013.01); *H01L 27/3276* (2013.01); *G09G 2300/0417* (2013.01); *G09G 2300/0819* (2013.01); *G09G 2300/0852* (2013.01); *G09G 2320/0247* (2013.01); *H01L 29/41733* (2013.01)

(58) Field of Classification Search
None
See application file for complete search history.

(56) References Cited

FOREIGN PATENT DOCUMENTS

| JP | 10-79515 | 3/1998 |
|---|---|---|
| JP | 2000-150900 A | 5/2000 |
| JP | 2003-177725 A | 6/2003 |
| JP | 2006-165529 A | 6/2006 |

(Continued)

OTHER PUBLICATIONS

Yasuhiro Ukai, "Thin Film Transistor Technologies Used in Liquid Crystal Displays: Past, Present and Future," Ekisho, Japanese Liquid Crystal Society, Jul. 25, 2011, vol. 15, No. 3, p. 201-216.

(Continued)

*Primary Examiner* — Nicholas Lee
*Assistant Examiner* — Duane N Taylor, Jr.
(74) *Attorney, Agent, or Firm* — Howard & Howard Attorneys PLLC

(57) ABSTRACT

To restrain decrease of display quality because of increases in flicker level and decrease of uniformity in screen luminance caused by increases in the overcharging effect when an amorphous metal oxide semiconductor or an organic semiconductor that has an field-effect mobility greater than amorphous silicon is used for pixel TFTs in a liquid crystal display device or organic EL display device. A new relational formula is derived for punch-through voltage in gray scale display, where the visibility of flicker, screen burn-in, and the like is high, and in-plane differential in counter electrode potential, which are an index of the overcharging effect. A design is made so as to satisfy conditions for decreasing the in-plane differential in counter electrode potential that have been newly derived on the basis of this formula to an allowable limit value or less.

24 Claims, 25 Drawing Sheets

(56) References Cited

FOREIGN PATENT DOCUMENTS

| | | | |
|---|---|---|---|
| JP | 2008-277101 A | 11/2008 | |
| WO | 2005/006449 A1 | 1/2005 | |

OTHER PUBLICATIONS

H. Godo, et al., "AMD1-2: Modeling and Measurement of Ultra-Low Leakage Current of a-IGZO TFTs and New Driving Method of LCDs," IDW'10, (US), Dec. 1, 2010, p. 235-238.

Aug. 8, 2012 "International Search Report" for PCT/JP2012/063875.

(A)

Position on scanning signal line (B)

(A)

(B)

ACTIVE MATRIX DISPLAY DEVICE

FIELD OF THE ART

The present invention relates to technology which reduces deteriorating of a display quality in active matrix display devices which arrange transistors as switching elements in each pixel, particularly relates to the technology which reduces the deteriorating of the display quality by overcharging effect which is caused by time constant of a scanning signal line and is promoted by increase of field-effect mobility of the transistors.

BACKGROUND OF THE ART

Currently, thin film transistor (hereinafter called TFT) with amorphous silicon thin film is utilized as a switching element of such as liquid crystal display devices which are put to practical use in such as monitors of television receiver or personal computers. However, field-effect mobility of the amorphous silicon is extremely small compared with crystalline silicon or polysilicon less than 100 cm2/Vs, it is approximately 0.5-1 cm2/Vs. Therefore, size of the TFT with amorphous silicon thin film, especially channel width must be large to ensure necessary amount of current to charge load capacitance with liquid crystal display getting larger and higher in resolution or higher speed response.

As the result, parasitic capacitance of the TFT increases, and the increased parasitic capacitance causes increase of auxiliary capacitance which has a function to decrease negative effects of the parasitic capacitance. The auxiliary capacitance is formed as a crossover capacitance of auxiliary capacitance line and pixel electrode, moreover the auxiliary capacitance line ought to be formed by opaque metal with low resistivity to decreases the time constant. Therefore, as the result, the increase of the auxiliary capacitance causes the increase of the area of the auxiliary capacitance line and also causes the decrease of aperture ratio. That is to say, there is a limit to keep on using TFTs with amorphous silicon thin film as the switching element of the pixel, because it comes difficulty to secure the enough aperture ratio with liquid crystal display getting larger and higher in resolution or higher speed response.

On the other hand, recently, semiconductor elements which use metal oxide semiconductor thin film attract attention. Although behavior of this thin film is different by film formation method or process condition, the field-effect mobility of 3 cm2/Vs or more in Soluble type or the field-effect mobility of 10 cm2/Vs or more in the film formation method by sputtering technique are indicated, and further higher field-effect mobility is expected based on the future study. Besides, this thin film has such as features of availability to form in lower temperature or transparency for visible light, and it is possible to form flexible and transparent TFT on transparent substrate such as plastic substrate or film (Patent document No. 1).

Besides, as oxide semiconductor film which is used in active layer of the TFT, semi-insulating and transparent amorphous thin film which is composed from the oxide including In, Ga and Zn is known. The structure of top gate type TFT which uses this in channel layer and uses the matter which laminates Au film on the layer of InGaZnO3(ZnO)4 which has the large electric conductivity as source-drain electrode is disclosed. Further, the prior art that the TFT of amorphous InGaZnO4 has the extremely large field-effect mobility compared with the amorphous silicon thin film transistor is disclosed (Patent document No. 2).

And then, active research and development for utilizing the TFT which has such the excellent characteristics is now performed in not only the liquid crystal display device but also the other display devices. Further, development of organic TFT which does not need expensive vacuum equipments as manufacturing equipments is performed actively, recently, the matter that the field-effect mobility exceeds 1 cm2/Vs is reported, and the research and development which purposes the application to the display device is performed energetically. Patent document No. 3 discloses the technology which decreases flicker which occurs by redistribution of the electrical charge and the time constant of the scanning line in Cs on gate type array substrate which forms the auxiliary capacitance between the pixel electrodes which are arranged by superimposing partly through the scanning line of previous stage of scanning direction and insulating film.

PRIOR ART DOCUMENT

Patent Document

[Patent document No. 1] JP-2000-150900-A
[Patent document No. 2] JP-2006-165529-A
[Patent document No. 3] JP-2003-177725-A

SUMMARY OF THE INVENTION

Problem to be Solved by the Invention

FIG. 1 is a general equivalent circuit schematic corresponding to a part of array substrate of the liquid crystal display device 10, and multiple pixel areas which are surrounded by scanning signal lines 11a, 11b, . . . , 11n and display signal lines 13a, 13b, . . . , 13m are arranged in a matrix state. The scanning signal lines and the display signal lines have respectively resistance, and capacitance is formed in each crossover area. Therefore, each signal potential (Vg, Vsig) which is respectively applied to feeding electrode which is placed at end of each wiring delays and propagates in a distorted state by each the time constant which is decided by the resistance and the capacitance. Here, the time constant is 1−1/e≈632, that is, the time constant is the time required to change of the potential of 63.2% for variation amount of the potential which is applied to the feeding electrode of the wiring.

FIG. 2 is a general equivalent circuit schematic of the pixel area which is indicated in FIG. 1, and gate electrode of the TFT 15a is connected to the scanning signal line 11a, drain electrode is connected to the display signal line 13a, and source electrode is connected to the pixel electrode 19a respectively. The pixel electrode 19a is placed on the insulating film as crossover to the auxiliary capacitance line 25a which is covered by the insulating film and is arranged almost in parallel to the scanning signal line 11a, then the crossover portion becomes the auxiliary capacitance Cs. The auxiliary capacitance line 25a has also the resistance, and the capacitance is also formed in the crossover portion with the display signal line 13a.

Here, because it is necessary to form the auxiliary capacitance line 25a by opaque metal with low resistivity to decrease the resistance, its existence decreases the aperture ratio. Various techniques are used to restrain the decrease of the aperture ratio in the constitution of the auxiliary capacitance, for example, the auxiliary capacitance can be formed in the crossover area of the electrode which is connected electrically to the pixel electrode 19a and the auxiliary capacitance line 25a or the auxiliary capacitance can be formed without arranging the auxiliary capacitance line 25a in the crossover area of the extending portion of the pixel electrode 19a and the scanning signal line of the upper or lower pixel.

Besides, the parasitic capacitance Cgs between the gate and the source is formed between the gate electrode and the source electrode of the TFT 15a. The liquid crystal display device 10 is composed by tucking liquid crystal layer 17a between first substrate which is composed by arranging such wirings or pixels on same insulating substrate and second substrate which is comprised by the insulating substrate. Counter electrode 21a which composes liquid crystal capacitance Clc by tucking the liquid crystal layer 17a with the pixel electrode 19a is arranged on the first substrate or the second substrate.

FIG. 3 is a timing chart which indicates gate electrode potential Vgl, Vgh, display signal line potential Vsig, pixel electrode potential Vp and counter electrode potential Vcom in case of a positive polarity charging that the pixel electrode potential Vp is higher than the counter electrode potential Vcom to the load capacitance Cload. FIG. 3 (A) relates to the pixel (Left) which is near to the feeding electrode of the scanning signal line 11a and FIG. 3 (B) relates to the pixel (Right) which is far from the feeding electrode of the scanning signal line 11a.

In FIG. 3, pulsed scanning signal line potential Vg which applies the gate potential Vgh that TFT 15a becomes ON-state only during selection period of the scanning signal line 11a and applies the gate potential Vgl that TFT 15a becomes OFF-state during non-selection period respectively is applied to the feeding electrode of the scanning signal line 11a. When the scanning signal line potential Vg which is applied to the feeding electrode of the scanning signal line 11a changes over from Vgl to Vgh, because the transition time that gate electrode potential transits from Vgl to Vgh becomes longer as the distance from the feeding electrode by influence of the time constant τg of the scanning signal line 11a, the transition time that TFT transits from OFF-state to ON-state also becomes longer as the distance from the feeding electrode by influence of the time constant τg of the scanning signal line 11a. Therefore, the time to charge the load capacitance Cload during the selection period becomes shorter with increasing the transition time.

Here, the load capacitance Cload is provided by a next formula.

$$Cload = Clc + Cs + Cgs + Cother$$

Here, Cother is summation of coupling capacitances which are formed between the pixel electrode 19a and each wiring of its circumference. Therefore, in design of the liquid crystal display device 10, TFT size is decided for the farthest pixel from the feeding electrode to charge the load capacitance Cload fully during the selection period. Also in any of FIG. 3 (A) and FIG. 3 (B), when the charge completes before expiration of the selection period, the potential Vp of the pixel electrode 19a, that is, source electrode potential Vs becomes almost equivalent to the potential of the display signal line 13a, that is, drain electrode potential Vd, and because electric current toward the load capacitance Cload from the TFT 15a does not flow, the shifting of the pixel electrode potential Vp caused by the charging has stopped. As this result, at the time of the expiration of the selection period, the pixel electrode potential Vp of each pixel which is connected to the same scanning signal line becomes almost equivalent.

When the selection period expires, the scanning signal line potential Vg which is applied to the feeding electrode of the scanning signal line 11a is changed over from gate electrode potential Vgh of the ON-state TFT to gate electrode potential Vgl of the OFF-state TFT, and in each TFT 15a whose gate electrode is connected to the scanning signal line 11a, conduction state of the TFT begins transition from the ON-state toward the OFF-state. Because the change of the gate electrode potential from Vgh of the ON-state TFT to Vgl of the OFF-state TFT is also influenced by the time constant τg of the scanning signal line 11a, the transition time from Vgh to Vgl becomes longer as the distance from the feeding electrode. That is, when scanning signal which is applied to the scanning signal line 11a is rectangular pulse, in the TFT 15a which is arranged at neighborhood of the feeding electrode, the scanning signal potential Vg decreases from Vgh of the ON-state TFT to the Vgl of the OFF-state TFT in a moment and the TFT 15a becomes the OFF-state, and the shifting amount ΔVg of this scanning signal line potential Vg decreases the pixel electrode potential Vp through the parasitic capacitance Cgs.

Decrease amount ΔVp of the pixel electrode potential Vp at this time is indicated in the next formula in the case of ΔVg=Vgh−Vgl.

$$\Delta Vp = (Cgs/Cload)\Delta Vg \tag{1}$$

The decrease amount ΔVp of the pixel electrode potential may be considered as the decrease amount of the pixel electrode potential Vp by coupling effect through the parasitic capacitance Cgs, or the decrease amount ΔVp of the pixel electrode potential may be considered as the decrease amount of the pixel electrode potential Vp which is caused by charge redistribution depending on polarity change of applied voltage of the parasitic capacitance Cgs while retaining total amount of the charge which is stored in the load capacitance Cload when the gate electrode potential changes from the potential Vgh of the ON-state TFT to the potential Vgl of the OFF-state TFT. A phenomenon that the pixel electrode potential Vp decreases from the potential at the time of expiration of the selection period to the potential corresponding to the TFT 15a of the OFF-state is called "punch-through", and the decrease amount ΔVp of the pixel electrode potential Vp in that time is called a punch-through voltage ΔVp.

At the time of the expiration of the selection period, because Vd is Vd≈Vs, voltage Vds between the source and the drain becomes Vds≈0, and the electric current does not flow from the display signal line 13a toward the pixel electrode 19a. However, Vds becomes Vds=ΔVp caused by this decrease of the pixel electrode potential Vp, the electric current depending on voltage Vgs between the gate and the source flows from the display signal line 13a toward the pixel electrode 19a. In the neighborhood of the feeding electrode of the scanning signal line 11a, because the gate electrode potential decreases instantly from the potential Vgh of the ON-state TFT to the potential Vgl of the OFF-state TFT and the TFT 15a becomes the OFF-state, only slight electric current of the electric current Ioff level which flows between the drain and the source when the gate electrode potential is the gate potential Vgl of the OFF-state TFT flows even if Vds becomes Vds=ΔVp. Therefore, the change of the pixel electrode potential Vp due to this can be ignored.

However, because the transition time of decreasing the potential from the potential Vgh of the ON-state TFT to the potential Vgl of the OFF-state TFT becomes longer increasing as the distance of the TFT 15a parts from the feeding electrode of the scanning signal line 11a, the TFT 15a does not transit from the ON-state to the OFF-state in a moment, and the electric current depended on the voltage Vds between the source and the drain in the transition period before the TFT 15a has completely transited to the OFF-state flows from the display signal line 13a toward the pixel electrode 19a.

That is, the charge to the load capacitance Cload is continued even after the selection period has expired, and the punch-through voltage ΔVp decreases. Result of combining the two phenomena that pixel electrode potential Vp decreases by the punch-through and increases by the charging, the effective punch-through voltage ΔVp which behaves actual punch-through voltage decreases.

For example, in case of charging whole screen to the same potential of positive polarity, each of pixel electrode potential Vp in the screen when the TFT 15*a* has transited to the OFF-state is not same but rises as the distance from the feeding electrode of the scanning signal line 11*a* because the effective punch-through voltage ΔVp decreases as the distance from the feeding electrode of the scanning signal line 11*a*. As this result, liquid crystal layer applied voltage which is the difference of the counter electrode potential Vcom and the pixel electrode potential Vp increases as the distance from the feeding electrode of the scanning signal line 11*a*. In case of negative polarity charging, because the pixel electrode potential Vp, that is, the source electrode potential Vs is lower than the case of the positive polarity charging, the voltage Vgs between the gate and the source becomes larger than the positive case, and charge amount to the load capacitance which is continued after expiration of the selection period becomes also larger than the positive case.

Therefore, the effective punch-through voltage in the negative polarity charging becomes small than the case of the positive polarity charging. Here, when the display signal line potential and the effective punch-through voltage in the positive polarity charging are considered to be Vsig+ and ΔVp+ respectively, when the display signal line potential and the effective punch-through voltage in the negative polarity charging are considered to be Vsig− and ΔVp− respectively, and when each positive polarity and negative polarity pixel electrode potential in the OFF-state of the TFT 15*a* are considered to be Vp+ and Vp− respectively, Vp+ and Vp− are indicated in the next formulas respectively.

$$Vp+ = (Vsig+) - (\Delta Vp+)$$

$$Vp- = (Vsig-) - (\Delta Vp-)$$

Besides, it can be considered that the voltage which is applied effectively to the liquid crystal layer approximately corresponds to mean value of the liquid crystal layer applied voltage in the positive polarity and the negative polarity. Accordingly, when mean liquid crystal layer applied voltage in the positive polarity and the negative polarity is considered to be Vavg, Vavg is indicated in the next formula.

$$Vavg = [\{(Vp+) - Vcom\} + \{Vcom - (Vp-)\}]/2$$

$$= \{(Vsig+) - (Vsig-)\}/2\{\Delta Vp-) - (\Delta Vp+)\}/2$$

From this, in the pixel which is near to the feeding electrode of the scanning signal line, because the charge to the load capacitance after expiration of the selection period is not continued, it is ΔVp−=ΔVp+, and the mean liquid crystal layer applied voltage becomes Vavg={(Vsig+)−(Vsig−)}/2. In the pixel which is distant from the feeding electrode of the scanning signal line, because it becomes ΔVp−<ΔVp+ by the overcharge, the mean liquid crystal layer applied voltage decreases than the pixel which is near to the feeding electrode of the scanning signal line. Therefore, the mean voltage which is applied to the liquid crystal layer 17*a*, that is, the effective applied voltage decreases than the predefined applied voltage as the TFT 15*a* parts from the feeding electrode of the scanning signal line 11*a*.

Generally, the period that the TFT 15*a* becomes the OFF-state after expiration of the selection period is called overcharging period, the electric current which flows to the pixel electrode from TFT 15*a* in the overcharging period is called an overcharging electric current, the charge to the load capacitance Cload by the overcharging electric current is called overcharge, and various phenomena which is caused by the overcharge are totally called overcharging effect.

As described above, in the liquid crystal display device, the pixel electrode potential Vp shifts from the predefined potential by the overcharging effect, and its shift amount increases as the distance from the feeding electrode of the scanning signal line 11*a*. As this result, various display defects or the deterioration of the display quality is caused. For example, when the whole screen displays same gray scale, originally, the liquid crystal layer applied voltage of the whole screen should be equivalent. However, because the liquid crystal layer applied voltage decreases from the feeding electrode side of the scanning signal line toward termination side by the overcharging effect, gentle luminance distribution which is called luminance slope occurs. However, when the overcharge can be restrained within allowable range, the luminance slope decreases within the allowable range, and problem in use is not caused.

There are various phenomena besides the luminance slope in the phenomenon which occurs as the overcharging effect. Among them, especially, as phenomenon which has high visibility and is generated remarkably, the flicker which is caused by in-plane distribution of optimum counter electrode potential Vcom,opt is enumerated. By referring to the drawings as follows, mechanism of generation of the flicker which is caused by the in-plane distribution of the optimum counter electrode potential Vcom,opt which occurs by the overcharging effect is explained.

In the liquid crystal display device, the liquid crystal capacitance Clc which comprises a part of the load capacitance Cload of the TFT 15*a* is composed by the pixel electrode 19*a*, the counter electrode 21*a* and the liquid crystal layer 17*a* which is sandwiched by their electrodes, and light intensity which transmits the liquid crystal layer 17*a* is controlled by controlling orientation of liquid crystal molecules in the liquid crystal layer by electric field between both electrodes. Because the orientation of the liquid crystal molecules is controlled by the electric field which occurs between the counter electrode 21*a* and the pixel electrode 19*a*, it is available to control the electric field by not only controlling the potential of both electrodes of the counter electrode 21*a* and the pixel electrode 19*a* in each pixel independently, but controlling the potential of either one in each pixel independently and controlling the other one to be same as other pixels by feeding from outside.

In this case, because pixel structure simplifies, it becomes advantageous regarding the aperture rate or yield. Therefore, in the general liquid crystal display devices, the potential is fed from the outside according to integrated structure of the counter electrode with the other pixel. Specifically, typically, the counter electrode structure is designed to be huge planate electrode which is arranged at entire counter substrate in the liquid crystal display device of TN mode or VA mode, and is designed to be the integrated structure with each pixel which is arrayed to the scanning signal line direction in IPS mode. Besides, in a part of the IPS mode devices, the structure which controls the pixel electrode and the counter electrode for each pixel independently on the same substrate is proposed. Although this structure is advantageous for improvement of in-plane uniformity of the liquid crystal layer applied voltage, because the pixel structure becomes complex, it is easy to cause the decrease of the aperture rate or the yield.

As described above, in the case that the counter electrode potential Vcom is same for multiple TFTs which are connected to the same scanning signal line, if the pixel electrode potential Vp becomes ununiform within the display screen, the applied voltage of the liquid crystal layer 17a also becomes ununiform. From this result, the luminance distribution also becomes ununiform depending on the distribution of the ununiform liquid crystal layer applied voltage, and the display quality decreases. Therefore, it is important to improve the in-plane uniformity of the pixel electrode potential Vp.

Because the liquid crystal molecule is electrolyzed by DC voltage, it is necessary to be driven by AC voltage, and the drive that the polarity of the voltage which is applied to the liquid crystal layer is always inverted is performed. Therefore, for example, in the case that the whole screen displays the same gray scale, if the positive polarity pixel electrode potential is indicated as Vp+ and the negative polarity pixel electrode potential is indicated as Vp− in the OFF-state of the TFT 15a, when the potential of the counter electrode 21a is set to the mean value of the positive polarity pixel electrode potential Vp+ and the negative polarity pixel electrode potential Vp−, both polarity voltages applied to the liquid crystal layer become equivalent.

The counter electrode potential Vcom at this time is called optimum counter electrode potential Vcom,opt, and it is indicated in the next formula.

$$Vcom,opt=\{(Vp+)+(Vp-)\}/2$$

When the counter electrode potential Vcom shifts from the optimum counter electrode potential Vcom,opt, because the positive polarity liquid crystal layer applied voltage and the negative polarity liquid crystal layer applied voltage are different, the orientation of the liquid crystal molecule in each polarity is also different. That is, because the orientation of the liquid crystal molecule fluctuates temporally, transmitted light intensity through the liquid crystal layer does not become constant and fluctuates temporally, and the fluctuation of this transmitted light intensity is recognized visually as the flicker. Or else, when the state that the both applied voltages are different is continued, the difference between the both applied voltages affects as the application of the DC voltage effectively, and the phenomenon that impurity ions in the liquid crystal layer are trapped on such as surface of the pixel electrode is induced. If the trapped impurity ions become more, the liquid crystal molecule responds for the electric field which is formed by the trapped impurity ions, and it is recognized visually as screen burn-in.

FIG. 4 (A) indicates schematically relation of flicker ratio for the shift of the counter electrode potential Vcom from each optimum counter electrode potential Vcom,opt(n), Vcom,opt(f) in the different n point and f point which are lined to the scanning signal line direction. Here, the flicker ratio is rate of the light intensity of 30 Hz which occupies in the entire transmitted light intensity in measurement point. The light of 30 Hz is frequency that human being is easy to sense as the flicker most. FIG. 4 (B) is view which shows schematically the condition that the pixel electrode potential Vp and the counter electrode potential Vcom change by the overcharging effect in position of the pixel from the feeding electrode side of the scanning signal line to the opposite side.

In FIG. 4 (A), a continuous line corresponding to the n point indicates near area to the feeding electrode of the scanning signal line and a dashed line corresponding to the f point indicates distant area from the feeding electrode. The flicker ratio in each point has minimum value for the counter electrode potential Vcom, and the flicker ratio increases even if the counter electrode potential Vcom increases or decreases from there. The counter electrode potential Vcom when the flicker ratio becomes minimum is the optimum counter electrode potential Vcom,opt in the aforementioned point, and the positive polarity liquid crystal layer applied voltage and the negative polarity liquid crystal layer applied voltage which are the differences of the counter electrode potential Vcom and the pixel electrode potential Vp become equivalent in the points that the optimum counter electrode potential Vcom,opt is applied respectively.

As described above, because the effective punch-through voltage decreases together in the positive polarity liquid crystal layer applied voltage and the negative polarity liquid crystal layer applied voltage by the overcharging effect, as shown in FIG. 4 (B), the positive polarity and negative polarity pixel electrode potential Vp increases together as the distance from the feeding electrode of the scanning signal line, and the optimum counter electrode potential Vcom,opt also increases as the distance from the feeding electrode of the scanning signal line. Therefore, when the value of the counter electrode potential Vcom becomes constant, as shown in FIG. 4 (A), because the counter electrode potential Vcom shifts from the optimum counter electrode potential Vcom,opt in other point even if the counter electrode potential Vcom in a certain point becomes the optimum counter electrode potential Vcom,opt, the flicker ratio increases.

Therefore, as shown in FIG. 4 (B), in order to decrease the flicker of the whole screen, the counter electrode potential Vcom is set in c point which exists in middle position of the optimum counter electrode potential Vcom,opt(n), Vcom,opt(f) in both points of the n point and the f point. However, in this case, because the counter electrode potential Vcom is not the optimum counter electrode potential Vcom,opt for both points of the n point and the f point, the flicker cannot be disappeared completely. Therefore, it is necessary to restrain the flicker level which is caused without disappearing within the allowable limit.

Because the flicker is caused by the difference of the orientation of the liquid crystal in the positive polarity and the negative polarity, the flicker ratio for the shift from the optimum counter electrode potential Vcom,opt depends on parameters concerning the physical property of the liquid crystal such as viscosity or dielectric anisotropy or concerning the response speed such as the thickness of the liquid crystal layer which affects the field intensity of the liquid crystal layer. However, practically, in the liquid crystal display device of each panel manufacturer, because the aimed characteristics of liquid crystal display such as getting higher speed response or lower driving voltage are same, as a result, the difference of these parameters is small for the difference of the liquid crystal material as long as the basic specifications such as the display mode or the drive method are same.

That is, the rate of the change of the flicker ratio for the shift from the optimum counter electrode potential Vcom,opt becomes almost constant without depending on a kind of the liquid crystal as long as the display mode or the drive method is same. Therefore, the above-mentioned visibility of the flicker which does not disappear and under-mentioned optimum counter electrode potential difference δVcom,opt which is in-plane differential of the optimum counter electrode potential Vcom,opt have strong correlation. As shown in FIG. 4 (B), the shift from the optimum counter electrode potential Vcom,opt of the counter electrode potential Vcom becomes largest at the n point and the f point, and becomes small depending on approach to center in the position of the pixel. Therefore, the optimum counter electrode potential difference δVcom,opt which corresponds to the difference of the counter electrode potential Vcom in farthest pixel and nearest pixel to the feeding electrode of the scanning signal line can be determined as an index of the overcharging effect.

Accordingly, the optimum counter electrode potential difference δVcom,opt is defined by the next formula.

$$\delta Vcom,opt = Vcom,opt(\text{far}) - Vcom,opt(\text{near})$$

Here, Vcom,opt(near) shows the optimum counter electrode potential in the nearest pixel to the feeding electrode of the scanning signal line and the Vcom,opt(far) shows the optimum counter electrode potential in the farthest pixel.

As described above, the overcharging effect causes the decrease of the display quality which is caused by in-plane ununiformity of the liquid crystal layer applied voltage. Therefore, it is necessary to restrain the overcharging effect, and various methods are proposed. As one example among them, as shown in FIG. 3, the method which delays the time of the change of the display signal line potential Vsig than the time which switches from the gate potential Vgh of the ON-state TFT to the gate potential Vgl of the OFF-state TFT in the scanning signal line potential Vg is known, and this method is put to practical use in many liquid crystal display devices. For example, in the Patent document No. 3, an embodiment about a setting method concerning the time of the change of the scanning signal line potential and the time of the change of the display signal line potential is disclosed.

That is, when the potential of the display signal line 13a changes toward the charge to the load capacitance which is connected to the next step scanning signal line 11b before the TFT 15a which is connected to the aforementioned scanning signal line 11a transits the OFF-state, the drain electrode potential Vd of the TFT in the overcharging period changes from the potential for the aforementioned pixel to the potential for the next step pixel. Accordingly, the pixel electrode potential of the aforementioned pixel shifts greatly from the predefined value. To prevent this, it is necessary to change the potential of the display signal line after the TFT which is connected to the aforementioned scanning signal line transits the OFF-state completely. As this waiting time, it is generally performed to set the time constant level of the scanning signal line.

This method restrains the overcharging effect by setting the TFT operating point in the overcharging period. Because the overcharge depends on the degree of ease of the flow of the overcharging electric current, that is, depends on the field-effect mobility of the semiconductor layer, it is thought that the effect of decreasing of the overcharge is sufficient even if only the above described method is applied for the case of TFT with amorphous silicon which has the small field-effect mobility, and it is feared that the sufficient effect of decreasing of the overcharge cannot be obtained by only applying above described method when the field-effect mobility increases. However, there is the fact that the report of the detailed research and development about the relation between the overcharging effect and the field-effect mobility was not achieved ever.

Accordingly, the simulation that the optimum counter electrode potential difference δVcom,opt is assumed to be the index of the overcharging effect was performed by using the simulator that an inventor of the present invention used and improved for many years when developing the liquid crystal display devices. In the obtained result, the relation between the overcharging effect and the field-effect mobility is shown in FIG. 5. In FIG. 5, the field-effect mobility was obtained in the range of 0-50 cm2/Vs about the liquid crystal display device of 26 inches Full-HD, frame frequency 120 Hz and TN-mode that the amorphous silicon was used as the semiconductor layer of TFT.

Generally, the optimum counter electrode potential difference δVcom,opt greatly exceeds 0.2V for the increase of the field-effect mobility in FIG. 5 whereas the allowable limit of the optimum counter electrode potential difference δVcom,opt is 0.2V level. That is, it is suggested that the introduction of the counterplan in the design or the manufacturing process in order to decrease the optimum counter electrode potential difference δVcom,opt for the increase of the field-effect mobility is indispensable.

Meanwhile, because the liquid crystal display device controls oriented state of the liquid crystal molecular which has the dielectric anisotropy by the electric field, the liquid crystal capacitance Clc is different for the applied voltage to the liquid crystal layer 17a, and the punch-through voltage ΔVp is also different by the liquid crystal layer applied voltage. Besides, similarly, the visibility such as the flicker or the screen burn-in is also different by the liquid crystal layer applied voltage. Because luminance change for the change of the liquid crystal layer applied voltage becomes largest in the neighborhood of 50% liquid crystal layer applied voltage V50 which becomes the luminance of 50% of maximum luminance, the visibility of the various phenomena of the overcharging effect which is caused by the in-plane ununiformity of the liquid crystal layer applied voltage which occurs by the overcharge also increases in the liquid crystal layer applied voltage of this neighborhood.

Therefore, the analysis of the overcharging effect is performed with 50% liquid crystal layer applied voltage V50, and the punch-through voltage ΔVp in the 50% liquid crystal layer applied voltage V50 is particularly indicated as 50% punch-through voltage ΔVp,v50. In addition, in the present invention, it is not necessary to limit the analysis of the overcharging effect to the liquid crystal layer applied voltage which becomes 50% luminance of the maximum luminance, and the liquid crystal layer applied voltage of other ratios can be also selected according to the influence of the visibility of the overcharging effect.

Because display state that the visibility of the flicker is high is case of halftone display that the whole screen is same, only the 50% punch-through voltage ΔVp,v50 can be considered as the punch-through voltage ΔVp. However, as described above, because the screen burn-in is caused by the difference of the positive polarity liquid crystal layer applied voltage and the negative polarity liquid crystal layer applied voltage, and because this difference of the voltage is generated by the in-plane ununiformity of the effective punch-through voltage, even if the overcharging effect is weak and negligible, in the display state that the different gray scale regions are mixed, the DC voltage component is generated in the effective applied voltage of the liquid crystal layer by the cause that the punch-through voltage ΔVp is different depending on the gray scale.

Therefore, as the condition to restrain the difference by the gray scale, that is, as the condition to restrain the difference of the DC voltage component for the difference of the liquid crystal layer applied voltage, the method to set maximum punch-through voltage ΔVp,max in the case that the load capacitance Cload of the formula (1) is minimum, and maximum punch-through voltage difference d(ΔVp)max=ΔVp,max−ΔVp,min which is the difference of maximum punch-through voltage ΔVp,max and minimum punch-through voltage ΔVp,min in the case that the load capacitance Cload of the formula (1) is maximum to standard value or less is used in the past.

Besides, the liquid crystal capacitance Clc is also different depending on the applied voltage, and when maximum value and minimum value of the liquid crystal capacitance Clc are respectively indicated as Clc,max and Clc,min and when the liquid crystal capacitance Clc for the 50% liquid crystal layer applied voltage V50 is indicated as 50% liquid crystal capacitance Clc,v50, also the load capacitance Cload can be indicated as maximum load capacitance Cload,max, minimum load capacitance Cload,min and 50% load capacitance Cload, v50 respectively.

Here, in the analysis of the optimum counter electrode potential difference δVcom,opt, calculation time of the positive polarity pixel electrode potential Vp+ and the negative polarity pixel electrode potential Vp– are assumed to be the time which elapses three times of the selection period from the expiration time of the selection period. This is the time soon after the TFT completely transited to the OFF-state in also the case of punch-through compensation drive as described below, and the influence of leakage current in the OFF-state of the TFT can be neglected by calculating the pixel electrode potential at this time. As the result, the analysis of the overcharging effect can be performed clearly.

The conventional method of pixel design for the amorphous silicon (a-Si) is explained by referring to the drawing as follows. The outline of device model in this conventional example is as follows. Pixel resolution is assumed to be Full-HD (number of scanning signal line 1080), pixel size is assumed to be 100 μm×300 μm, scanning signal line selection period is assumed to be 7.55 μs, relative permittivity and film thickness of gate insulating film are respectively assumed to be 7.4 and 3000☐, liquid crystal operating mode is assumed to be TN, maximum liquid crystal capacitance Clc,max is assumed to be 0.365 pF, minimum liquid crystal capacitance Clc,min is assumed to be 0.177 pF, and the 50% liquid crystal capacitance Clc,v50 is assumed to be 0.271 pF.

Besides, shape of the TFT is assumed to be U-shape which is generally used for the amorphous silicon which is indicated in FIG. 6, and channel length L is assumed to be 4 μm by supposing minimum processing dimension. Above setting items of the device model are common for all conventional methods which are described in this specification and embodiments of the present invention which is described as follows. Other individual setting items and parameters are indicated each time.

The pixel design of the liquid crystal display device comprises two elements which decides the TFT size for the load capacitance Cload of the TFT and restrains coupling phenomena through the parasitic capacitance which is formed between the pixel electrode and wirings of the scanning signal line and the display signal line which are arranged around the pixel electrode. As third element, there is a setting of the load capacitance Cload based on charge holding capability setting condition of the load capacitance Cload for leakage current of the TFT or impurity ion in the liquid crystal layer. However, because this is independent with the overcharge of the present invention, the explanation is not performed here.

It is possible to decrease sufficiently the coupling of the display signal line and the pixel electrode 19a by shielding effect which is generated by arranging auxiliary capacitance electrode between both. In this case, the size of the auxiliary capacitance which is necessary to decrease the coupling between the display signal line and the pixel electrode is often approximately 0.1 pF level or more.

On the other hand, the variation of the pixel electrode potential Vp by the coupling between the pixel electrode 19a and the scanning signal line, particularly, the coupling between the pixel electrode 19a and the aforementioned scanning signal line 11a depends on mainly the parasitic capacitance Cgs which is formed at the crossover area of the source electrode and the gate electrode of the TFT 15a that the pixel electrode 19a is connected, and it becomes above described punch-through voltage ΔVp. That is, because agent of the coupling capacitance is the parasitic capacitance Cgs of the TFT, the decrease of the coupling that utilizes the shielding effect cannot be performed, and as the result, the coupling related to Cgs is dominant in all couplings.

The method to decrease the punch-through voltage ΔVp is either method which decreases the parasitic capacitance Cgs or increases the load capacitance Cload or decreases the shift amount ΔVg of the scanning signal line potential by the formula (1). Channel width W and the channel length L of the TFT 15a and the gate electrode potential Vgh of the ON-state are decided for ensuring electric current amount to charge the load capacitance Cload, and W/L and the gate electrode potential Vgh of the ON-state TFT are contradictory relation each other.

However, because the gate electrode potential Vgh of the ON-state TFT is strongly influenced from such as dispersion of output of driver IC of the scanning signal line, it is not preferable to ensure the required electric current amount by fine tuning the gate electrode potential Vgh of the ON-state TFT. Moreover, it is necessary to set the gate electrode potential Vgh of the ON-state TFT to the value that some margin is added for the required value of the gate electrode potential Vgh of the ON-state TFT. Therefore, generally, after the required electric current amount is roughly determined by the gate electrode potential Vgh of the ON-state TFT, it is fine-tuned by the channel width W. It is preferable to set the channel length L as small as possible for increasing W/L, and generally, because the channel length L is set to the minimum processing dimension in the processing, it becomes fixed value on the design. The gate electrode potential Vgl of the OFF-state TFT is process parameter which is determined by decreasing the influences of threshold voltage Vth of the TFT 15a or the leakage current of the TFT 15a, and it is assumed to be the fixed value on the design.

Besides, because the liquid crystal capacitance Clc which composes the load capacitance Cload is almost determined by the pixel size, dominant parameter of the load capacitance Cload becomes the auxiliary capacitance Cs. Therefore, significant parameter which determines the value of the punch-through voltage ΔVp becomes the parasitic capacitance Cgs which is function of the channel width W and the load capacitance Cload which is function of the auxiliary capacitance Cs. Therefore, the channel width W and the load capacitance Cload are determined self consistently with satisfying constraint condition concerning the punch-through voltage ΔVp.

[Non-Compensation Drive]

As the conventional method of the pixel design, the case that the amorphous silicon is used to island-shaped semiconductor of the TFT 15a is explained by referring to the drawing as follows. In individual parameters of this case, the scanning signal line time constant τg is 2.5 μs, the threshold voltage Vth is 1.5V, the gate electrode potential of the ON-state TFT Vgh is 20V, the gate electrode potential of the OFF-state TFT Vgl is −6V and the field-effect mobility μeff is 0.5 cm2/Vs.

FIG. 6 is the shape of the TFT which is widely used as the TFT of the amorphous silicon, and there is feature that rate of variability of the parasitic capacitance Cgs by alignment shift is small. In this case, the channel width W can be defined as edge length of the source electrode 51 on the island-shaped semiconductor 57. Besides, because the shape of the channel is U-shape, the minimum value Wmin-u exists in the channel width W. This is because the rate of variability of the parasitic capacitance Cgs by the alignment shift increases drastically in the case that linear portion of the U-shape becomes short and becomes only circular arc portion. When the U-shaped electrode is indicated as the drain electrode 53 and the inside linear electrode is indicated as the source electrode 51, the minimum value Wmin-u of the channel width W is 14.3 μm in the case that the channel length L=4 μm and the source electrode width=4 μm.

In FIG. 6, the distance of edge of the gate electrode 55 and edge of the island-shaped semiconductor 57 is set to correspond when approaching each other by the alignment shift of 3σ equivalency, and because the semiconductor layer is aligned for gate electrode layer, the island-shaped semiconductor 57 and the gate electrode 55 have the relation of direct alignment. Therefore, the distance of the edge of the gate electrode 55 and the end of the island-shaped semiconductor 57 is indicated as direct alignment accuracy δd of 3σ equivalency. Similarly, the distance between the edge of the island-shaped semiconductor 57 and tip of the drain electrode 53 is set to correspond when approaching each other by the alignment shift of 3σ equivalency, and because both of the semiconductor layer and source/drain electrode layer are aligned for the gate electrode layer, the island-shaped semiconductor 57 and the drain electrode 53 have the relation of indirect alignment each other. Therefore, the distance of the edge of the island-shaped semiconductor 57 and the edge of the drain electrode 53 is indicated as indirect alignment accuracy δi of 3σ equivalency.

Concerning the present specification, in the explanation of the conventional example and the embodiment of the present invention, the direct alignment accuracy δd and the indirect alignment accuracy δi of 3σ equivalency are respectively set at 3 μm and 4 μm as common item. As described below, these values are the values of processing accuracy in initial stage of the liquid crystal business. However, even today when the alignment accuracy was improved, because big margin for the alignment shift should be ensured in the distance between the edge of the gate electrode and the edge of the semiconductor layer and the distance between the edge of the semiconductor layer and the tip of the drain electrode, each distance is often set at 3 μm and 4 μm in the same way as the initial stage of the liquid crystal business. In that case, the margin for the alignment shift of 4σ equivalency or 5σ equivalency is possessed.

In FIG. 6, the area of the parasitic capacitance Cgs which is formed in the area which is surrounded by dashed line 59 can be defined as the sum of the area which is near to the source electrode 51 from the center of channel area which is placed between the source electrode 51 on the island-shaped semiconductor 57 and the drain electrode 53 and the crossover area of the source electrode 51 and the gate electrode 55. Besides, in variation of the parasitic capacitance Cgs by the alignment shift, it is assumed that the area on the island-shaped semiconductor 57 does not vary, and it can be assumed that only the crossover area of the source electrode 51 and the gate electrode 55 varies.

Thereby, the parasitic capacitance Cgs is determined by the channel width W, the channel length L, the shape of the TFT, the alignment accuracy and capacitance per unit area. Because width Ws of the source electrode 51 can be assumed as the minimum processing dimension on the process, the design parameter of the parasitic capacitance Cgs is only the channel width W, and the other becomes the fixed value on the design because of processing parameter.

From above mentioned explanation, in the design of the liquid crystal display device, common aggregate area of existence area of the maximum load capacitance Cload,max which is chargeable for the channel width W and existence area of the maximum load capacitance Cload,max which is necessary to minimum for decreasing the punch-through voltage ΔVp for the channel width W to standard value or less becomes candidate area of the pixel. The aperture ratio becomes the maximum when the auxiliary capacitance Cs becomes the minimum in this candidate area, and optimum pixel is obtained.

Particularly, in the case of the conventional amorphous silicon, decreasing both value of the maximum punch-through voltage ΔVp,max as the punch-through voltage ΔVp in the case that the load capacitance Cload is minimum and the maximum punch-through voltage difference d(ΔVp)max which is the difference of the maximum punch-through voltage ΔVp,max and the minimum punch-through voltage ΔVp, min in the case that the load capacitance Cload is maximum to standard value or less has been used as constraint condition conventionally. This state is shown in FIG. 7. Here, as the constraint condition for the punch-through voltage ΔVp, the maximum punch-through voltage ΔVp,max and the maximum punch-through voltage difference d(ΔVp)max which are conventionally used are adopted, and each upper limit is indicated as 1.7V and 0.35V respectively.

In FIG. 7, the graph of W-Cload indicates the chargeable maximum capacitance, that is, W-Cload characteristic for the channel width W, and the maximum load capacitance Cload, max for the channel width W is set in the downside than the graph of this W-Cload. The graph of W-ΔVp,max indicates the maximum load capacitance Cload,max of the case that the maximum punch-through voltage ΔVp,max becomes upper limit value for the channel width W, and it is necessary to set the maximum load capacitance Cload,max in the upper side than this graph by the formula (1) for putting the maximum punch-through voltage ΔVp,max to the upper limit value or less. The graph of W-d(ΔVp)max indicates the maximum load capacitance Cload,max of the case that the maximum punch-through voltage difference d(ΔVp)max becomes upper limit value for the channel width W, and it is necessary to set the maximum load capacitance Cload,max in the upper side than this graph for putting the maximum punch-through voltage difference d(ΔVp)max to the upper limit value or less.

That is, for decreasing each to the standard value or less, the maximum load capacitance Cload,max is set in the downside than the graph of W-Cload, and is set in the upper side than either the graph of W-d(ΔVp)max and the graph of W-ΔVp,max. In the case of FIG. 7, because the graph of W-d(ΔVp)max is positioned in the upper side than the graph of W-ΔVp,max, the area in the downside than the graph of W-Cload and the area in the upper side than the graph of W-d(ΔVp)max become the candidate area of the pixel. In the case that other condition does not exist, the point that the aperture ratio becomes maximum in this candidate area of the pixel, that is, the point that the auxiliary capacitance which comprises the opaque electrode is minimum becomes the optimum pixel. Therefore, because both graph of W-Cload and graph of W-d(ΔVp)max increase monotonously for W, an intersection point X of both graphs becomes the optimum pixel.

FIG. 8 is the result which simulated design 50% punch-through voltage ΔVp,v50typ which is designed value that the 50% punch-through voltage ΔVp,v50 is completed as the designed value and the optimum counter electrode potential difference δVcom,opt of the case that the 50% punch-through voltage ΔVp,v50 varies ±0.5V for the design 50% punch-through voltage $\Delta Vp,v50typ$ when the parasitic capacitance Cgs changes by such as the alignment shift about the state of the intersection point X of the graph of W-Cload and the graph of W-d($\Delta Vp$)max in FIG. 7.

In FIG. 7, the state of the intersection point X of the graph of W-d($\Delta Vp$)max and the graph of W-Cload is W=37.3 μm, Cload,max=0.802 pF, and it becomes $\Delta Vp,v50$=1.29V if converted. When the upper limit value of the optimum counter electrode potential difference δVcom,opt is indicated as ξ+=0.2V and the lower limit value is indicated as ξ−=−0.2V, the 50% punch-through voltage $\Delta Vp,v50$ that the optimum counter electrode potential difference δVcom,opt becomes ξ+ and ξ− in FIG. 8 are respectively 1.13V and 1.71V. Thereby, allowable variation amount of the 50% punch-through voltage $\Delta Vp,v50$ from the designed value becomes respectively δ($\Delta Vp,v50$)+=1.71−1.29=0.42V and δ($\Delta Vp,v50$)−=1.29−1.13=0.16V when $\Delta Vp,v50$ increases and decreases.

If direction of the variation of the 50% punch-through voltage $\Delta Vp,v50$ has no bias, because small one among δ($\Delta Vp,v50$)+ and δ($\Delta Vp,v50$)− becomes rate-determining condition of the design, in this case, the pixel is determined for δ($\Delta Vp,v50$)−=0.16V. When all variation of the punch-through voltage $\Delta Vp$ depends on the variation of the parasitic capacitance Cgs, the allowable limit δCgs of that variation corresponds to 4.49 fF by the formula (1). When this variation of the parasitic capacitance Cgs depends on only the alignment shift, the allowable limit of that alignment shift amount corresponds to 5.14 μm when calculating by using the capacitance per unit area.

Here, variation area of the parasitic capacitance Cgs corresponds to the variation of the resultant length of the direct alignment shift amount δd and the indirect alignment shift amount δi with the width Ws of the source electrode 51, and this resultant alignment shift amount δdi is indicated as SQRT(δd^2+δi^2) when occurrence frequency of these alignment shifts is normal distribution. Here, SQRT( ) indicates square root within brackets, and A^2 indicates second power of A. The alignment accuracy of the initial stage of the liquid crystal business were δd=3 μm and δi=4 μm at 3σ, and δdi of this case was 5 μm. Because the recent alignment accuracy improves, when being indicated as δd=2 μm and δi=3 μm with 3σ, the shift that δdi becomes 5.14 μm corresponds to 4.36.

That is, it corresponds to 3σ or more that the alignment shift amount of the photo resist of the parasitic capacitance Cgs exceeds 5.14 μm even if it is the processing accuracy of the initial stage of the liquid crystal business, and because it corresponds to 4.3σ in current processing precision, the influence to the yield is small and it can be ignored. Therefore, when the field-effect mobility of a-Si is 0.5 cm2/Vs, even if the design is performed without considering the optimum counter electrode potential difference δVcom,opt, the optimum counter electrode potential difference δVcom,opt is automatically contained within the allowable limit when being manufactured with the alignment shift amount which is provided by the current processing accuracy.

On the other hand, the case which uses the conventional design method about transparent amorphous oxide semiconductor (TAOS) that the field-effect mobility is 10 cm2/Vs is explained by referring to the drawing as follows. Here, in the individual parameter, the scanning signal line time constant τg is 2.5 μs, the threshold voltage Vth is 0V, the gate electrode potential of the ON-state TFT Vgh is 15V, the gate electrode potential of the OFF-state TFT Vgl is −2V and the field-effect mobility μeff is 10 cm2/Vs.

FIG. 9 indicates the result which simulated the relation (W-Cload characteristic) between the channel width W and the chargeable maximum capacitance, the relation (W-$\Delta Vp$,max characteristic) between the channel width W and the maximum punch-through voltage $\Delta Vp$,max and the relation (W-d($\Delta Vp$)max characteristic) between the channel width W and the maximum punch-through voltage difference d($\Delta Vp$)max. In FIG. 9, when the same constraint condition concerning the maximum punch-through voltage $\Delta Vp$,max and the maximum punch-through voltage difference d($\Delta Vp$)max as the case of the amorphous silicon is given, even if the channel width W is set as the minimum value Wmin-u of the U-shaped TFT, the charging is possible from the graph of W-Cload for the maximum load capacitance Cload,max of the case which satisfies $\Delta Vp$,max≤1.7V and d($\Delta Vp$)max≤0.35V. When other constraint condition is not given, the candidate of the optimum pixel exists on the graph of W-d($\Delta Vp$)max which is in the upper side than the graph of W-$\Delta Vp$,max and onto the point of the minimum value Wmin-u of the channel width W. The pixel in this state is W=14.3 μm and Cload,max=0.477 pF, and it becomes $\Delta Vp,v50$=0.67V if converted.

FIG. 10 is the result which simulated the design 50% punch-through voltage $\Delta Vp,v50typ$ which is the designed value that the 50% punch-through voltage $\Delta Vp,v50$ is completed as the designed value and the optimum counter electrode potential difference δVcom,opt of the case that the 50% punch-through voltage $\Delta Vp,v50$ varies ±0.5V for the design 50% punch-through voltage $\Delta Vp,v50typ$ when the parasitic capacitance Cgs changes by such as the alignment shift about the optimum candidate pixel which was obtained from FIG. 9.

In FIG. 10, when assuming ξ+=0.2V and ξ−=−0.2V, the 50% punch-through voltage $\Delta Vp,v50$ becomes allowable variation limit in the case that the 50% punch-through voltage $\Delta Vp,v50$ decreases, and it is δ($\Delta Vp,v50$)−=0.0236V. Limit value of the allowable variation amount of the parasitic capacitance Cgs for this corresponds to 0.531 fF. The allowable value of the shift amount when all variation of this parasitic capacitance Cgs depends on the alignment shift of the photo resist corresponds to 0.608 μm.

Even if the direct alignment shift amount δd and the indirect alignment shift amount δi which are 3σ equivalency in current alignment accuracy are 2 μm and 3 μm respectively, the allowable limit of this shift amount corresponds only to 0.506σ, and it is practically impossible to control the alignment accuracy in 0.506σ or less in mass production line. Therefore, in TAOS whose field-effect mobility is 10 cm2/Vs, it is necessary to introduce new constraint condition besides the condition for restraining the maximum punch-through voltage $\Delta Vp$,max and the maximum punch-through voltage difference d($\Delta Vp$)max to the standard value or less to design the liquid crystal display device that the optimum counter electrode potential difference δVcom,opt is restrained to allowable limit value or less.

In addition, in above explanation, although the allowable limit value of the optimum counter electrode potential difference δVcom,opt is assumed as ξ+=0.2V and ξ−=−0.2V, this value is one example of the value which is used practically. In fact, the allowable limit value of the optimum counter electrode potential difference δVcom,opt is the value which is determined by product specification, and is different in each product. However, when the field-effect mobility increases, even if the allowable limit value of the optimum counter electrode potential difference δVcom,opt increases than the exemplified value, it is unchanged that it is difficult to design the liquid crystal display device that the optimum counter electrode potential difference δVcom,opt is contained within the allowable value in the range of the shift amount which is possible to manufacture with the current processing accuracy.

[Compensation Drive]

As previously described, the overcharging electric current flows because the punch-through voltage $\Delta Vp$ operates as the voltage Vds between the source and the drain of TFT. Therefore, the overcharging effect depends on the punch-through voltage $\Delta Vp$ strongly. For this reason, it is effective to attempt the decrease of the punch-through voltage $\Delta Vp$ for decreasing the overcharging effect. As one of the means, punch-through compensation drive is enumerated. The original punch-through compensation drive decreases the auxiliary capacitance Cs by decreasing the punch-through voltage $\Delta Vp$ by the drive and increases the aperture rate.

In the punch-through compensation drive, although various methods are proposed and used practically, basically, it compensates the decrease of the pixel electrode potential Vp by the punch-thorough by utilizing the coupling through the auxiliary capacitance Cs, and it is all the same in the point of decreasing the effective punch-through voltage $\Delta Vp$ sufficiently. That is, when the variation amount of the pixel electrode potential Vp by the change of the scanning signal line potential Vg through the parasitic capacitance Cgs and the variation amount of the pixel electrode potential Vp by the change of the potential of the auxiliary capacitance electrode through the auxiliary capacitance Cs are equivalent, the variation of the pixel electrode potential Vp is offset, and this is principle of the punch-through compensation drive.

Accordingly, the next formula is established as punch-thorough compensation condition.

$$(Cgs/Cload)\Delta Vg = (Cs/Cload)\Delta Vcs \qquad (2)$$

Here, $\Delta Vcs$ is the variation amount of the potential of the auxiliary capacitance electrode. Even when the auxiliary capacitance Cs is Cs on Gate structure which is formed at the crossover area of extending portion of the pixel electrode and the scanning signal line of the pixel of the previous stage, this relational formula is established. In this case, the scanning signal line potential Vg decreases to third potential Vgc which is lower than Vgl before decreasing from the gate electrode potential Vgh of the ON-state TFT to the gate electrode potential Vgl of the OFF-state TFT. That is, when the potential of the aforementioned scanning signal line changes over from the gate electrode potential Vgh of the ON-state TFT to the gate electrode potential Vgl of the OFF-state TFT, the potential of the scanning signal line of the previous stage changes over from Vgc to Vgl. At this time, it becomes $\Delta Vcs = Vgl - Vgc$.

As the conventional example for the punch-through compensation drive, the case that Cs on Gate is used to the amorphous silicon is explained by referring to the drawing as follows. In the individual parameters of this case, the scanning signal line time constant $\tau g$ is 2.5 μs, the threshold voltage Vth is 1.5V, the gate electrode potential of the ON-state TFT Vgh is 20V, the gate electrode potential of the OFF-state TFT Vgl is −6V and the field-effect mobility μeff is 0.5 cm2/Vs. The channel width W is assumed as 37.3 μm which is the same as the case that punch-through non-compensation drive is applied to the amorphous silicon.

Because the punch-through compensation drive has small influence for the charge to the load capacitance Cload in the period that the TFT is ON-state, there is no problem even if it is ignored. Therefore, in this case, W-Cload characteristic, W-$\Delta Vp$,max characteristic and W-d($\Delta Vp$)max characteristic are same as FIG. 7.

FIG. 11 is the result which simulated the relation between the 50% punch-through voltage $\Delta Vp$,v50 in the conventional method and the optimum counter electrode potential difference $\delta Vcom$,opt in the case that the punch-through compensation drive by Cs on Gate was performed for the amorphous silicon. L is the graph which indicates the relation of design optimum counter electrode potential difference $\delta Vcom$,typ which is the optimum counter electrode potential difference $\delta Vcom$,opt for the design 50% punch-through voltage $\Delta Vp$, v50typ which is the designed value of the 50% punch-through voltage $\Delta Vp$,v50, and M(0V)-M(2V) are the graphs which indicate the relations of the variation of the optimum counter electrode potential difference $\delta Vcom$,opt for the variation of the 50% punch-through voltage $\Delta Vp$,v50 in each design 50% punch-through voltage $\Delta Vp$,v50typ of 0V-2V.

The design optimum counter electrode potential difference $\delta Vcom$,typ which is indicated in the graph L increases gently for the increase of the design 50% punch-through voltage $\Delta Vp$,v50typ, and intersects the horizontal axis at about 2V. At this time, each allowable variation amount $\delta(\Delta Vp,v50)+$ and $\delta(\Delta Vp,v50)-$ in the case that the 50% punch-through voltage $\Delta Vp$,v50 increases and decreases are equivalent, and the allowable variation amount becomes maximum. Concretely, it becomes $\delta(\Delta Vp,v50)+=\delta(\Delta Vp,v50)-=0.150V$ with $\Delta Vp$, v50typ=2.12V, and in this state, the allowable Cgs variation amount $\delta Cgs$ which was the case that the variation of $\Delta Vp$, v50 entirely depended on the variation of Cgs becomes 2.49 fF. The allowable alignment shift amount which was the case that this variation of Cgs entirely depended on the alignment shift corresponds to $2.37\sigma$ when the direct alignment accuracy $\delta d$ and the indirect alignment accuracy $\delta i$ of $3\sigma$ equivalency are respectively 2 μm and 3 μm. The maximum load capacitance Cload,max of this case is 0.526 pF, and the auxiliary capacitance Cs can be decreased 0.276 pF compared with the case of the punch-through non-compensation drive, and the aperture ratio increases by only amount of this.

Although it is not described in detail here, in the case of the punch-through compensation drive in the practical design, the design of the punch-through voltage is performed without the constraint condition, and when obtaining the design 50% punch-through voltage $\Delta Vp$,v50typ based on the formula (1), it often becomes about 2V-2.5V. Although it is not impossible to control the alignment accuracy with $2.37\sigma$ or less in the manufacturing process, the difficulty is accompanied. Therefore, practically, it is corresponded by improving the alignment accuracy by the remodeling of the manufacturing facilities. That is, even if such labor is spent, it is necessary to increase the aperture ratio by the decrease of the auxiliary capacitance which is caused by the alleviation of the constraint condition of the punch-through voltage by the punch-through compensation drive. Once in the manufacturing process where such correspondence was performed, in the case of the punch-through compensation drive in the conventional amorphous silicon, even if the constraint condition concerning the punch-through voltage is not considered, as the result, the optimum counter electrode potential difference $\delta Vcom$, opt is contained within the allowable range.

Besides, the reason that the overcharge which is influenced by the punch-through is generated though the punch-through compensation drive is performed is practically caused by the flow of the overcharging electric current by the potential difference which occurs by the cause that the time change rate of the potential between the scanning signal line potential and the pixel electrode potential by the compensation drive does not correspond whereas the punch-through compensation condition of the formula (2) makes the potential the same when the punch-through process terminated.

That is, the setting method of the time constant of the scanning signal line and the auxiliary capacitance line is entirely different, and particularly concerning the set of the capacitance, generally, the capacitance per unit area is different because the composition of both insulating films is different, and whereas only value of the time constant is important in the case of the scanning signal line, because the function such as the decrease of the coupling as well as the time constant is possessed in the auxiliary capacitance line, the value of the capacitance is determined based on the rigorous calculation. From these reasons, generally, because the time constants of the scanning signal line and the auxiliary capacitance line are greatly different, particularly in the early stage of the overcharging period soon after the selection period of the scanning signal line terminates, the pixel electrode potential variation amount by the variation of the potential of the scanning signal line and the pixel electrode potential variation amount by the variation of the potential of the auxiliary capacitance line are not offset. Because, the variation amount of the pixel electrode potential which occurred by this becomes the voltage Vds between the source and the drain, and the overcharging electric current flows.

Alternatively, in the case of the Cs on Gate structure, the process of the variation of the potential that the pixel electrode receives from the aforementioned scanning signal line is divided into two stages, and soon after the selection period terminates, the first stage is the variation that the potential of the scanning signal line changes over from the gate electrode potential Vgh of the ON-state TFT to the third potential Vgc which is lower than the gate electrode potential Vgl of the OFF-state TFT, and the second stage is the variation that the potential of the scanning signal line changes over from the third potential Vgc to the gate electrode potential Vgl of the OFF-state TFT. On the other hand, the process of the variation of the potential which receives from the scanning signal line of the previous stage is only one time of the variation which changes over from the third potential Vgc to the gate electrode potential Vgl of the OFF-state TFT. Therefore, the period that the pixel electrode potential variation amount which receives from the aforementioned scanning signal line and the pixel electrode potential variation amount which receives from the scanning signal line of the previous stage are not offset each other exists, the overcharging electric current flows in this period.

If summarizing the above, in the design of the liquid crystal display device for using the conventional amorphous silicon that the field-effect mobility is 0.5 cm2/Vs level, because the influence of the overcharging effect is small, even if the constraint condition concerning the optimum counter electrode potential difference δVcom,opt which is the index of the flicker which is caused by the overcharging effect is not given, the optimum counter electrode potential difference δVcom, opt was naturally contained within the allowable range. However, if the field-effect mobility becomes large, also the overcharging effect increases. Therefore, in the case of TAOS that the field-effect mobility is 10 cm2/Vs, when designing, it is necessary to introduce the new constraint condition to decrease the optimum counter electrode potential difference δVcom,opt within the allowable range.

The present invention is conducted in view of the above described points, and the object of the present invention is to provide the active matrix display device whose display quality is high. Further, the object of the present invention is to improve the display quality of the active matrix display device which has the transistor that the range of the field-effect mobility is from 1 cm2/Vs to 70 cm2/Vs. Further, the object of the present invention is to provide the method which manufactures such active matrix display device.

Means for Solving the Problems

The present invention adopts the counter electrode potential difference δVcom which is the in-plane differential of the counter electrode potential Vcom in the scanning signal line direction as the index of the decrease of the uniformity of the flicker or the screen luminance which is caused by the overcharging effect which increases depending on the increase of the field-effect mobility, provides the new constraint condition on the design that the flicker or the decrease of the uniformity of the screen luminance are contained within the allowable range, and substantiates the high quality active matrix display device.

The present invention provides the method to restrain the decrease of the display quality which is caused by the overcharging effect that the influence becomes remarkable if the field-effect mobility exceeds 1 cm2/Vs. The items which are influenced as the display quality by the overcharging effect are concerning the in-plane distribution of the optimum counter electrode potential Vcom,opt such as the luminance slope or the screen burn-in. Particularly, by paying attention to the flicker having high visibility, and by assuming the optimum counter electrode potential difference δVcom,opt which is the in-plane differential of the optimum counter electrode potential Vcom,opt in the scanning signal line direction as the index, the new design condition to restrain the flicker or the decrease of the uniformity of the screen luminance is provided. Further, in the present invention, even if the field-effect mobility of the semiconductor layer is 1 cm2/Vs or more, by determining the gate electrode potential Vgh of the ON-state TFT, the gate electrode potential Vgl of the OFF-state TFT, the load capacitance Cload, and the value of control parameter of the process such as the capacitance Cgs between the gate and the source, the formula which enables the optimum counter electrode potential difference δVcom, opt to be contained within the allowable variation range is provided.

Concretely, the optimum counter electrode potential difference δVcom,opt is indicated as linear function of n % punch-through voltage ΔVp,vn in the halftone which becomes the luminance of n % for the maximum luminance, and the variation of the optimum counter electrode potential difference δVcom,opt for the variation of the n % punch-through voltage ΔVp,vn by the variation of such as the parasitic capacitance Cgs under the influence of the manufacturing process is formulated as the function of the n % punch-through voltage ΔVp,vn. Further, the condition that the designed value of the n % punch-through voltage ΔVp,vn should satisfy not to exceed the allowable limit value ξ of the optimum counter electrode potential difference δVcom,opt for the process level is derived based on the formula previously formulated.

FIG. 24 is a drawing which indicates the result that the design optimum counter electrode potential difference δVcom,typ is obtained in the range of 0-100 cm2/Vs in the field-effect mobility μeff by comparing the formulated formula and the simulation when the scanning signal line time constant τg is 2.5 μs, the threshold voltage Vth is 0V, the gate electrode potential of the ON-state TFT Vgh is 15V, the gate electrode potential of the OFF-state TFT Vgl is −6V and the design 50% punch-through voltage ΔVp,v50typ is 1.5V. In the result of the simulation, although the design optimum counter electrode potential difference δVcom,typ increases monotonously for the increase of the field-effect mobility μeff, the design optimum counter electrode potential difference δVcom,typ decreases in the region of the field-effect mobility μeff>50 cm2/Vs concerning the calculated value by the formulated formula. The overcharge is the phenomenon which is caused by the overcharging electric current, and the overcharging electric current also becomes large depending on increasing of the field-effect mobility which is the easiness of the flow of the current. Therefore, it is suggested that the decrease of the value which is calculated by the formulated formula exceeds the applicable limit.

Besides, in the region that the field-effect mobility μeff is approximately 2 cm2/Vs or less and the slope of the graph is greatly large, the result of the simulation does not curve gently and distortion is generated, and it becomes critical region concerning the simulation. It is thought that this cause is caused by the decrease of convergence property in numerical analysis because the design optimum counter electrode potential difference δVcom,typ changes sensitively for the change of the field-effect mobility μeff in this region. On the other hand, although the calculated value by the formulated formula curves gently, this is because the fitting is performed for the result of the simulation by using interpolation formula when the formulated formula is derived, and is because the distortion of the shape of the graph which is caused by the convergence property of the simulation is averaged. Therefore, it is thought that the calculated value by the formulated formula has high credibility than the result of the simulation in the region that the field-effect mobility μeff is approximately 2 cm2/Vs or less.

FIG. 25 is a drawing which indicates the value Δ which subtracted the simulation value from the calculated value by the formulated formula. If the allowable limit of the difference of both that the calculated value by the formulated formula and the simulation value are almost correspondent is assumed as 20 mV, it becomes the allowable limit or less in the region that the field-effect mobility μeff is approximately 1.5-70 cm2/Vs from FIG. 25. Here, the error 20 mV is the value which may be used as the allowable limit when the difference of the luminance of the upper end and the lower end of the screen by the time constant of the display signal line is converted to the difference of the liquid crystal applied voltage. FIG. 25 does not compare the difference of the applied voltage of the adjacent pixels, and is the comparison of the simulation value and the calculated value by the formulated formula. Therefore, 20 mV was used as the limit value without the significant difference.

Besides, when considering the decrease of the convergence property in the simulation for the region that the field-effect mobility μeff is approximately 2 cm2/Vs or less, practically, the lower limit of the region which is assumed as the almost correspondence is lower than 1.5 cm2/Vs, and it is thought that it is assumed as the almost correspondence till the neighborhood of at least 1 cm2/Vs.

From above, the range that the formulated formula can be applied is the range of approximately 1 cm2/Vs-70 cm2/Vs in the field-effect mobility, and is the range of 1.5 cm2/Vs-50 cm2/Vs preferably. Besides, the range of n is approximately 15-70, that is, it can be applied in the halftone display that the luminance becomes 70% from 15%. Further, when n is 50, because the rate of the transmittance change for the voltage change generally becomes the maximum, it is preferable that the optimum counter electrode potential difference δVcom, opt is indicated as the linear function of the 50% punch-through voltage ΔVp,v50.

Besides, in the flicker modes, there is a mode that the luminance change is generated as if the luminance of the wide range in the display screen blinks on and off, and in addition, there is a mode that the slight vibration of the luminance of the micro region that the radius is a few mm level may be distributed at random over the wide range in the display screen. Because each size of the micro flicker region is too small and the luminance is not stable in terms of time, it is difficult to measure the difference of the luminance of the adjacent micro flicker regions actually. However, it corresponds to 1-3 gray scale level or more among 256 gray scale levels in subjective evaluation. In this case, it is not often recognized as so-called flicker, because the micro region with non-stable luminance in terms of time is distributed in the wide range of the display screen, the outline of the display pattern becomes dim, and the display quality becomes hazy as a whole. The flicker of this mode may be called as the flicker of the local mode.

This cause is presumed according to the in-plane ununiformity of the optimum counter electrode potential Vcom,opt which is caused by the slight film thickness distribution of the gate insulating film. That is, the film thickness accuracy of the insulating thin film such as the gate insulating film is generally controlled as ±10% or less for the setting value. However, because the actual measuring object of the film thickness is the film thickness measurement pattern which is arranged in circumference of the pixel area, the film thickness distribution of the pixel area is not actually measured. Therefore, practically, it is thought that the region where the film thickness of a few % level which is smaller than the management value is different is distributed at random in the whole screen. This slight difference of the film thickness generates the slight distribution of the punch-through voltage, as that result, it is thought that the flicker of the local mode is the phenomenon that the difference of the degree of the overcharging effect is recognized visually.

When considering the adjacent two local mode flicker regions, because each distance is near and the regions are very narrow, it is possible that the variation item which is caused by the processing accuracy such as the alignment shift amount, the wiring width or the thickness of the liquid crystal layer in each region is assumed to be all same except for the film thickness of the gate insulating film. That is, it is thought that the difference between both regions is only the parasitic capacitance Cgs between the gate and the source of the TFT which is caused by the difference of the film thickness of the gate insulating film.

In this case, the difference of the optimum counter electrode potential Vcom,opt for the difference of the punch-through voltage between both regions almost corresponds to the slope η of the straight line M which is indicated by the formula (4) of the present invention. η is the rate of the variation of the optimum counter electrode potential difference δVcom,opt for the variation of the 50% punch-through voltage ΔVp,v50 which is caused by such as the variation of the parasitic capacitance Cgs between the gate and the source, and this is because the influence of the variation of the overcharging electric current by the variation of the channel width W in the variation of the parasitic capacitance between the gate and the source by the alignment shift is sufficiently small as compared with the influence by the variation of the parasitic capacitance Cgs between the gate and the source. Therefore, if the absolute value of η is smaller, the difference of the flicker level of the adjacent local mode is decreased, and the improvement of the display quality can be attempted. Besides, because the phenomenon is very narrow range, only the parasitic capacitance Cgs between the gate and the source is considered to be different between both regions. Therefore, the flicker of the local mode can be evaluated by η even for the case which controls the counter electrode potential independently in each pixel.

FIG. 12 is a conceptual diagram which indicates the straight line L which indicates the relation between the design 50% punch-through voltage ΔVp,v50typ which is the designed value of the 50% punch-through voltage ΔVp,v50 and the design optimum counter electrode potential difference δVcom,typ, the straight line M which indicates the relation of the variation of the optimum counter electrode potential difference δVcom,opt when the 50% punch-through voltage ΔVp,v50 varies from the design 50% punch-through voltage ΔVp,v50typ, and the relation between the upper limit value ξ+ and the lower limit value ξ− of the allowable range of the optimum counter electrode potential difference δVcom,opt.

The inventor of the present invention found the fact that the straight line L is indicated by the next formula (3).

$$L: \delta Vcom,typ = (\alpha \cdot \Delta Vp, v50typ + \beta)\gamma \qquad (3)$$

Here, the slope of the straight line L is positive, that is, the attention for α·γ>0 is required. This is caused by the fact that the overcharge is performed because the punch-through voltage ΔVp operates as the voltage Vds between the source and the drain, and because the overcharging electric current flows. Besides, α, β, γ are coefficients which are obtained by the calculation formula described below.

The inventor of the present invention found the fact that the straight line M is indicated by the next formula (4).

$$M: \delta Vcom,opt = \eta(\Delta Vp,v50 - \Delta Vp,v50typ) + \delta Vcom,typ \qquad (4)$$

Here, concerning the slope η of the straight line M, the attention for η<0 is required. This is caused by the decrease of the optimum counter electrode potential Vcom,opt because the decrease amount of the pixel electrode potential Vp increases when the 50% punch-through voltage ΔVp,v50 increases by the variation.

Next, the allowable upper limit value and lower limit value of the optimum counter electrode potential difference δVcom,opt are respectively indicated as ξ+ and ξ−, and the 50% punch-through voltages ΔVp,v50 for ξ+ and ξ− are respectively indicated as ΔVp,v50− and ΔVp,v50+. So that the upper limit value of the optimum counter electrode potential difference δVcom,opt becomes ξ+ or less, the optimum counter electrode potential difference δVcom,opt in ΔVp,v50− may be ξ+ or less. Therefore, by η((ΔVp,v50−)−ΔVp,v50typ)+(α·ΔVp,v50typ+β)γ≤ξ+, ΔVp,v50typ−(ΔVp,v50−)≤{(α·ΔVp,v50typ+β)γ−(ξ+)}/η is obtained.

Similarly, so that the lower limit value of the optimum counter electrode potential difference δVcom,opt becomes ξ− or more, the optimum counter electrode potential difference δVcom,opt in ΔVp,v50+ may be ξ− or more.

Therefore, by η((ΔVp,v50+)−ΔVp,v50typ)+(α·ΔVp,v50typ+β)γ≥ξ−, (ΔVp,v50+)−ΔVp,v50typ≤{(ξ−)−(α·ΔVp,v50typ+β)γ}/η is obtained.

From this, when the allowable variation amount δ(ΔVp,v50)+ in the direction that ΔVp,v50 increases from ΔVp,v50typ and the allowable variation amount δ(3Vp,v50)− in the direction that ΔVp,v50 decreases from ΔVp,v50typ are respectively indicated as δ(ΔVp,v50)+=(ΔVp,v50+)−ΔVp,v50typ>0

δ(ΔVp,v50)−=ΔVp,v50typ−(ΔVp,v50−)>0, next formula (5) and formula (6) are obtained.

$$\delta(\delta Vp,v50)+ \leq \{(\xi-)-(\alpha \cdot \Delta Vp,v50typ+\beta)\gamma\}/\eta \qquad (5)$$

$$\delta(\delta Vp,v50)- \leq \{(\alpha \cdot \Delta Vp,v50typ+\beta)\gamma-(\xi+)\}/\eta \qquad (6)$$

Therefore, when designing to satisfy formula (5) and formula (6), the flicker by the overcharging effect can be restrained within the allowable limit.

Here, the reason which pays attention to the liquid crystal layer applied voltage that the luminance becomes 50% of the maximum luminance is because the voltage is the region that the rate of the transmittance change for the voltage change becomes maximum in the relation of transmittance—liquid crystal layer applied voltage. That is, because the transmittance sensitively changes for the change of the liquid crystal layer applied voltage in the region, such as the flicker or the screen burn-in which is caused by the in-plane ununiformity of the liquid crystal layer applied voltage by the overcharge is easily recognized visually. However, depending on the increase of the screen luminance of the recent liquid crystal display device, because it is sufficiently bright even if the luminance is 50% of the maximum luminance, the visibility decreases for the human eyes, and the visibility may be raised in the dark screen than the luminance of 50% of the maximum luminance. Accordingly, when the screen luminance is n % of the maximum luminance, the example which obtained the range of n that the formula (3) and the formula (4) of the present invention are established is explained by referring to the drawings as follows.

FIG. 22 is a graph which is indicated by comparing the result of the simulation and δVcom,opt-Vn characteristic which was obtained by the formula (3) concerning δVcom,opt for the liquid crystal layer applied voltage Vn that the screen luminance becomes n % of the maximum luminance. In the individual parameter, the scanning signal line time constant τg is 2.5 μs, the threshold voltage Vth is 0V, the gate electrode potential of the ON-state TFT Vgh is 15V, the gate electrode potential of the OFF-state TFT Vgl is −2V and the field-effect mobility μeff is 10 cm2/Vs. Further, the display mode is assumed as normally white that the transmittance became 100%, that is, become the maximum luminance in the state that the voltage is not applied to the liquid crystal layer. The relative permittivity ∈100 of the liquid crystal when the luminance becomes 100% is assumed as 3.00 as the minimum value in relative permittivity of liquid crystal-applied voltage characteristic, the liquid crystal layer applied voltage V100 for ∈100 is assumed as the threshold voltage of the liquid crystal, the maximum value V0 of the liquid crystal layer applied voltage is assumed as 6.5V, the luminance at V0 is assumed as 0%, and the relative permittivity ∈0 of the liquid crystal at V0 is assumed as 6.18.

Because there is strong correlation between transmittance-liquid crystal layer applied voltage characteristic and relative permittivity of liquid crystal-liquid crystal layer applied voltage characteristic each other, the relative permittivity ∈n of the liquid crystal when the luminance becomes n % of the maximum luminance is obtained based on ∈0 and ∈100 by linear interpolation, and the liquid crystal layer applied voltage Vn for ∈n is obtained by the relative permittivity of liquid crystal-liquid crystal layer applied voltage characteristic. Besides, in the formula (3), δVcom,opt is calculated by replacing ΔVp,v50typ with the designed value ΔVp,vntyp of the punch-through voltage in the liquid crystal layer applied voltage Vn that the luminance becomes n % of the maximum luminance, and the similar calculation is performed in the simulation.

In FIG. 22, the value which is obtained by the formula (3) and the value of the result of the simulation are not correspondent in the 50% liquid crystal layer applied voltage V50, and the difference of approximately 6 mV exists. Although this indicates the precision that the formula of the present invention possesses, it is the shift of approximately 3% for 200 mV which is the general allowable limit value of δVcom,opt, and it can be assumed as the almost correspondence as the level which does not cause the problem practically. If the error till 10 mV is allowed as the difference of the δVcom,opt which is obtained by each of the formula (3) and the simulation, it can be assumed as the almost correspondence in the range of approximately 15% liquid crystal layer applied voltage V15-70% liquid crystal layer applied voltage V70, that is, in the range of the luminance 15%-70%, and the formula (3) of the present invention is established in this range. Besides, in the region which exceeds this range, because the value of the formula (3) is not distant from the value of the simulation, it is understood to be able to use the formula (3) in the whole range of 0% liquid crystal layer applied voltage V0-100% liquid crystal layer applied voltage V100 in the case of the rough investigation which does not require the precision.

FIG. 23 is a graph which is indicated by comparing the result of the simulation which is performed by the same condition as FIG. 22 and η-Vn characteristic which is obtained by the formula (4) of the present invention. In the formula (4), η was calculated by replacing the 50% punch-through voltage ΔVp,v50 and the design 50% punch-through voltage ΔVp,v50typ with the n % punch-through voltage ΔVp,vn and the design n % punch-through voltage ΔVp,vntyp respectively, and the similar calculation was also performed in the simulation. In FIG. 23, the result of the simulation and the formula (4) of the present invention are correspondent within the range of the error ±1% in the region that the liquid crystal layer applied voltage is 10% liquid crystal layer applied voltage V10-100% liquid crystal layer applied voltage V100, that is, in the range that the luminance is 10%-100%, the formula (4) is established in this range. Based on the above, the concrete contents of the invention are indicated as follows.

In the active matrix liquid crystal display devices of the present invention, the field-effect mobility is 1 cm2/Vs or more and 70 cm2/Vs or less. The allowable upper limit value and lower limit value of the optimum counter electrode potential difference δVcom,opt are respectively indicated as ξ+ and ξ−, and the n % punch-through voltages ΔVp,vn for ξ+ and ξ− are respectively indicated as ΔVp,vn− and ΔVp,vn+, and the design n % punch-through voltage is indicated as ΔVp,vntyp, and the allowable variation limit amounts when the n % punch-through voltages ΔVp,vn increases and decreases from the design n % punch-through voltage ΔVp,vntyp are respectively indicated as δ(ΔVp,vn)+=(ΔVp,vn+)−ΔVp,vntyp and δ(ΔVp,vn)−=ΔVp,vntyp−(ΔVp,vn−), and the design optimum counter electrode potential difference δVcom,typ which is the designed value of the optimum counter electrode potential difference δVcom,opt is indicated as the formula (3), $$\delta Vcom,typ = (\alpha \cdot \Delta Vp, vntyp + \beta)\gamma \quad (3)$$

and the rate of the variation amount of the optimum counter electrode potential difference δVcom,opt for the variation amount of the n % punch-through voltages ΔVp,vn is indicated as η, and α, β, γ are indicated as the coefficients which are obtained by the calculation formula described below. At that time, there is a feature which is set such that δ(ΔVp,vn)+ and δ(ΔVp,vn)− respectively satisfy the formula (5) and the formula (6).

$$\delta(\Delta Vp,vn)+ \le \{(\xi-)-(\alpha \cdot \Delta Vp,vntyp+\beta)\gamma\}/\eta \quad (5)$$

$$\delta(\Delta Vp,vn)- \le \{(\alpha \cdot \Delta Vp,vntyp+\beta)\gamma-(\xi+)\}/\eta \quad (6)$$

In addition, in the present invention, the range of n can be indicated as 15-70. Further, preferably, n can be indicated as 50. The n is indicated as 50, and the 50% punch-through voltages ΔVp,v50 for ξ+ and ξ− are respectively indicated as ΔVp,v50− and ΔVp,v50+, and the allowable variation limit amounts when the 50% punch-through voltages ΔVp,v50 increases and decreases from the design 50% punch-through voltage ΔVp,v50typ are respectively indicated as δ(ΔVp,v50)+=(ΔVp,v50+)−ΔVp,v50typ and δ(ΔVp,v50)−=ΔVp,v50typ−(ΔVp,v50−), and the design optimum counter electrode potential difference δVcom,typ which is the designed value of the optimum counter electrode potential difference δVcom,opt is indicated as the formula (3A), $$\delta Vcom,typ = (\alpha \cdot \Delta Vp, v50typ + \beta)\gamma \quad (3A)$$

and the rate of the variation amount of the optimum counter electrode potential difference δVcom,opt for the variation amount of the 50% punch-through voltages ΔVp,v50 is indicated as η, and α, β, γ are indicated as the coefficients which are obtained by the calculation formula described below. At that time, there is a feature which is set such that δ(ΔVp,v50)+ and δ(ΔVp,v50)− respectively satisfy the formula (5A) and the formula (6A).

$$\delta(\Delta Vp,v50)+ \le \{(\xi-)-(\alpha \cdot \Delta Vp,v50typ+\beta)\gamma\}/\eta \quad (5A)$$

$$\delta(\Delta Vp,v50)- \le \{(\alpha \cdot \Delta Vp,v50typ+\beta)\gamma-(\xi+)\}/\eta \quad (6A)$$

When the display device is applied the punch-through non-compensation drive, α, β, γ, η can be given by the next formulas.

$$\alpha = A \cdot \exp(-1/(B \cdot \mu eff)) + 0.2$$

$$A = \{0.58\exp(-1/Vgh) - 0.591\}Vth + \{7.924\exp(-1/Vgh) - 7.23\}$$

$$B = Ba\{\exp(Bb(Vgh-14))-1\} + Bc$$

$$Ba = 15\exp(-0.455Vth)$$

$$Bb = 0.00667Vth + 0.01$$

$$Bc = 1.2\exp(-0.35Vth) - 0.47$$

$$\beta = C \cdot \exp(-1/(D \cdot \mu eff)) - 0.19$$

$$C = -0.002Vth + 0.337\exp(-1/Vgh) - 0.148$$

$$D = \{0.06\exp(-Vgh+14) + 0.00042\}\exp(Vth) - 0.0051Vgh + 0.362$$

$$\gamma = \{E \cdot \exp(-F/\tau g) + G \cdot \tau g\}vc$$

$$E = \{-0.00032\mu eff + 0.01(\exp(-1.17/Vth)+1)\}Vgh + 0.008\mu eff + 0.722\exp(-0.101Vth)$$

$$F = \{2.71\exp(-0.0272\mu eff) + 0.597\exp(-1.37/Vth)\}/Vgh + (0.0667Vth + 0.3)\exp(-0.268\mu eff)$$

$$G = \{-0.0479\mu eff + 1.4\exp(-1.35/Vth) + 1.75\}/Vgh + 0.0012\mu eff + 0.0701\exp(-0.301Vth) - 0.1$$

$$vc = 0.620\exp(0.0353Vgh)(-Vgl)^{\wedge}(-0.0203Vgh+0.275)$$

$$\eta = \eta 0 \cdot \gamma 0$$

$$\eta 0 = P \cdot \exp(-1/\Delta Vp, vntyp) + Q$$

$$P = \{0.115\exp(-0.164Vgh) \cdot \exp(Vth) - 0.00610Vgh + 0.460\}\mu eff^{\wedge}(-0.559)$$

$$Q = \exp(-1/(\mu eff + Qa)) + Qb$$

$$Qa = 0.128Vgh - 0.005\exp(0.2Vth + 4.70) + 0.350$$

$$Qb = (0.0008Vth + 0.0183)Vgh - 0.0554Vth - 1.88$$

$$\gamma 0 = ve \cdot \kappa(\tau g)/\kappa(\tau g = 2.5)$$

$$\kappa(\tau g) = \exp(-R/\tau g) + S \cdot \tau g + T$$

$R = Ra1 \cdot \exp(Ra2 \cdot \mu\text{eff}) \cdot \exp(-1/(Vgh-10)) + 0.5\exp(-Rc2/\mu\text{eff}) + Rc3$ $Ra1 = 0.214\exp(-1.37/Vth) + 0.351$ $Ra2 = 0.153\exp(-1.37/Vth) - 0.216$ $Rc2 = 1.29\exp(0.388Vth)$ $Rc3 = 0.544\exp(0.0147Vth) - 1$ $S = \{0.000376 \log e(\mu\text{eff}) - 0.0000667Vth - 0.00123\}Vgh + Sb$ $Sb = (0.00237Vth + 0.0345)\exp(Sb2 \cdot \mu\text{eff})$ $Sb2 = 0.00258\exp(0.388Vth) - 0.05$ $T = Ta1 \cdot Vgh \cdot \mu\text{eff}^{Ta2} + Tb1 \cdot \log e(\mu\text{eff}) + Tb2$ $Ta1 = 0.007\exp(-1.60/Vth) + 0.0258$ $Ta2 = 0.0223\exp(0.265Vth) - 0.1$ $Tb1 = -0.0001Vth + 0.0597$ $Tb2 = 0.847\exp(-0.0966Vth) - 3.00$ $ve = (-0.0242Vgh + 1.17)(-Vgl)^{(0.0006Vgh^{\wedge}1.96)}$ Here, the units of Vth, Vgh, Vgl and ΔVp, vntyp are [V], the unit of μeff is [cm2/Vs] and the unit of τg is [μs]. Besides, κ(τg) indicates that κ is the function of τg, and [^] indicates the exponential symbol. Further, log e indicates the natural logarithm.

In the case of the punch-through compensation drive, α, β, η can be given by the next formulas.

$\alpha = A \cdot \mu\text{eff} + B$ $A = 0.00001[\{4\exp(-0.462Vth) - 15\}Vgh + 20.2\exp(0.0361Vth)]$ $B = 0.0001\{(4.33Vth + 25.2)Vgh - 203Vth + 852\}$ $\beta = C \cdot \log e(\mu\text{eff}) + D$ $C = 0.0001(16.2Vgh - 0.6Vth - 108)$ $D = -(0.0118Vth + 0.105)\log e(Vgh) + 0.0374Vth + 0.0625$ $\eta = \eta 0 \cdot \gamma 0$ $\eta 0 = P \cdot \exp(\Delta Vp, vntyp) + Q$ $P = -Pa1 \cdot Vgh^{(Pa2)} \cdot \mu\text{eff}^{(Pb1 \cdot Vgh + Pb2)}$ $Pa1 = 4\exp(1.12Vth) + 109$ $Pa2 = -5\exp(-1/(0.0916Vth)) - 2.57$ $Pb1 = 0.00007Vth + 0.0096$ $Pb2 = -0.0146Vth - 0.204$ $Q = -\{(0.0001Vth - 0.0123)Vgh + 0.0238Vth + 1.08\}\mu\text{eff}^{Qb}$ $Qb = (4.46Vth + 43.0)Vgh^{(-0.0289Vth - 2.16)} + 0.0118Vth - 0.185$ $\gamma 0 = ve \cdot \kappa(\tau g)/\kappa(\tau g = 2.5)$ $\kappa(\tau g) = \exp(-R/\tau g) + S\tau g + T$ The active matrix display device can be indicated as the liquid crystal display device or the organic EL display device. Besides, the absolute value of η can be indicated as 2 or less. The amorphous metal oxide or the organic matter can be adopted as the semiconductor layer. Although the organic EL display device has 2T1C type which comprises two TFTs and one capacitance in one pixel or has the circuit which comprises multiple TFTs and multiple capacitance, the pixel of the organic EL display device in the case which is equivalent to 2T1C type is equivalent to the pixel of the liquid crystal display device as the electric circuit, and can be composed such that the formula (5) and the formula (6) of the above constraint condition are satisfied. In the present invention, the above design technique can be applied to the manufacturing method of the display device.

Effect of the Invention

The active matrix display devices that the display quality is high could be provided by the present invention. Further, the display quality of the active matrix display device which has the transistor that the field-effect mobility is the range of 1 cm2/Vs-70 cm2/Vs could be improved by the present invention. Furthermore, the method which manufactures such the active matrix display devices could be provided by the present invention.

MODE FOR CARRYING OUT THE INVENTION

Non-Compensation Drive

Figure 9:
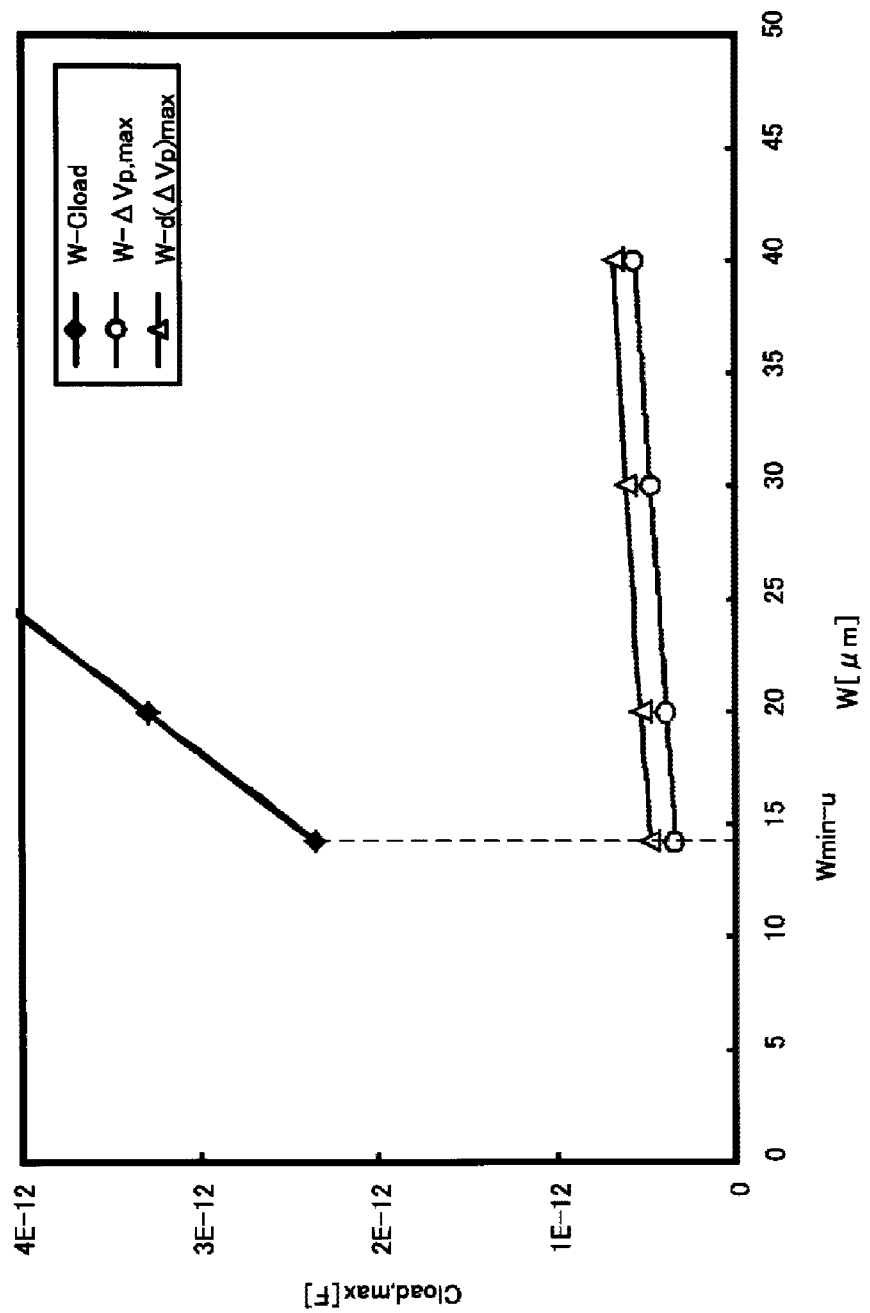
FIG. 9 In the conventional example for TAOS, a result of the simulation which indicates the relation of the chargeable load capacitance for the channel width W and the relation of the load capacitance which is necessary to decrease the punch-through voltage ΔVp for the channel width W to the standard value or less.
Figure 10:
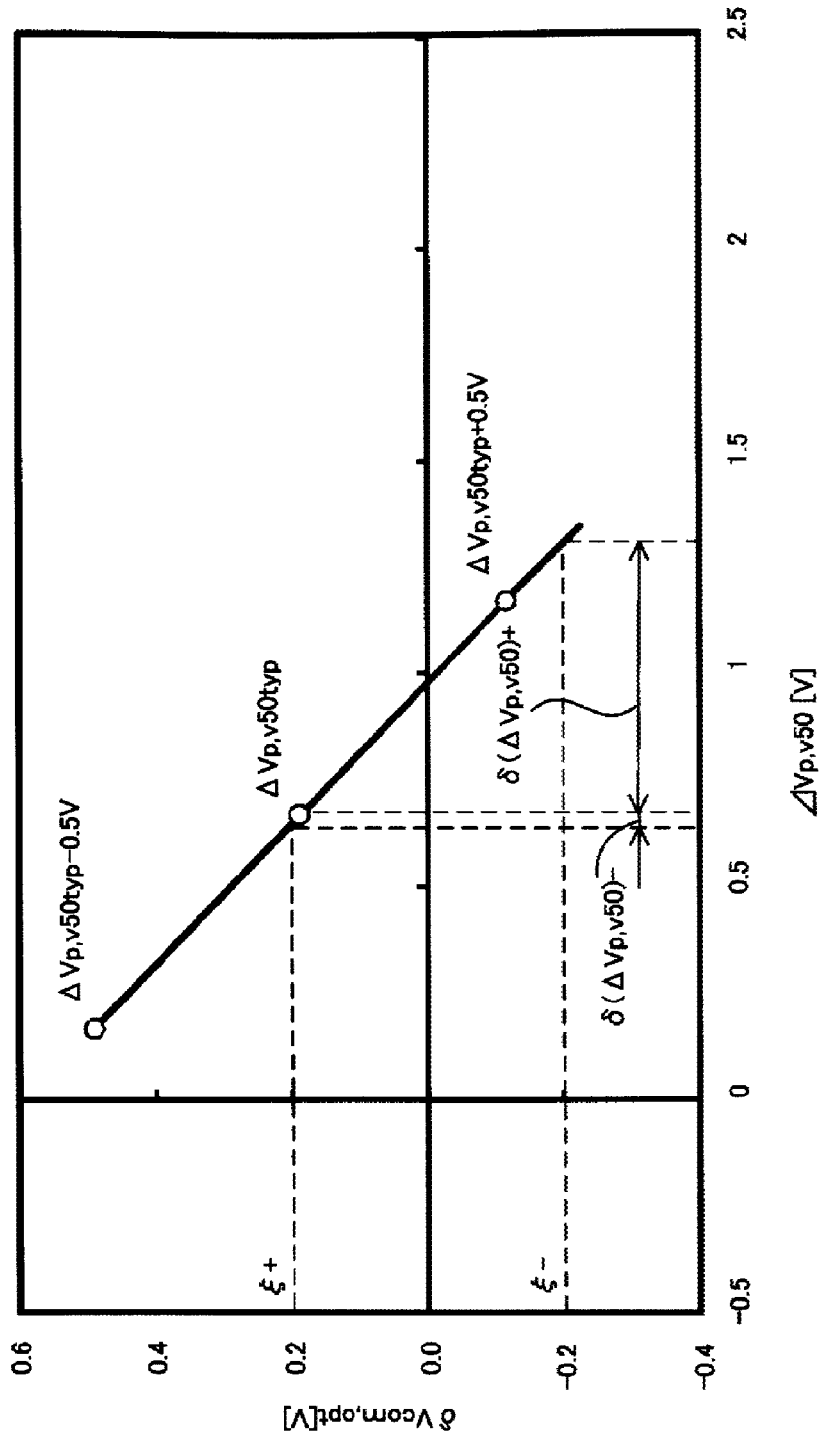
FIG. 10 In the conventional example for TAOS, a result of the simulation which indicates the variation of the optimum counter electrode potential difference δVcom,opt when the 50% punch-through voltage ΔVp,v50 varies from the design 50% punch-through voltage ΔVp,v50typ.

One embodiment when the design method based on the relational formula of the present invention is applied for the TFT which is composed by TAOS that the field-effect mobility is 10 cm2/Vs is explained by referring to the drawings as follows. In the individual parameters in this embodiments, the scanning signal line time constant τg is 2.5 µs, the threshold voltage Vth is 0V, the gate electrode potential of the ON-state TFT Vgh is 15V, the gate electrode potential of the OFF-state TFT Vgl is −2V and the field-effect mobility of the semiconductor layer µeff is 10 cm2/Vs. That is, concerning these parameters, as explained by referring to FIG. 9 and FIG. 10, it was difficult to restrain the optimum counter electrode potential difference δVcom,opt to the allowable limit value or less in the conventional design method. However, it is indicated as follows that the design of the liquid crystal display device becomes possible by applying the method of the present invention even if these parameters are adopted. Therefore, the graphs of the W-Cload characteristic, the W-ΔVp, max characteristic and the W-d(ΔVp)max characteristic become same as FIG. 9.

Figure 13:
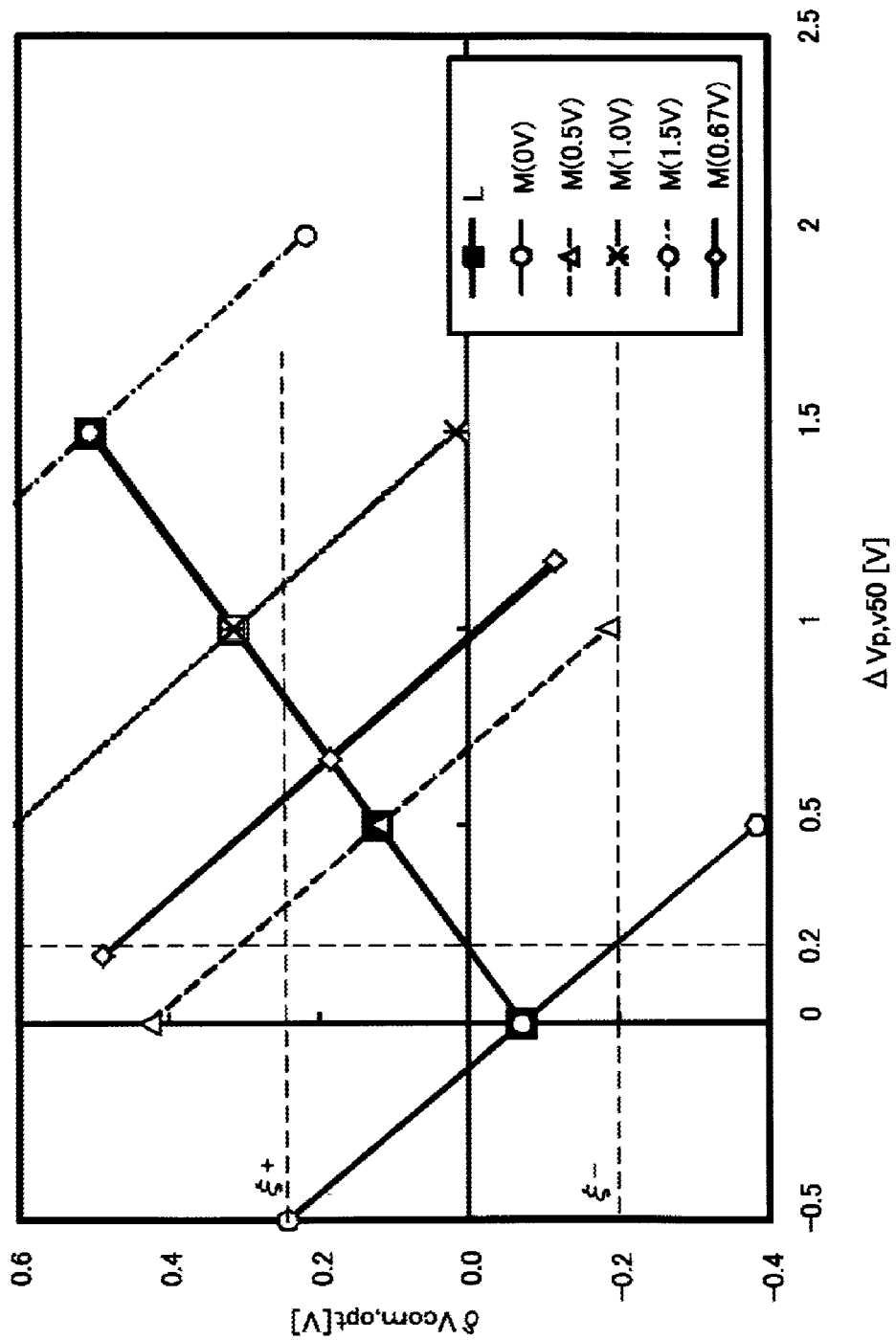
FIG. 13 In one embodiment when the constraint condition based on the relational formula of the present invention is applied for TAOS, a drawing which indicates the relation between the design 50% punch-through voltage ΔVp,v50typ and the design optimum counter electrode potential difference δVcom,typ and the relation of the variation of the optimum counter electrode potential difference δVcom,opt when the 50% punch-through voltage ΔVp,v50 varies from the design 50% punch-through voltage ΔVp,v50typ.

FIG. 13 is a graph which indicates the relation of the optimum counter electrode potential difference δVcom,opt for the 50% punch-through voltage ΔVp,v50 which is obtained by using the relational formula of the present invention. L is the graph which is obtained by the formula (3), and indicates the design optimum counter electrode potential difference δVcom,typ for the design 50% punch-through voltage ΔVp,v50typ in the parasitic capacitance Cgs when the TFT is completed as the design.

"M(0V)"-"M(1.5V)" is the graph which is obtained by the formula (4) respectively, and when assuming the case that the parasitic capacitance Cgs varies from the designed value by such as the alignment shift when the design 50% punch-through voltage ΔVp,v50typ is 0V-1.5V, thereby, the optimum counter electrode potential difference δVcom,opt is indicated when the 50% punch-through voltage ΔVp,v50 varies ±0.5V from the design 50% punch-through voltage ΔVp, v50typ. When assuming ξ+=0.2V and ξ−=−0.2V as the allowable limit of the optimum counter electrode potential difference δVcom,opt, in the region of ΔVp,v50>0.2V in FIG. 13, as it is clear by referring to FIG. 12, it is δ(ΔVp, v50)−<δ(ΔVp,v50)+, and the allowable variation amount of the 50% punch-through voltage ΔVp,v50 is smaller in the case which decreases than in the case which increases, and it becomes the rate-determining factor in the design. Besides, when decreasing the 50% punch-through voltage ΔVp,v50, because the auxiliary capacitance Cs increases and the aperture rate decreases, only the region of ΔVp,v50>0.2V is considered without considering the region of ΔVp,v50<0.2V.

Figure 12:
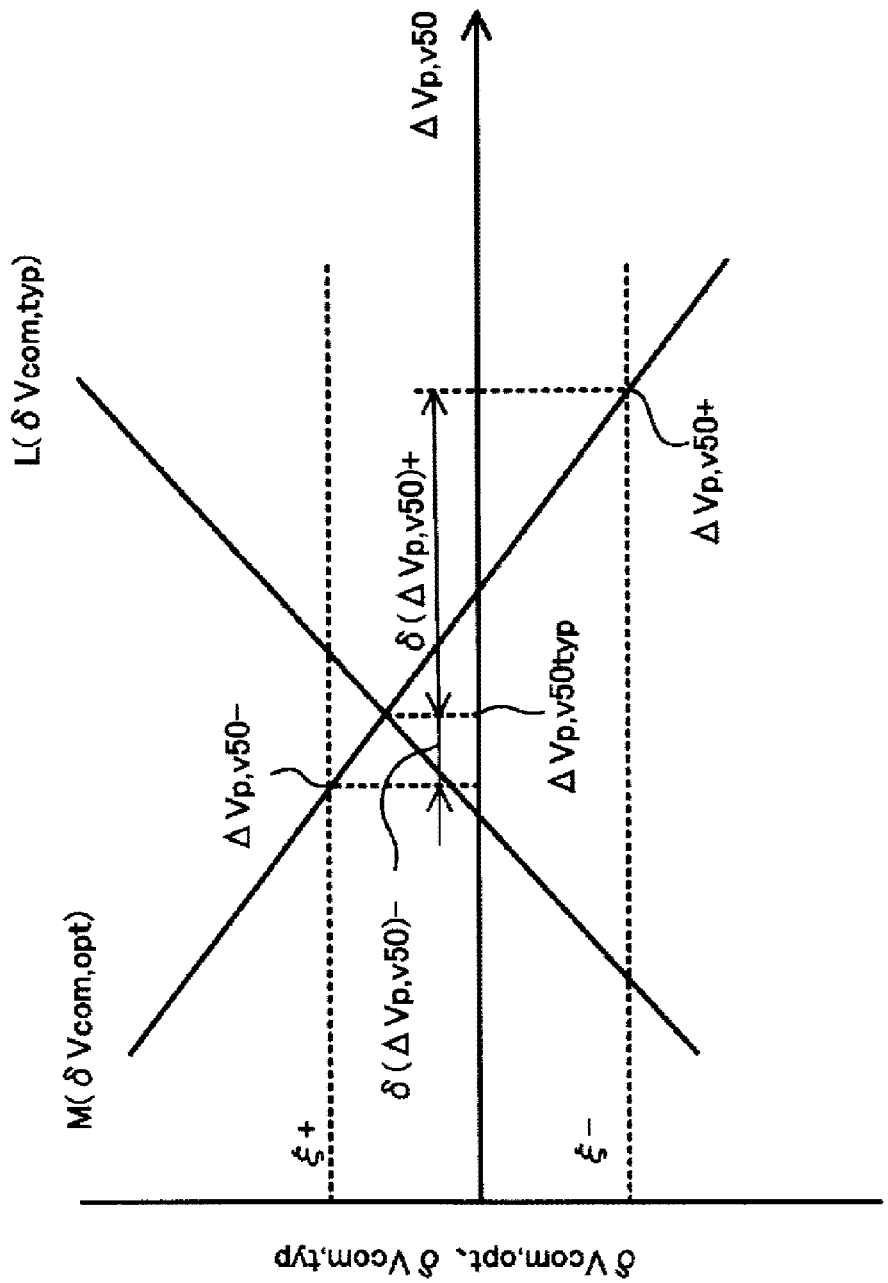
FIG. 12 A conceptual diagram, which is used to explain the relational formula of the present invention which restrains the overcharging effect, which indicates the relation between the design 50% punch-through voltage ΔVp,v50typ and the design optimum counter electrode potential difference δVcom,typ and the relation of the variation of the optimum counter electrode potential difference δVcom,opt when the 50% punch-through voltage ΔVp,v50 varies from the design 50% punch-through voltage ΔVp,v50typ and the allowable limit value of the optimum counter electrode potential difference δVcom,opt.

As it is clear by referring to FIG. 12 and FIG. 13, δ(ΔVp, v50)− is considered such that the optimum counter electrode potential difference δVcom,opt becomes smaller than ξ+ in the region of ΔVp,v50>0.2V. As explained by referring to FIG. 9 and FIG. 10, although the candidate pixel which was obtained by the conventional design method was W=Wmin-u as the channel width, Cload,max=0.477 pF as the maximum load capacitance and ΔVp,v50typ=0.67V as the design 50% punch-through voltage, because the management value of the alignment accuracy had to be set small in impracticable level, the candidate pixel was not optimum. In this embodiment, based on FIG. 13, the method which finds the optimum pixel that the management value of the alignment accuracy can be set in practicable range is explained.

Figure 14:
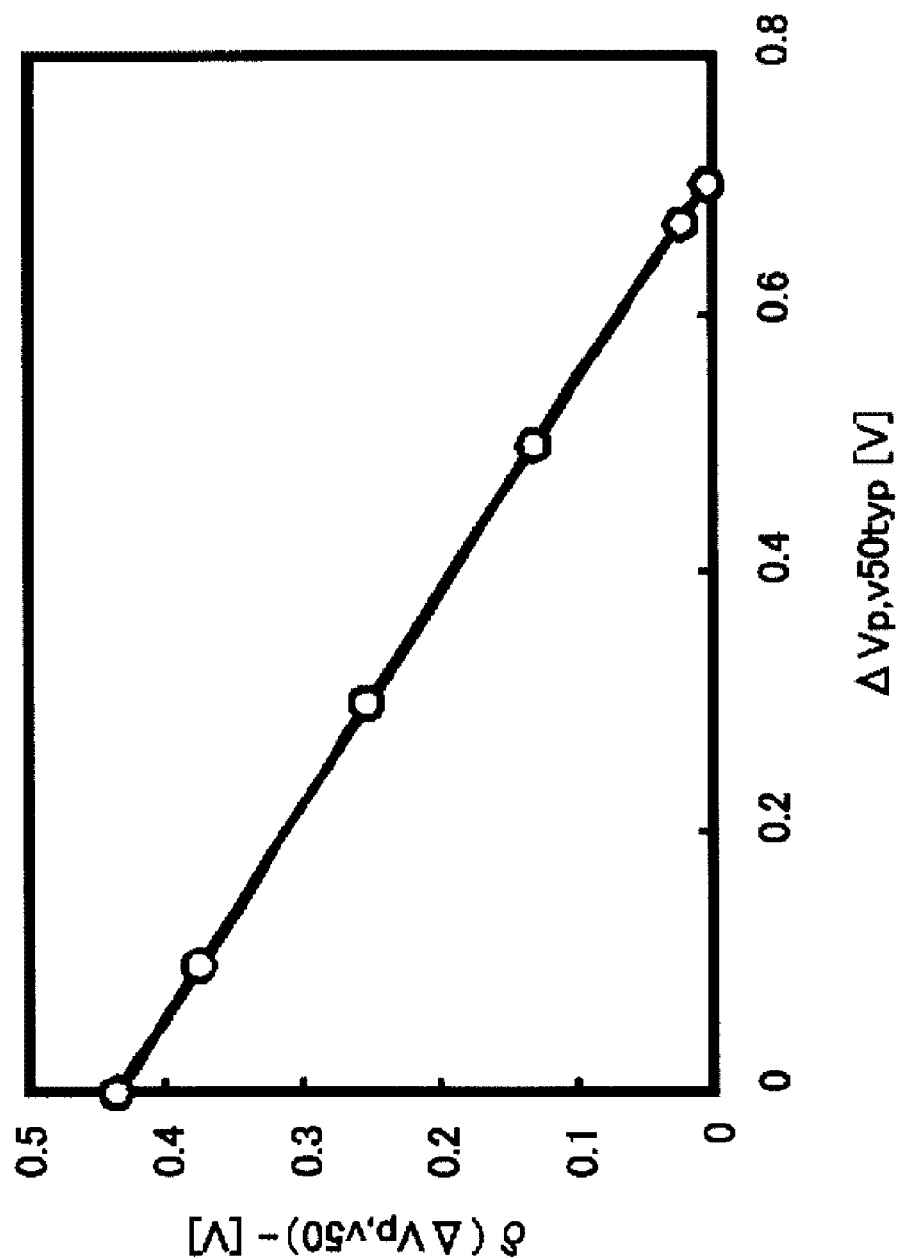
FIG. 14 In one embodiment when the constraint condition based on the relational formula of the present invention is applied for TAOS, a drawing which indicates the relation between the allowable variation amount δ(ΔVp,v50)− when the 50% punch-through voltage ΔVp,v50 shifts to the direction of the decrease from the design 50% punch-through voltage ΔVp,v50typ and the design 50% punch-through voltage ΔVp,v50typ.

FIG. 14 is a graph that the allowable variation amount δ(ΔVp,v50)− of the 50% punch-through voltage for each value of the design 50% punch-through voltage ΔVp,v50typ in FIG. 13 was obtained. It is necessary to set the variation amount δ(ΔVp,v50)− large from the designed value of the punch-through voltage in order to set the management value of the alignment accuracy in the practicable range. That is, in the conventional example which was explained by referring to FIG. 9 and FIG. 10, when the design 50% punch-through voltage ΔVp,v50typ is 0.67V, because the allowable alignment shift amount was small and only 0.506σ equivalency, the design 50% punch-through voltage ΔVp,v50typ is set smaller than 0.67V from FIG. 14 for ensuring the practicable allowable alignment shift amount. Therefore, from the formula of the punch-through voltage which is indicated by the formula (1), The channel width W is fixed at Wmin-u, and the design 50% punch-through voltage ΔVp,v50typ is indicated by considering the 50% load capacitance Cload,v50 as the parameter. The reason why the channel width W is fixed at Wmin-u is to avoid the state of increasing the auxiliary capacitance comprised from opaque electrode and decreasing the aperture ratio because the load capacitance has to be set larger when the channel width W is larger than Wmin-u. Thereby, the relation between the design 50% punch-through voltage ΔVp,v50typ and the allowable variation amount δ(ΔVp,v50)− of the punch-through voltage which is indicated in FIG. 14 can be replaced to the relation between the 50% load capacitance Cload,v50 and the allowable variation amount δ(ΔVp,v50)− of the punch-through voltage. The obtained relation between the 50% load capacitance Cload, v50 and the allowable variation amount δ(ΔVp,v50)− of the punch-through voltage can be replaced to the relation between the 50% load capacitance Cload,v50 and the allowable variation amount δCgs of the parasitic capacitance Cgs between the gate and the source by again using the formula (1). The obtained allowable variation amount δCgs of the parasitic capacitance Cgs between the gate and the source can be converted to the allowable alignment shift amount δdi from the capacitance per unit area between the gate and the source and the variation area by the alignment shift of the parasitic capacitance Cgs between the gate and the source which was explained by referring to FIG. 6.

Figure 6:
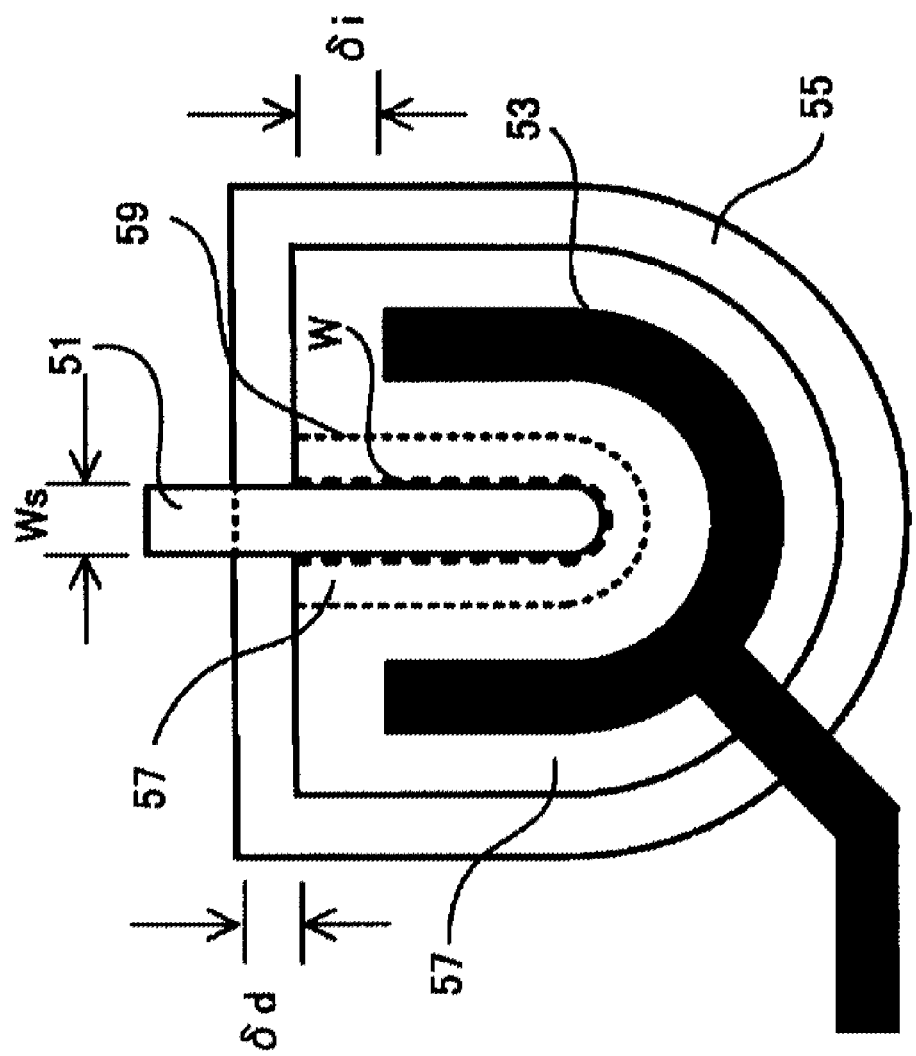
FIG. 6 A drawing which indicates the amorphous silicon TFT which is used in the conventional liquid crystal display devices and the region of the parasitic capacitance Cgs between the gate and the source.
Figure 7:
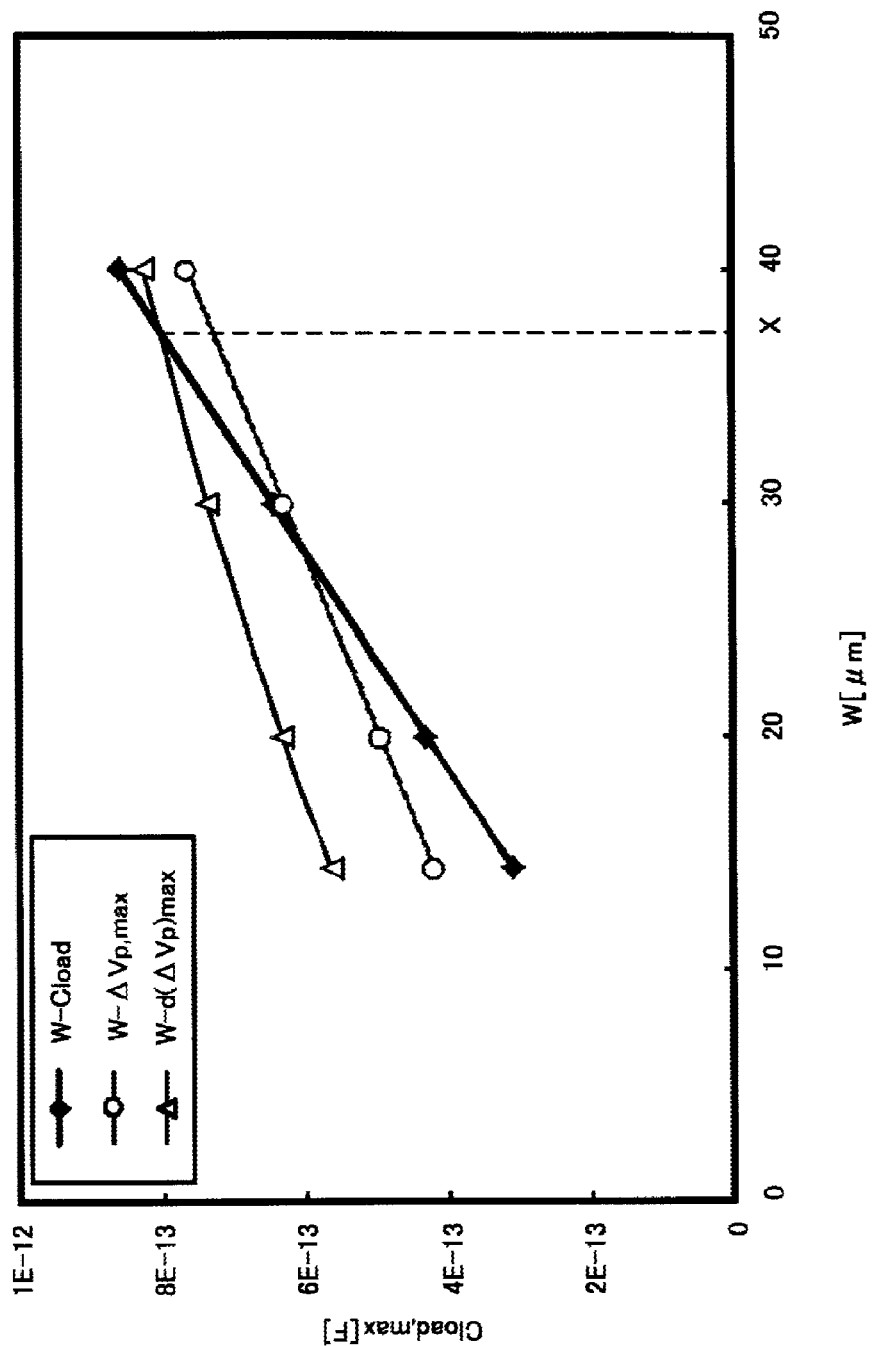
FIG. 7 In the conventional example for the amorphous silicon, a result of the simulation which indicates the relation of the chargeable load capacitance for the channel width W and the relation of the load capacitance which is necessary to decrease the punch-through voltage ΔVp for the channel width W to the standard value or less.
Figure 15:
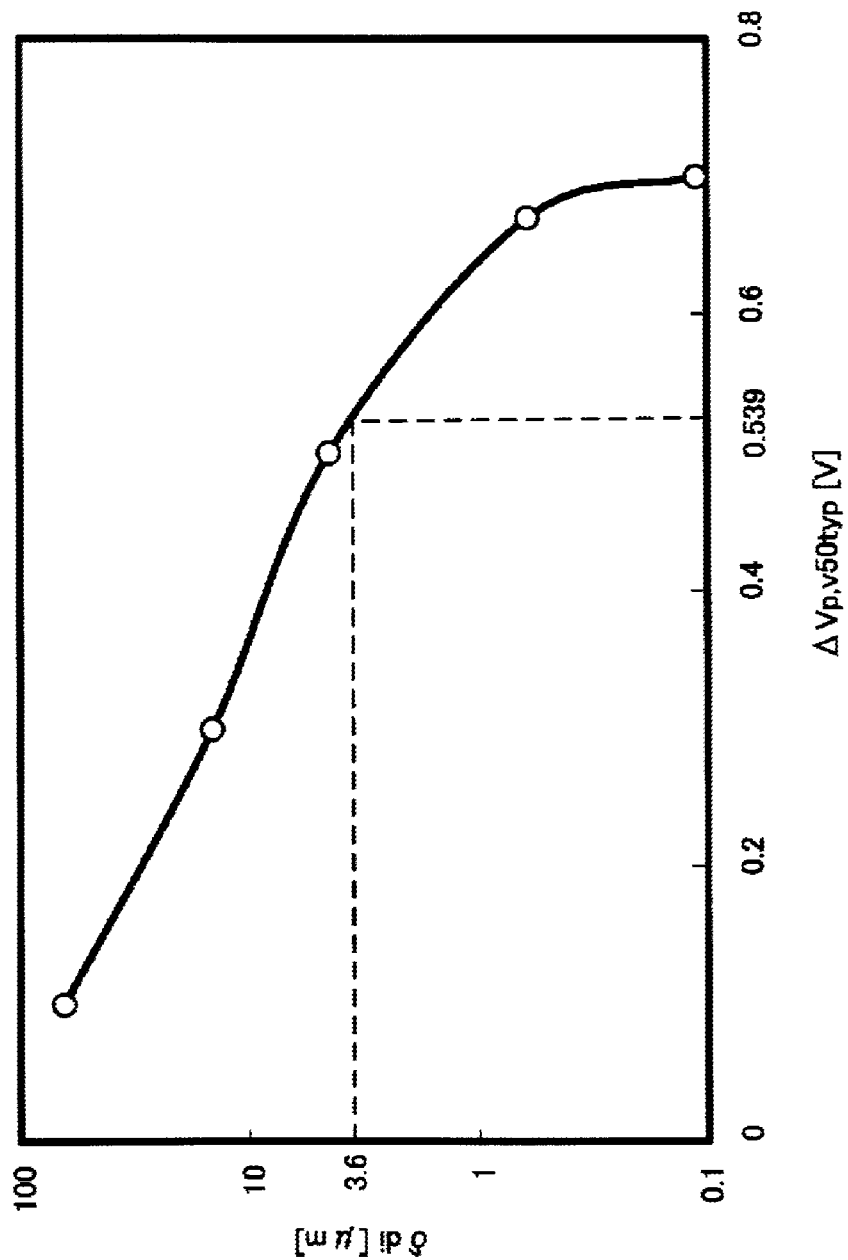
FIG. 15 In one embodiment when the constraint condition based on the relational formula of the present invention is applied for TAOS, a drawing which indicates the relation between the allowable alignment shift amount δdi and the design 50% punch-through voltage ΔVp,v50typ.

FIG. 15 is a graph which indicates the relation between the design 50% punch-through voltage ΔVp,v50typ and the allowable alignment shift amount δdi which is obtained from FIG. 14. When the direct alignment shift amount δd and the indirect alignment shift amount δi of 3σ equivalency which are indicated in FIG. 6 are respectively considered as 2 µm and 3 µm, the resultant alignment shift amount δdi is 3.6 µm. From FIG. 15, it is understood that the allowable alignment shift amount δdi becomes 3.6 µm when the design 50% punch-through voltage ΔVp,v50typ is 0.539V. Besides, when obtaining the maximum load capacitance Cload,max for this state, it is 0.570 pF, and from FIG. 9, it is sufficiently chargeable capacitance even if the channel width W is Wmin-u, and it is understood that it is located in the upper direction than the graph of W-ΔVp,max characteristic and the graph of W-d (ΔVp)max characteristic. That is, when the design 50% punch-through voltage ΔVp,v50typ is set as 0.539V, it becomes the optimum pixel that the value of the auxiliary capacitance which is necessary for having the margin for the resultant alignment shift amount of 3σ equivalency, for satisfying the maximum punch-through voltage ΔVp,max≤1.7V and the maximum punch-through voltage difference d(ΔVp)max≤3.35V which are the conventional punch-through constraint condition, and for restraining the design optimum counter electrode potential difference δVcom,typ to the allowable limit or less is restrained to the minimum.

[Compensation Drive]

Next, one embodiment that the design method based on the relational formula of the present invention for the case that the punch-through compensation drive by Cs on Gate is used to TAOS that the field-effect mobility is 10 cm2/Vs is applied is explained by referring to the drawing as follows. In the individual parameters in this embodiment, the scanning signal line time constant τg is 2.5 μs, the threshold voltage Vth is 0V, the gate electrode potential of the ON-state TFT Vgh is 15V, the gate electrode potential of the OFF-state TFT Vgl is −2V and the field-effect mobility μeff is 10 cm2/Vs. That is, these parameters are same as the parameters which are applied in the embodiment of the present invention when the punch-through compensation drive is not performed. Besides, in the punch-through compensation drive, because the influence for the charge to the load capacitance Cload in the period that the TFT is the ON-state is small, it may be ignored here. Therefore, W-Cload characteristic, W-ΔVp,max characteristic and W-d(ΔVp)max characteristic in this embodiment are same as FIG. 9.

Figure 16:
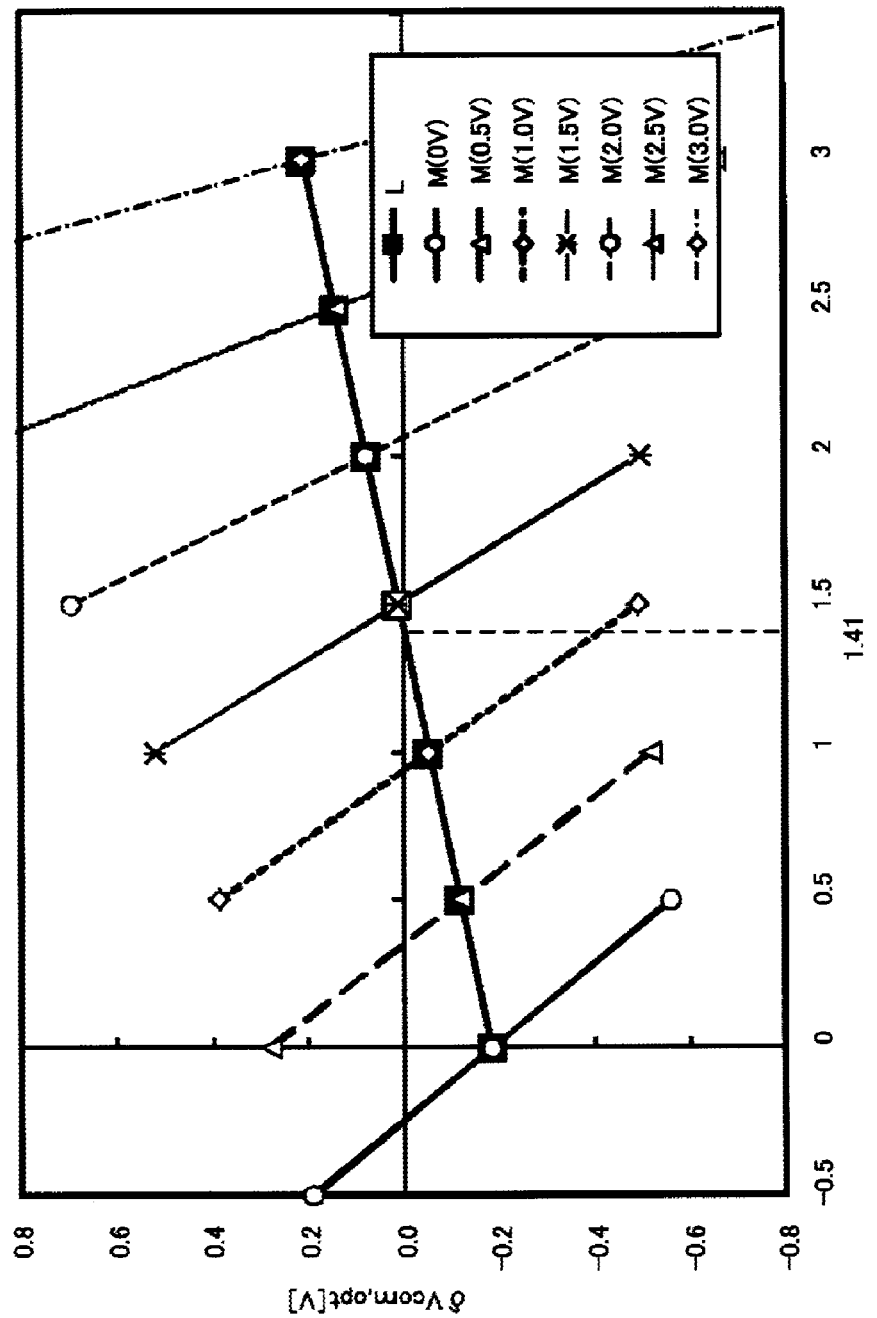
FIG. 16 In one embodiment that the constraint condition based on the relational formula of the present invention is applied when the punch-through compensation drive by Cs on Gate is performed for TAOS, a drawing which indicates the relation between the design 50% punch-through voltage ΔVp,v50typ and the design optimum counter electrode potential difference δVcom,typ and the relation of the variation of the optimum counter electrode potential difference δVcom,opt when the 50% punch-through voltage ΔVp,v50 varies from the design 50% punch-through voltage ΔVp,v50typ.

FIG. 16 is a graph which indicates the relation of the optimum counter electrode potential difference δVcom,opt which is obtained by using the relational formula of the present invention for the 50% punch-through voltage ΔVp, v50. L is the graph which is obtained by the formula (3), and indicates the design optimum counter electrode potential difference δVcom,typ for the design 50% punch-through voltage ΔVp,v50typ in the parasitic capacitance Cgs of the TFT which is completed as the designed value. "M(0V)"-"M(3V)" are the graph which is obtained by the formula (4) respectively, and when assuming the case that the parasitic capacitance Cgs varies from the designed value by such as the alignment shift when the design 50% punch-through voltage ΔVp,v50typ is 0V-3V, thereby, the optimum counter electrode potential difference δVcom,opt is indicated when the 50% punch-through voltage ΔVp,v50 varies ±0.5V from the design 50% punch-through voltage ΔVp,v50typ.

In FIG. 16, the slope of the straight line L which indicates the design optimum counter electrode potential difference δVcom,typ for the design 50% punch-through voltage ΔVp, v50typ becomes small as compared with the case of the punch-through non-compensation drive of FIG. 14. This is because the overcharging electric current decreases as the result that the effective punch-through voltage decreases by the punch-through compensation drive. However, the slope of the straight line M which indicates the variation of the optimum counter electrode potential difference δVcom,opt for the variation of the 50% punch-through voltage ΔVp,v50 becomes large as compared with the case of the punch-through non-compensation drive, and further, the absolute value of the slope of the straight line M increases for the increase of the design 50% punch-through voltage ΔVp, v50typ. This is referred from the punch-through compensation condition, and this is because the ratio of the parasitic capacitance Cgs and the auxiliary capacitance Cs should be constant by the formula (2) in the punch-through compensation drive.

At present, the straight line L intersects the horizontal axis when the design 50% punch-through voltage ΔVp,v50typ is 1.41V, and at this time, each allowable variation amount δ(ΔVp,v50)+ and δ(ΔVp,v50)− of the 50% punch-through voltage are equivalent when the 50% punch-through voltage ΔVp,v50 increases and decreases, and the allowable variation amount of the 50% punch-through voltage becomes the maximum. However, even if the allowable variation amount of the 50% punch-through voltage is the maximum, the allowable alignment shift amount δdi does not often become the maximum. As it is understood from the formula (1), this is caused by the reason that the punch-through voltage is proportional to the ratio of the parasitic capacitance Cgs between the gate and the source and the load capacitance Cload. When the punch-through compensation drive is applied to the case of amorphous silicon, although the design was performed in the neighborhood of the region that the allowable variation amount of the 50% punch-through voltage became the maximum, this was the reason for increasing the aperture ratio as much as possible for the amorphous silicon that the field-effect mobility was small. On the other hand, the object of the present invention is to improve the screen quality when the semiconductor that the field-effect mobility is large is used. Therefore, in this embodiment, the method for attempting the optimization of the pixel based on FIG. 16 is explained by referring to the drawing as follows.

Figure 11:
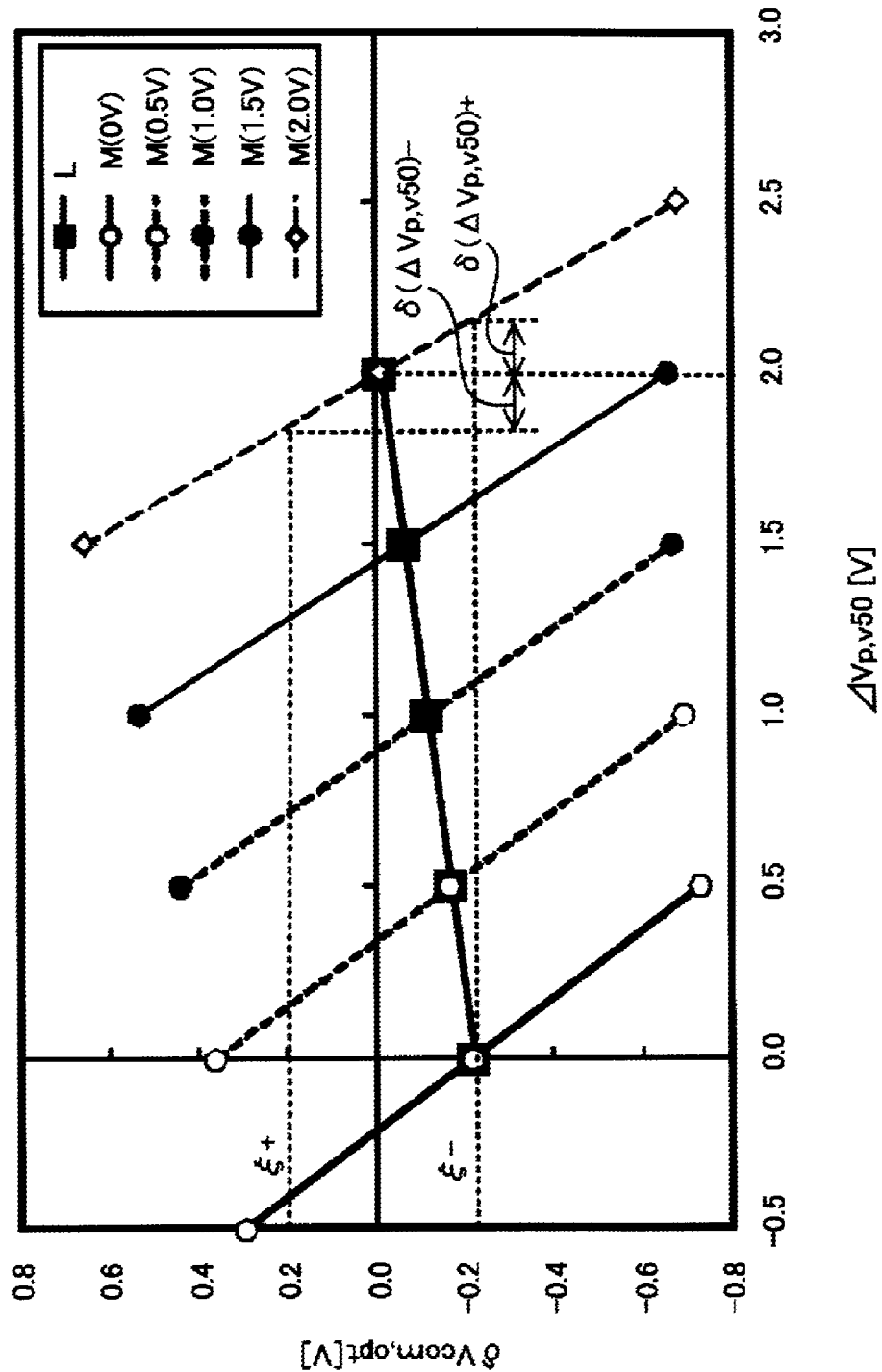
FIG. 11 In the conventional example when the punch-through compensation drive by Cs on Gate is performed for the amorphous silicon, a result of the simulation which indicates the relation between the design 50% punch-through voltage ΔVp,v50typ and the design optimum counter electrode potential difference δVcom,typ and the relation of the variation of the optimum counter electrode potential difference δVcom,opt when the 50% punch-through voltage ΔVp,v50 varies from the design 50% punch-through voltage ΔVp,v50typ.

As well as the case of the conventional example that the punch-through compensation drive was applied to the amorphous silicon which was explained by referring to FIG. 11, it is considered that the constraint condition concerning the punch-through is relaxed by the punch-through compensation drive in this embodiment too, and the upper limit value for the maximum punch-through voltage ΔVp,max or the maximum punch-through voltage difference d(ΔVp)max is not set. That is, the condition for attempting the optimization of the pixel is the fact that the optimum counter electrode potential difference δVcom,opt is restrained within the allowable range, the management value of the alignment accuracy is set in the practicable range and the aperture ratio becomes the maximum.

Figure 17:
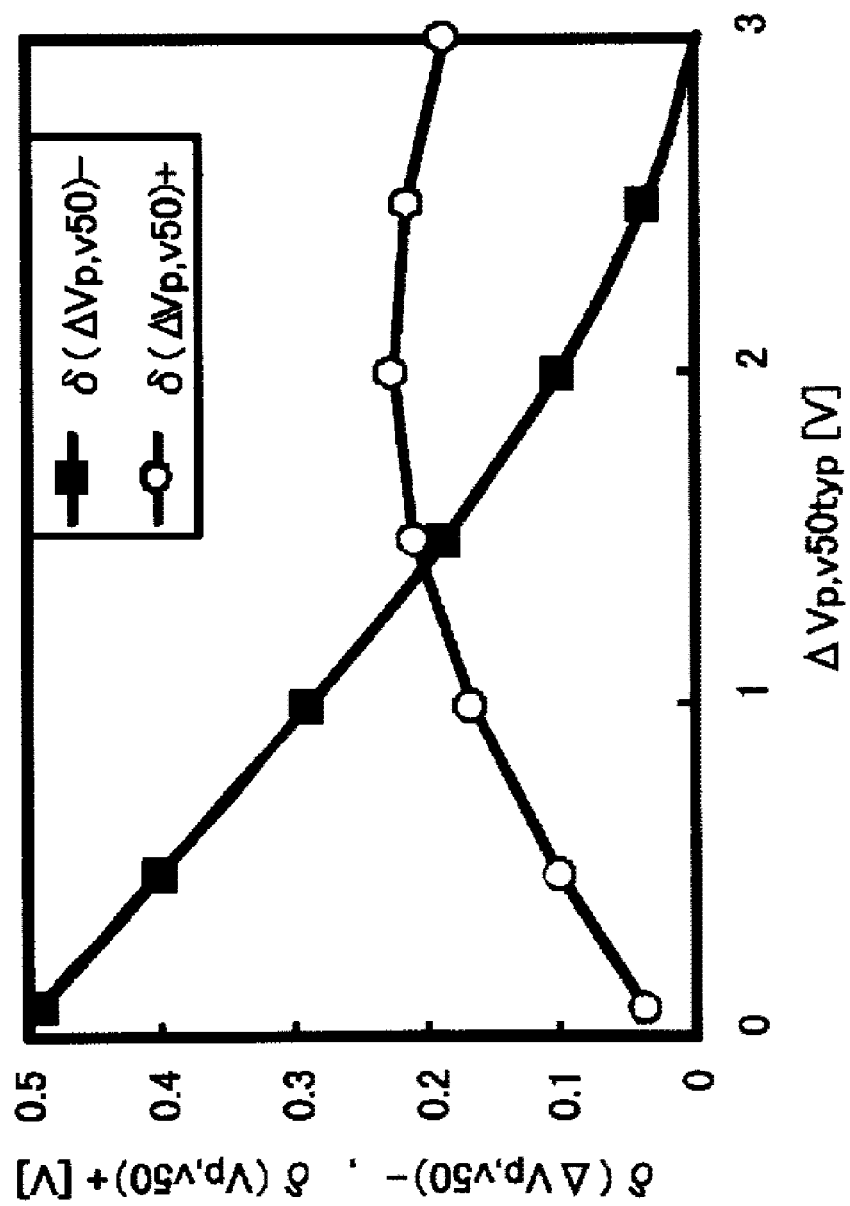
FIG. 17 In one embodiment that the constraint condition based on the relational formula of the present invention is applied when the punch-through compensation drive by Cs on Gate is performed for TAOS, a drawing which indicates the relation between the respective allowable variation amounts δ(ΔVp,v50)− and δ(ΔVp,v50)+ when the 50% punch-through voltage ΔVp,v50 shifts to the directions of the decrease and the increase from the design 50% punch-through voltage ΔVp,v50typ and the design 50% punch-through voltage ΔVp,v50typ.

FIG. 17 is a graph which obtained the allowable variation amounts δ(ΔVp,v50)− and δ(ΔVp,v50)+ of the direction that the 50% punch-through voltage decreased and the direction that the 50% punch-through voltage increased for each value of the design 50% punch-through voltage ΔVp,v50typ in FIG. 16. As well as the case of the punch-through non-compensation drive which was explained by using FIG. 14 and FIG. 15, from the relation among the allowable variation amounts δ(ΔVp,v50)− and δ(ΔVp,v50)+ of the 50% punch-through voltage and the design 50% punch-through voltage ΔVp,v50typ which are indicated in FIG. 17, the relation between the allowable alignment shift amount δdi and the design 50% punch-through voltage ΔVp,v50typ is obtained.

That is, the channel width W is fixed at Wmin-u, and from the formula of the punch-through voltage which is indicated in the formula (1), the design 50% punch-through voltage ΔVp,v50typ is indicated by considering the 50% load capacitance Cload,v50 as the parameter. The reason why the channel width W is fixed at Wmin-u is to avoid the state of becoming large in the auxiliary capacitance which comprises the opaque electrode and the decrease of the aperture ratio because the load capacitance should be set larger when the channel width W is larger than Wmin-u. Thereby, the relation among the allowable variation amounts δ(ΔVp,v50)− and δ(ΔVp,v50)+ of the punch-through voltage and the design 50% punch-through voltage ΔVp,v50typ which are indicated in FIG. 17 can be replaced to the relation among the allowable variation amounts δ(ΔVp,v50)− and δ(ΔVp,v50)+ of the punch-through voltage and the 50% load capacitance Cload, v50.

The obtained relation among the allowable variation amounts δ(ΔVp,v50)− and δ(ΔVp,v50)+ of the 50% punch-through voltage and the 50% load capacitance Cload,v50 can be replaced to the relation between the allowable variation amount Cgs of the parasitic capacitance Cgs between the gate and the source and the 50% load capacitance Cload,v50 by again using the formula (1). The obtained allowable variation amount δCgs of the parasitic capacitance Cgs between the gate and the source can be converted to the allowable alignment shift amount δdi from the capacitance per unit area between the gate and the source and the variation area by the alignment shift of the parasitic capacitance Cgs between the gate and the source which was explained by referring to FIG. 6. Particularly, the allowable alignment shift amount for the allowable variation amount δ(ΔVp,v50)− of the 50% punch-through voltage of the direction that the 50% punch-through voltage decreases from the design 50% punch-through voltage is indicated as δdi−, and the allowable alignment shift amount for the allowable variation amount δ(ΔVp,v50)+ of the 50% punch-through voltage of the direction that the 50% punch-through voltage increases from the design 50% punch-through voltage is indicated as δdi+.

Figure 18:
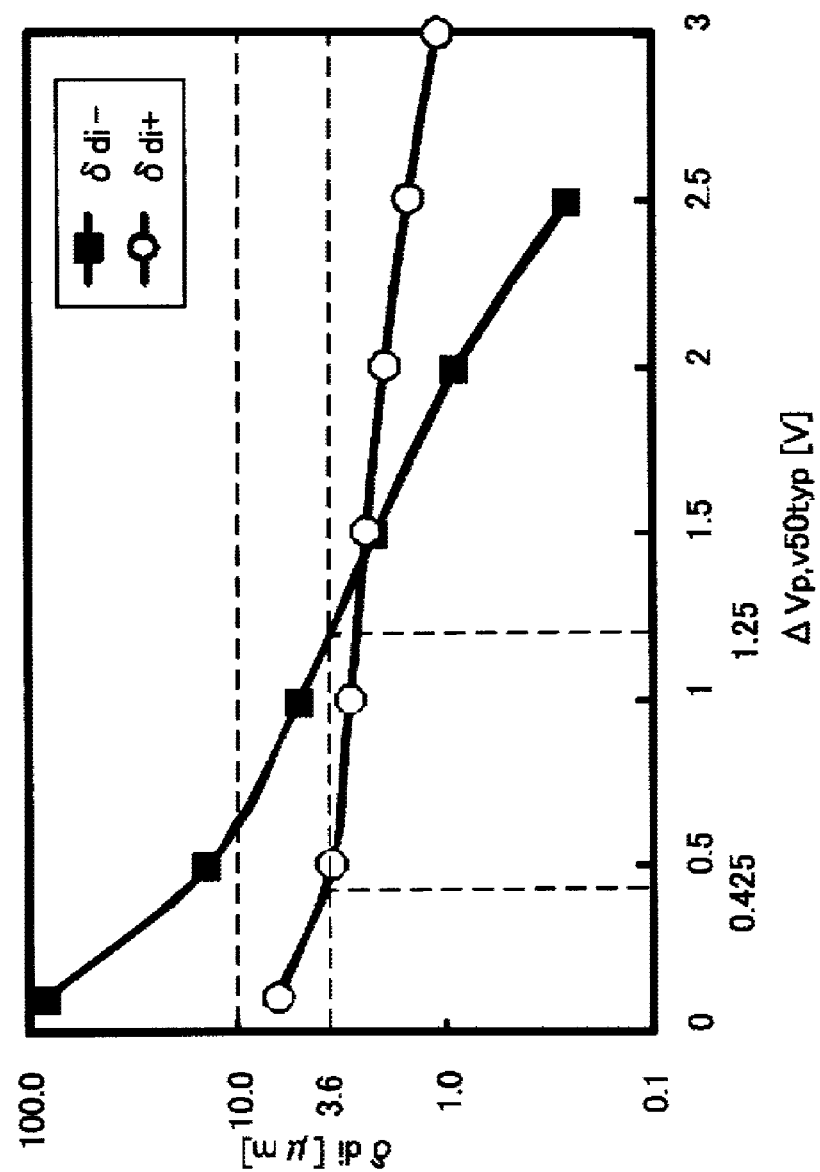
FIG. 18 In one embodiment that the constraint condition based on the relational formula of the present invention is applied when the punch-through compensation drive by Cs on Gate is performed for TAOS, a drawing which indicates the relation between the respective allowable alignment shift amounts δdi− and δdi+ when the 50% punch-through voltage ΔVp,v50 shifts to the directions of the decrease and the increase from the design 50% punch-through voltage ΔVp,v50typ and the design 50% punch-through voltage ΔVp,v50typ.

FIG. 18 is a graph which indicates the relation among the allowable alignment shift amount δdi− for the allowable variation amount δ(ΔVp,v50)− of the 50% punch-through voltage of the direction that the 50% punch-through voltage decreases from the design 50% punch-through voltage and the allowable alignment shift amount δdi+ for the allowable variation amount δ(ΔVp,v50)+ of the 50% punch-through voltage of the direction that the 50% punch-through voltage increases from the design 50% punch-through voltage and the design 50% punch-through voltage ΔVp,v50typ which were obtained by FIG. 17. δdi+ decreases monotonously in FIG. 18 whereas δ(ΔVp,v50)+ indicates the maximum value in the neighborhood of the design 50% punch-through voltage ΔVp, v50typ=2V in FIG. 17. This is because the degree of the monotonous decrease that the 50% load capacitance Cload, v50 which is obtained for each design 50% punch-through voltage ΔVp,v50 with fixing W at Wmin-u indicates for the design 50% punch-through voltage ΔVp,v50typ is larger than the degree of the increase of δ(ΔVp,v50)+. From this result, both allowable alignment shift amounts δdi− and δdi+ indicate the monotonous decrease for the design 50% punch-through voltage ΔVp,v50typ.

When the direct alignment shift amount δd and the indirect alignment shift amount δi of 3σ equivalency which are indicated in FIG. 6 are respectively considered as 2 μm and 3 μm, the resultant alignment shift amount δdi is 3.6 μm. From FIG. 18, the region of the design 50% punch-through voltage ΔVp, v50typ that the allowable alignment shift amount δdi becomes 3.6 μm or more is 1.25V or less for δdi− and 0.425V or less for δdi+. That is, the region of ΔVp,v50typ that both δdi− and δdi+ become 3.6 μm or more is 0.425V or less. It is necessary to set the auxiliary capacitance which comprises the opaque electrode at the size of the minimum requirement for maximizing the aperture ratio, and if it is possible to perform the process control of the alignment accuracy with 3σ, the value which becomes the rate-determining factor among the allowable alignment shift amounts δdi− and δdi is set to 3σ equivalency.

In this embodiment, the 3σ equivalency is the state that the design 50% punch-through voltage ΔVp,v50 is 0.425V. The maximum load capacitance Cload,max of this case is 0.698 pF, and from FIG. 9, even if the channel width W is Wmin-u, it is the sufficient chargeable capacitance. From the above, the optimum pixel in this embodiment is the state that the channel width W is Wmin-u, the maximum load capacitance Cload, max is 0.698 pF and the design 50% punch-through voltage ΔVp,v50 is 0.425V. Besides, for 2.37σ which is same as the alignment accuracy of the case that the punch-through compensation drive is applied to the amorphous silicon one which is explained by referring to FIG. 11, the allowable alignment shift amount δdi becomes 1.98 nm, and δdi+ becomes the rate-determining factor in the allowable alignment shift amount, and the design 50% punch-through voltage ΔVp, v50typ is set at 1.53V.

Here, the value of the design 50% punch-through voltage ΔVp,v50typ for the optimum pixel of the case which performs the punch-through compensation drive which was explained in this embodiment becomes smaller than the value of the design 50% punch-through voltage ΔVp,v50typ for the optimum pixel of the case that the punch-through non-compensation drive is applied to TAOS which was explained by using FIG. 13-FIG. 15. That is, because both channel widths W are same, the difference of the design 50% punch-through voltage ΔVp,v50typ means the difference of the auxiliary capacitance Cs which comprises the opaque electrode, and the fact that the aperture ratio might become high by applying the punch-through non-compensation drive was obtained as new knowledge by the present invention. This is caused by the slope of M which was obtained from the formula (4) of the present invention which was explained by referring to FIG. 13 and FIG. 16, that is, this is caused by the fact that the case of the punch-through compensation drive is larger than the case of the punch-through non-compensation drive in the absolute value of the ratio η of the optimum counter electrode potential difference δVcom,opt for the change of the 50% punch-through voltage ΔVp,v50.

[Local Mode Flicker]

Figure 19:
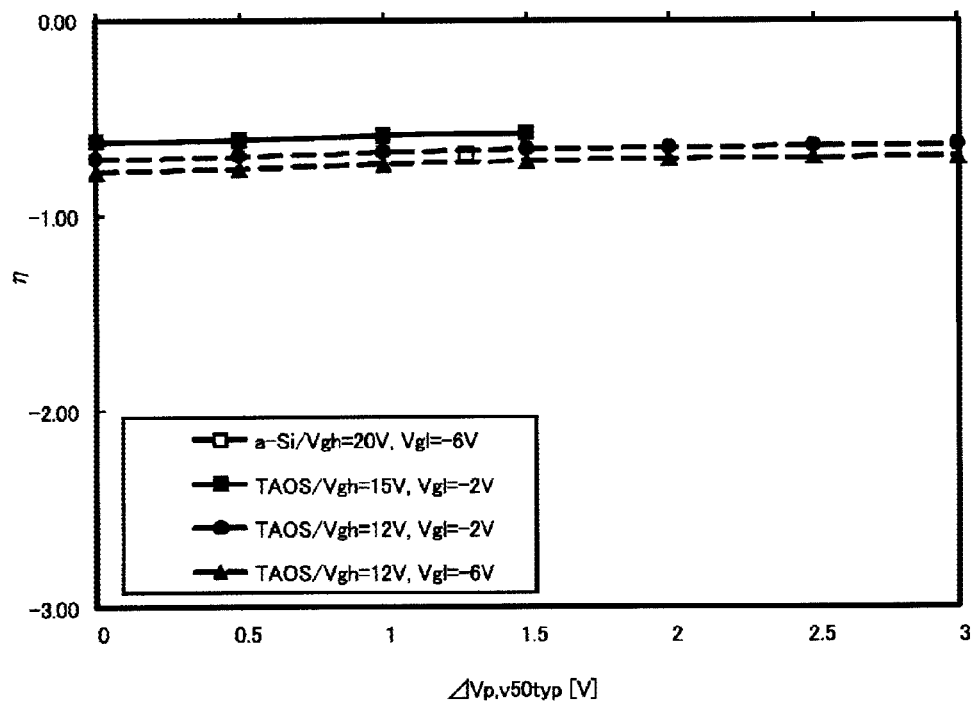
FIG. 19 In the respective cases of the punch-through compensation drive and the punch-through non-compensation drive concerning the amorphous silicon and TAOS, a drawing which indicates the relation between the slope η of the straight line which is indicated by the formula (4) in the present invention and the designed value of the 50% punch-through voltage ΔVp,v50.
Figure 19:
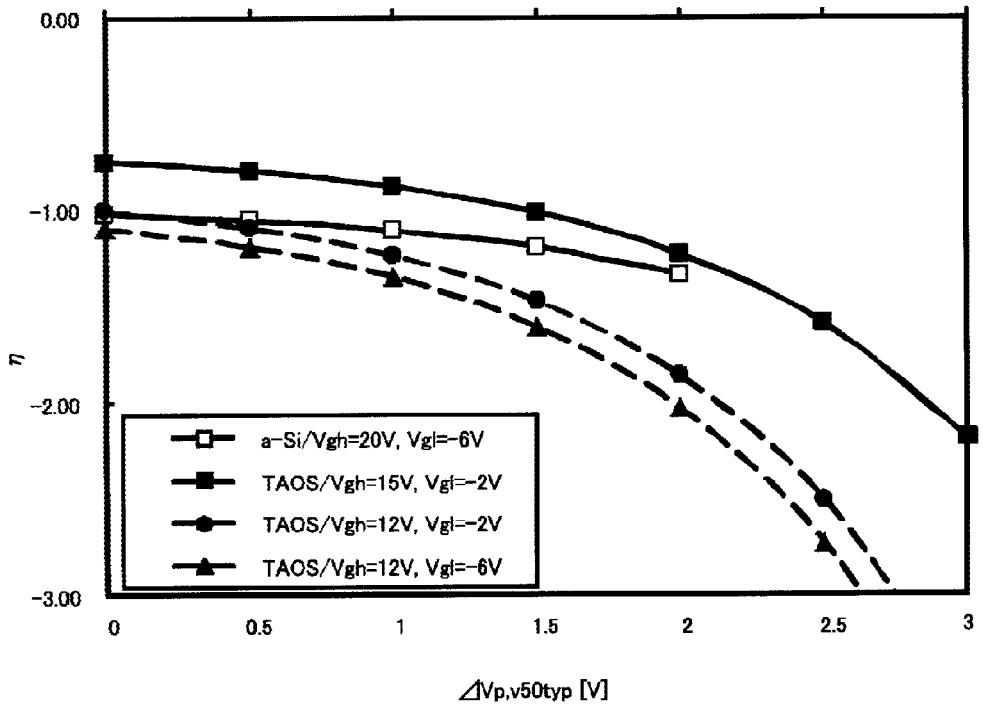

Next, the case that the present invention is used to the flicker decrease of the local mode is explained by referring to the drawing as follows. FIG. 19 is a graph which indicates the dependence of the slope η of the straight line M which is indicated by the formula (4) which indicates the rate of the change of the optimum counter electrode potential difference δVcom,opt for the variation of the 50% punch-through voltage ΔVp,v50 on the design 50% punch-through voltage ΔVp, v50typ, in the liquid crystal display device which used the amorphous silicon and TAOS as the semiconductor layer of the pixel TFT which were described in the conventional example and the embodiment of the present invention.

Figure 8:
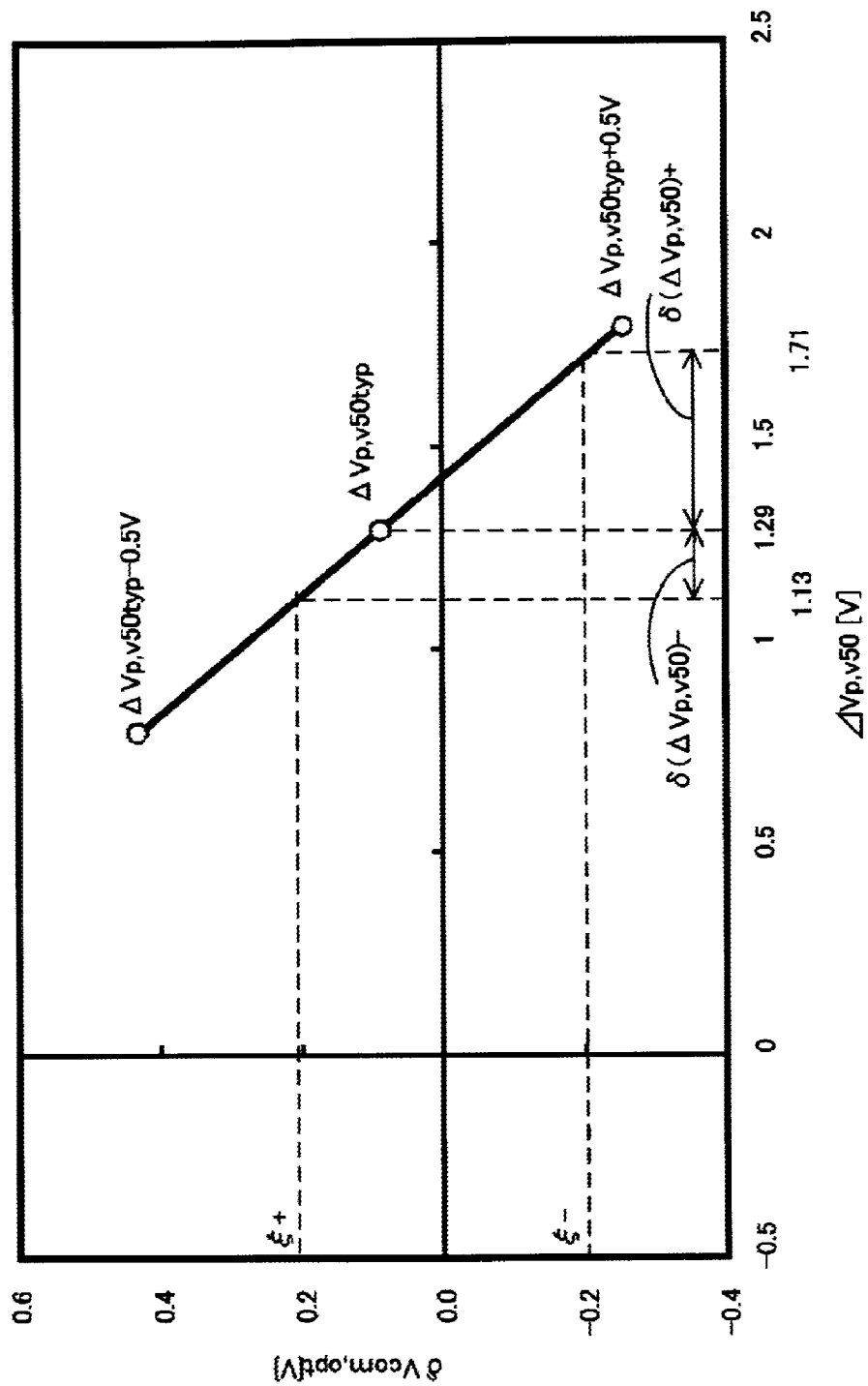
FIG. 8 In the conventional example for the amorphous silicon, a result of the simulation which indicates the variation of the optimum counter electrode potential difference δVcom,opt when the 50% punch-through voltage ΔVp,v50 varies from the design 50% punch-through voltage ΔVp,v50typ.

That is, the slopes of each straight line M in FIG. 8 and FIG. 11 which are obtained by the simulation concerning the amorphous silicon and the slopes of the straight line M in FIG. 13 and FIG. 16 which are obtained by the relational formula (4) of the present invention concerning TAOS are plotted respectively. And, FIG. 19 (A) indicates the case of the punch-through non-compensation drive, and concerning TAOS, in addition to Vgh=15V, Vgl=−2V of the parameters which were used in the embodiment, the cases of Vgh=12V, Vgl=−2V and Vgh=12V, Vgl=−6V are indicated with dotted line graphs. Similarly, FIG. 19 (B) indicates the case of the punch-through compensation drive, and concerning TAOS, in addition to Vgh=15V, Vgl=−2V of the parameters which were used in the embodiment, the cases of Vgh=12V, Vgl=−2V and Vgh=12V, Vgl=−6V are indicated with dotted line graphs.

In the case of the punch-through non-compensation drive which is indicated in FIG. 19 (A), although the absolute value of η which indicates the rate of the change of the optimum counter electrode potential difference δVcom,opt for the variation of the 50% punch-through voltage ΔVp,v50 increases as the increase of Vgh and the decrease of Vgl, the amount of the increase is small, and it is included in 0.6-0.7 at the same level as the amorphous silicon. In the case of the punch-through non-compensation drive of the amorphous silicon, because the flicker of the local mode was very slight and was the level that the visibility is difficult, it is thought that the flicker of the local mode becomes very slight in TAOS also.

On the other hand, in the case of the punch-through compensation drive which is indicated in FIG. 19 (B), the amount of the increase of the absolute value of η for the increase of Vgh and the decrease of Vgl is large, and the absolute value of η may become larger than the case of the amorphous silicon. Because the actual condition of the flicker of the local mode when the punch-through compensation drive is applied to the amorphous silicon is the level which can be clearly recognized visually, it is thought that the allowable limit of the absolute value of η is 1.5-2.0 level, and preferably, it is necessary to restrain the level to 0.7 or less of the punch-through non-compensation drive. That is, it is necessary to design such that the optimum counter electrode potential difference is restrained within the allowable limit and the absolute value of η is restrained in 2.0 or less.

[Organic EL]

Figure 20:
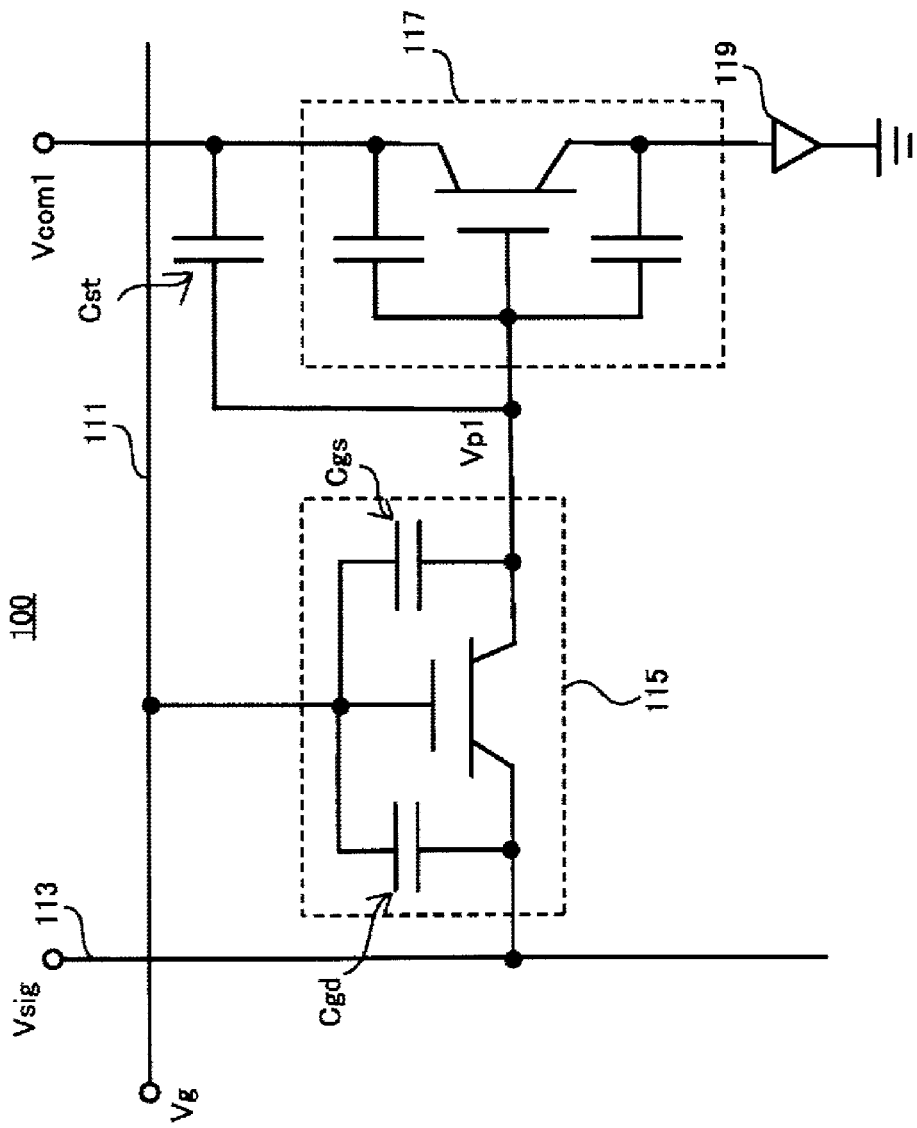
FIG. 20 A general equivalent circuit schematic of the pixel of the basic organic EL display device.

Next, the case that the present invention is applied to the organic EL display device is explained. FIG. 20 is the general equivalent circuit schematic of the pixel of the most basic organic EL display device 100. The gate electrode of the first TFT 115 is connected to the scanning signal line 111, the drain electrode is connected to the display signal line 113 and the source electrode is connected to storage capacitance Cst and the gate electrode of the second TFT 117 respectively. The drain electrode of the second TFT 117 is connected to power supply voltage Vcom1 and the source electrode is connected to LED 119 which is organic EL element respectively. That is, it is called 2T1C type which comprises two TFTs and one capacitance.

The first TFT 115 becomes ON-state in the selection period of the scanning signal line 111, and the charge to the storage capacitance Cst is performed, and the charge terminates when the source electrode potential (hereinafter called pixel electrode potential Vp1) of the first TFT 115 becomes equivalent to the drain electrode potential. The second TFT 117 becomes ON-state according to the pixel electrode potential Vp1 at this time, forward bias voltage is applied to the LED 119 and the electric current flows, and EL light emitting is generated. The pixel electrode potential Vp1 is held by the storage capacitance Cst after the termination of the selection period of the scanning signal line 111 also, and the ON-state of the second TFT 117 is maintained, and injection of the electric current to the LED 119 is continued.

At this time, it is necessary that the power supply voltage Vcom1 which is the drain electrode potential of the second TFT 117 is constant during the period that ON-state of the second TFT is held so that the injection of the constant electric current value is continued to the LED 119. However, it is difficult to control the value of the power supply voltage Vcom1 for each pixel independently because of causing such as the decrease of the yield by the complication of the pixel structure. Therefore, the power supply is performed from the outer power source as the power supply voltage Vcom1 is constant for every pixel in the whole screen, and the control of the electric current value which flows to the LED 119 is performed by controlling only pixel electrode potential Vp1 for each pixel. As this result, because the electric current which flows to the LED 119 is controlled at the gate electrode potential of the second TFT 117, the electric current value changes very sensitively for the value of the pixel electrode potential Vp1. That is, it is important to improve the uniformity and the stability of the pixel electrode potential Vp1.

As the cause that the pixel electrode potential Vp1 becomes ununiform, the shift of the threshold voltage Vth of the second TFT 117 by voltage stress can be pointed out, because the display device is a current injection type one, particularly, the second TFT 117 becomes always ON-state. As a counterplan, there is a method which arranges compensation circuit which comprises multiple TFTs and multiple capacitances to each pixel, and various circuits are proposed. However, because the introduction of the compensation circuit becomes the cause of the complication of the pixel structure, the disadvantage such as the limit of the output side setting of light from the LED or the decrease of the yield exists. Further, as well as the case of the punch-through compensation drive in the liquid crystal display device, because it is capacity coupling type compensation, expected compensation effect is not obtained and the in-plane uniformity of the luminance may decrease reversely when the value of each capacitance shifts from the designed value by process variation such as the alignment shift.

Figure 1:
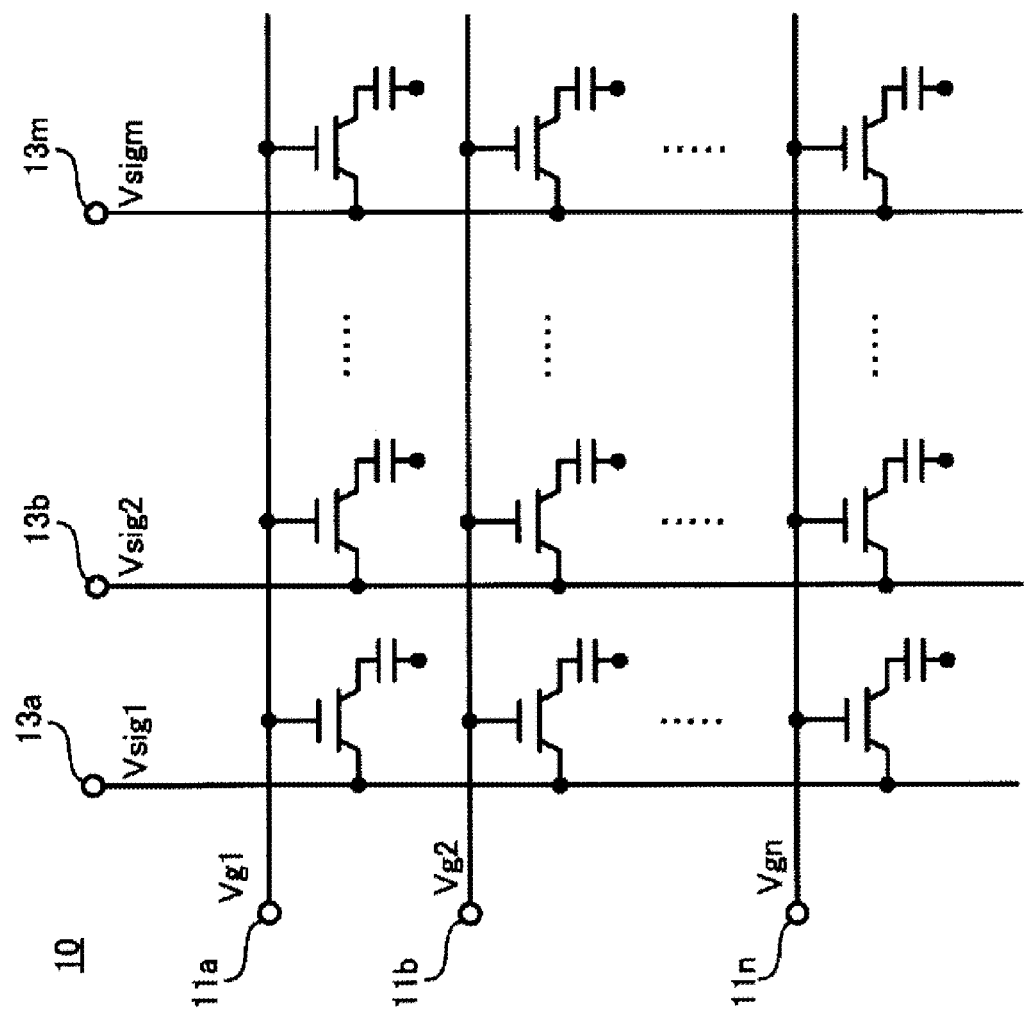
FIG. 1 A general equivalent circuit schematic which indicates the component of the liquid crystal display device.
Figure 2:
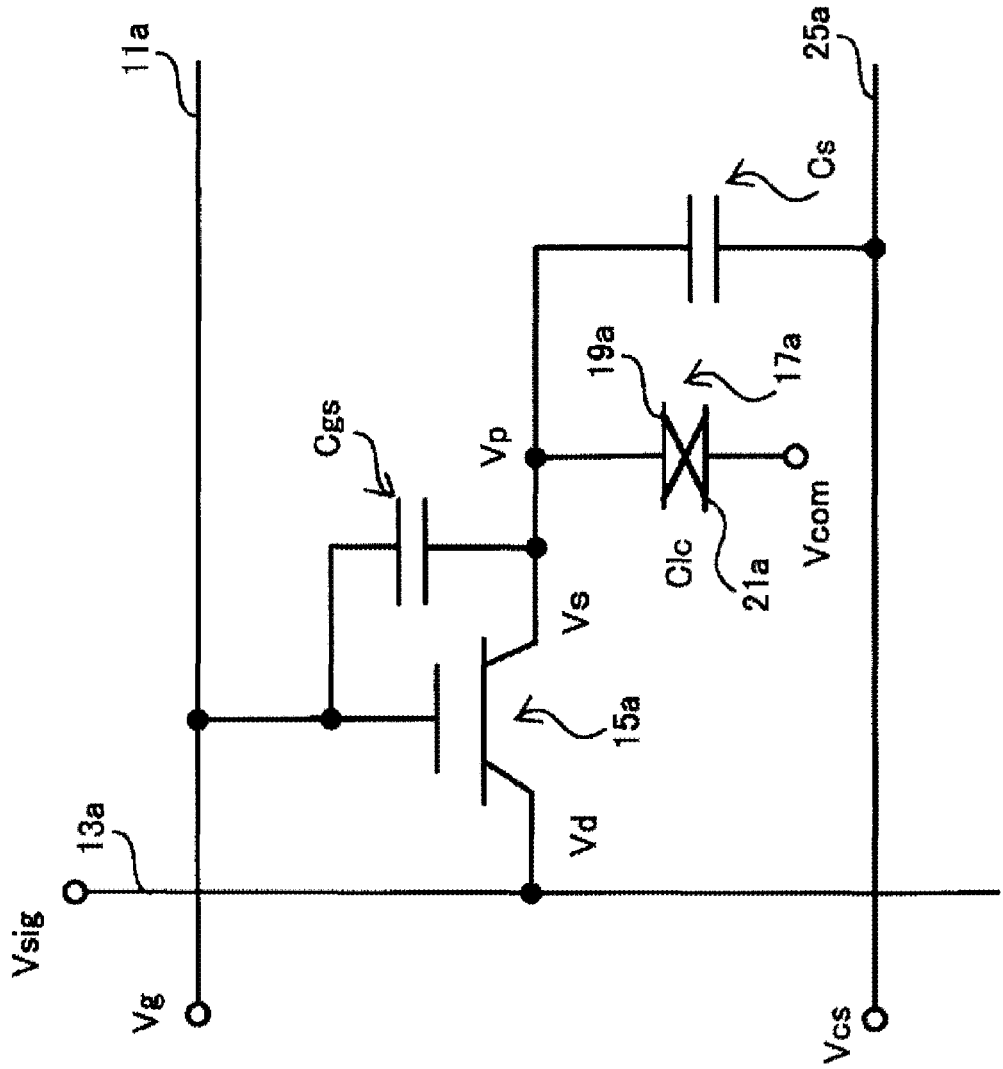
FIG. 2 A general equivalent circuit schematic which indicates the component of the pixel of the liquid crystal display device.
Figure 3:
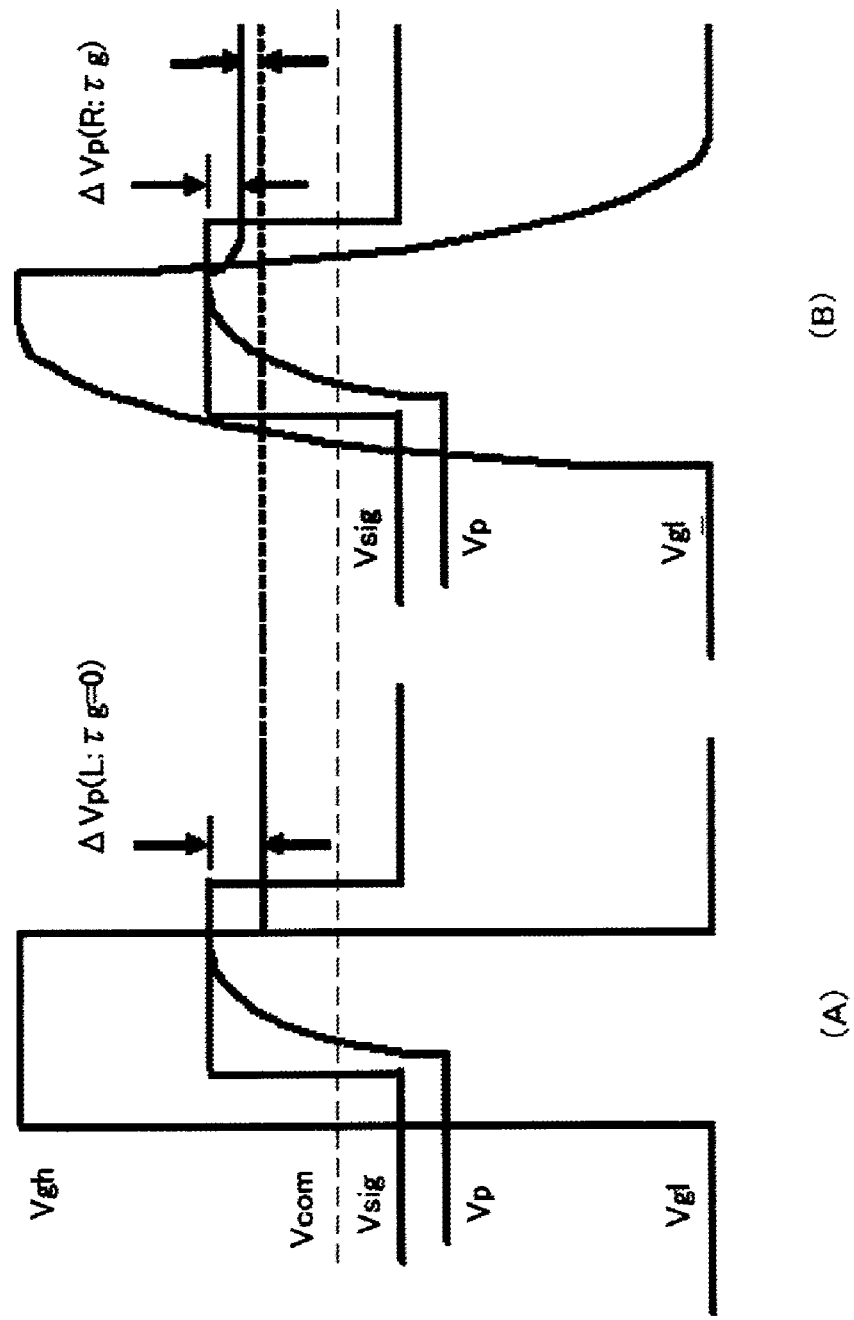
FIG. 3 A timing chart of driving potential waveform and pixel potential which indicates principle of the overcharging effect.
Figure 4:
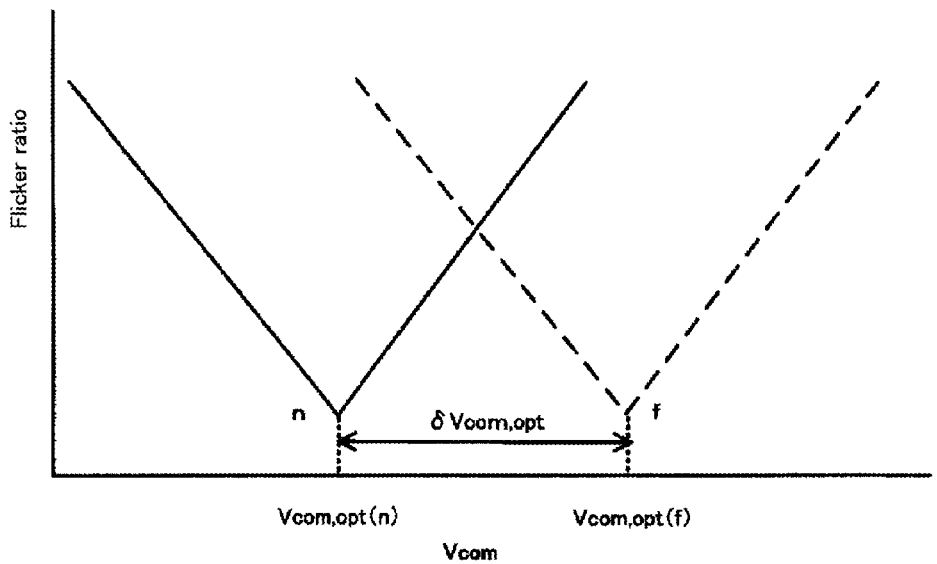
FIG. 4 A conceptual diagram which indicates the relation between the rate of the flicker and the optimum counter electrode potential Vcom,opt.
Figure 4:
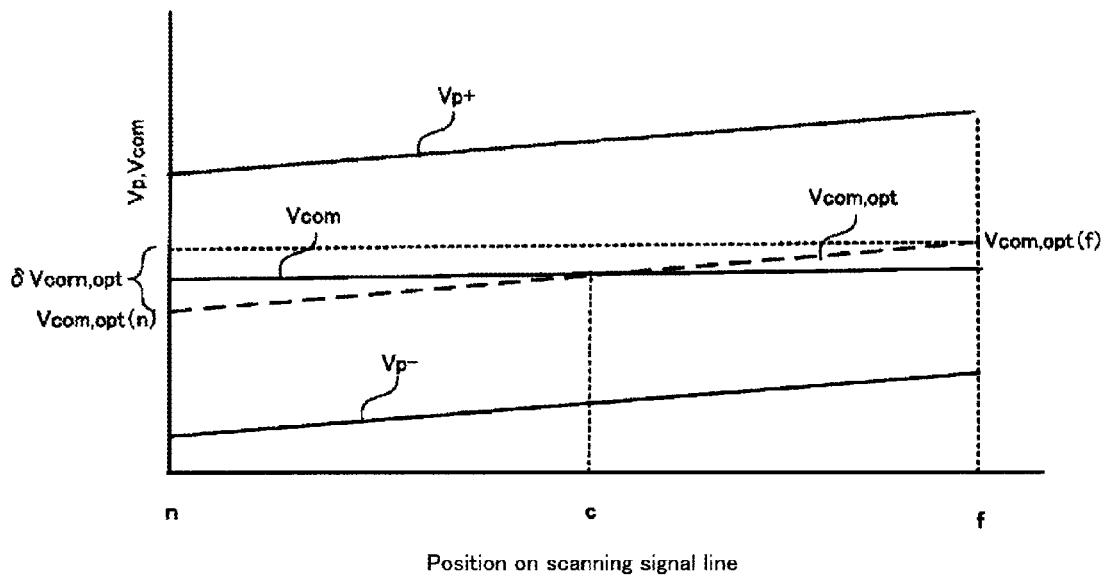
Figure 5:
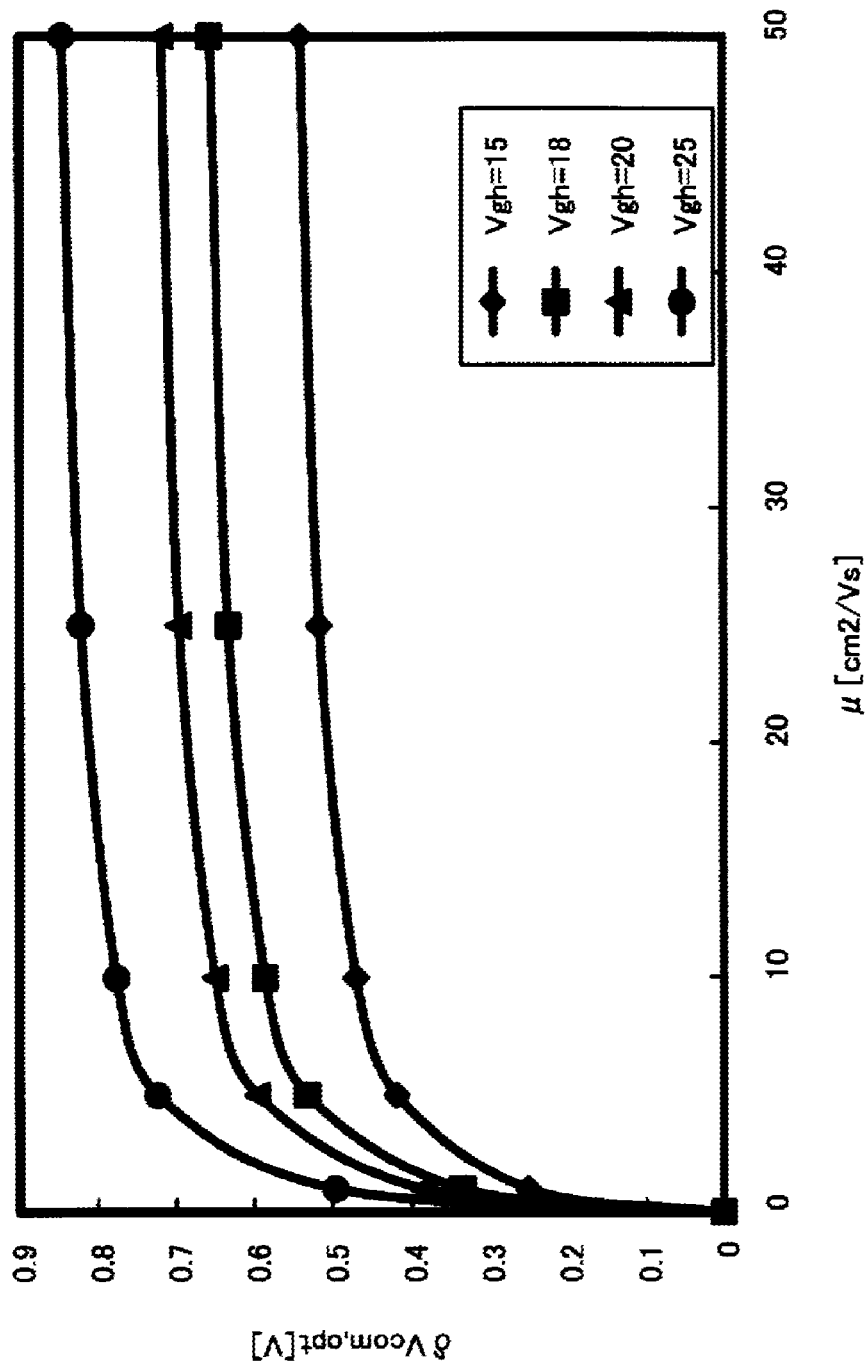
FIG. 5 A result of the simulation which indicates transition of the optimum counter electrode potential difference δVcom,opt for the increase of the field-effect mobility.
Figure 21:
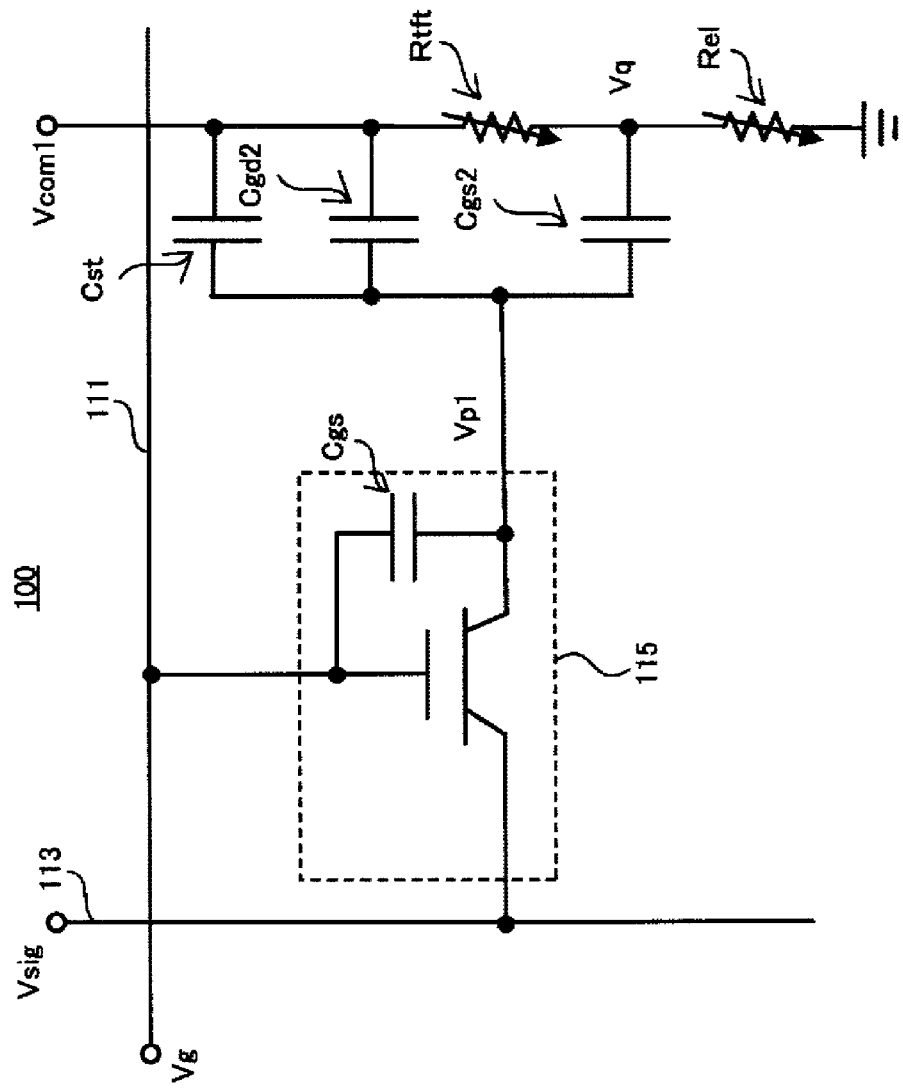
FIG. 21 A general equivalent circuit schematic of the organic EL display device to indicate that the pixel of the basic organic EL display device is equivalent to the pixel of the liquid crystal display device.
Figure 22:
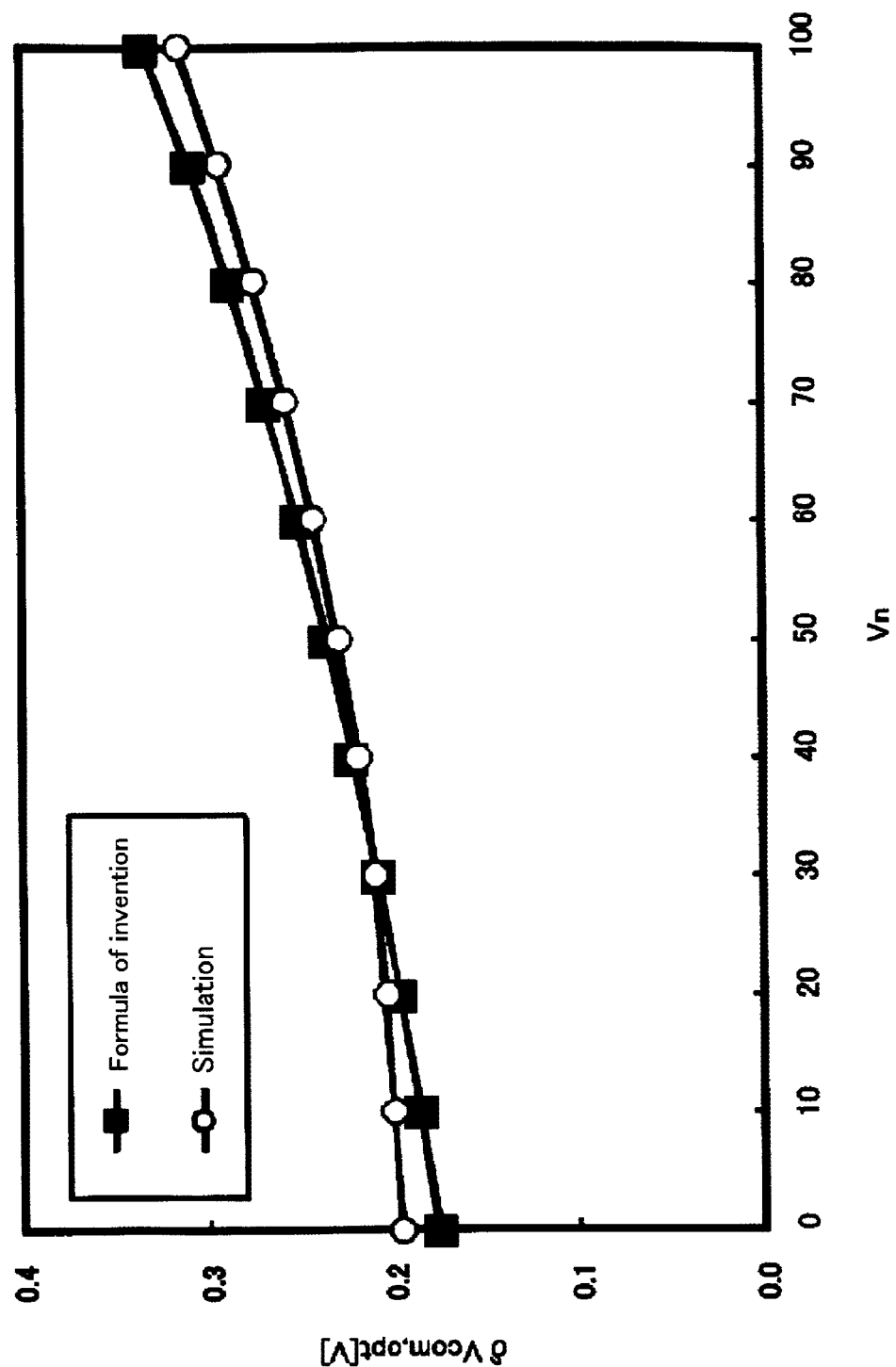
FIG. 22 A drawing which compares the results which are obtained by the relational formula of the present invention and the simulation concerning the optimum counter electrode potential difference and the gray scale voltage.
Figure 23:
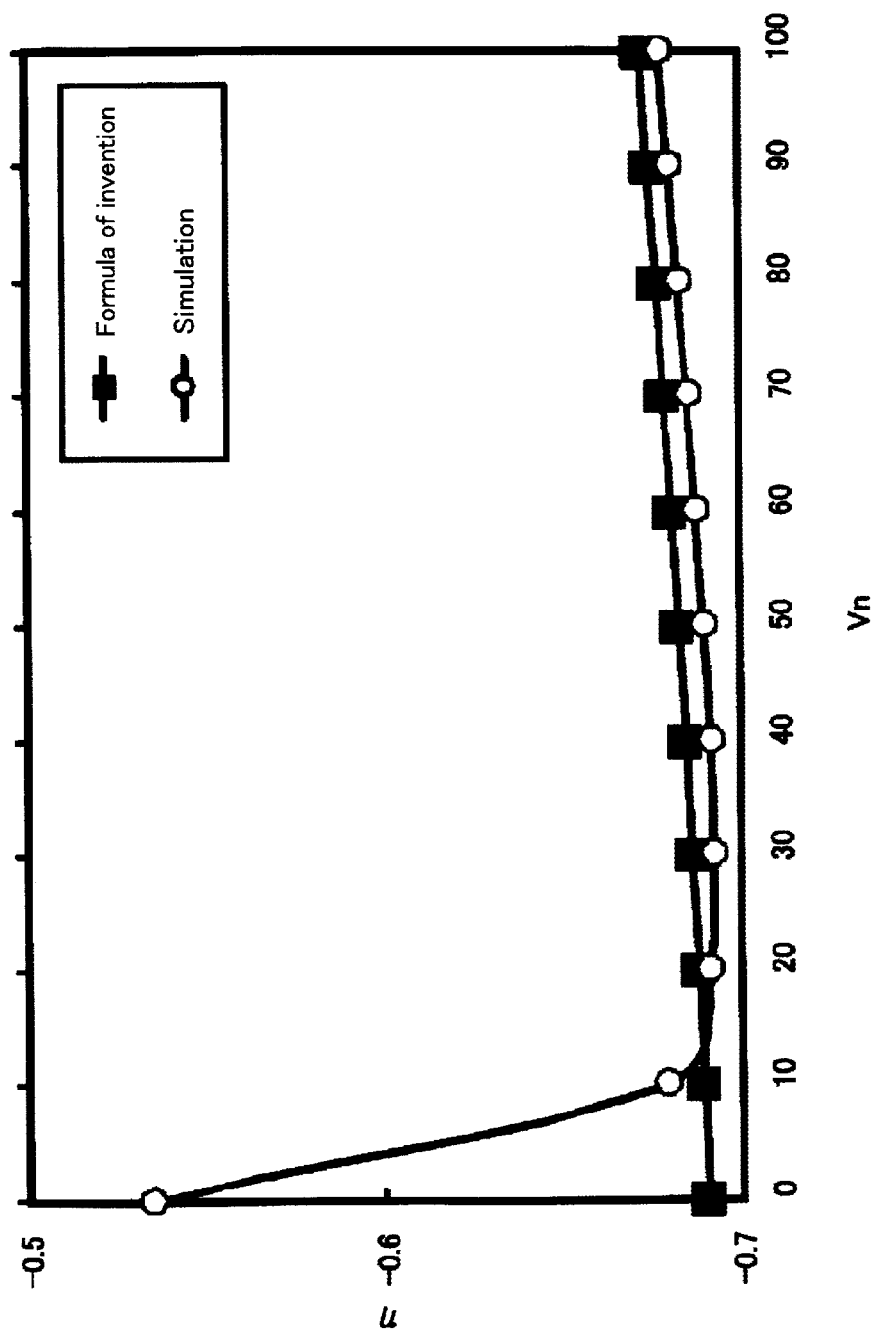
FIG. 23 A drawing which compares the results which are obtained by the relational formula of the present invention and the simulation concerning the rate of the variation amount of the optimum counter electrode potential difference for the variation amount of the punch-through voltage in each gray scale voltage.
Figure 24:
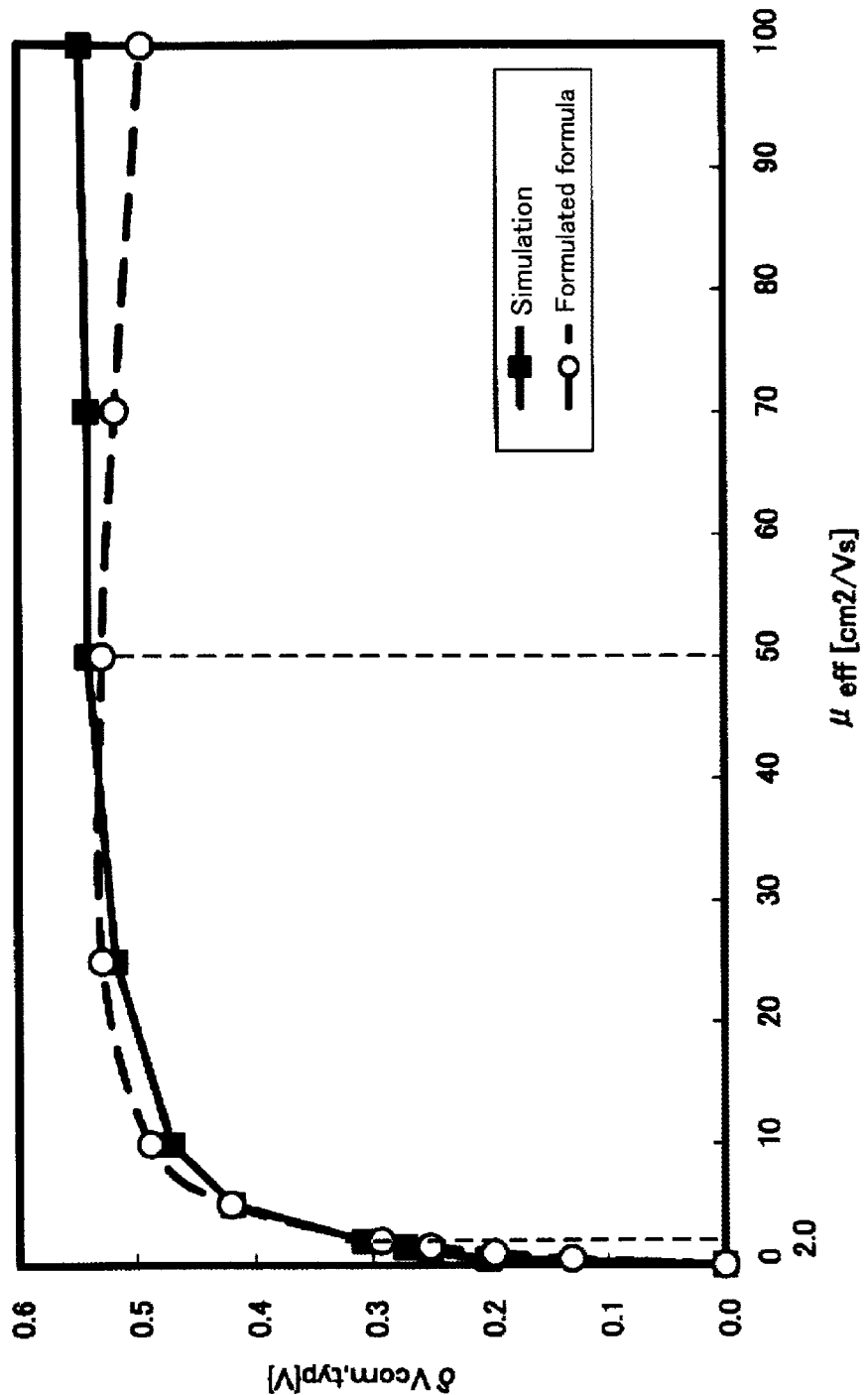
FIG. 24 A drawing which compares the results which are obtained by the relational formula of the present invention and the simulation concerning the relation between the optimum counter electrode potential difference and the field-effect mobility.
Figure 25:
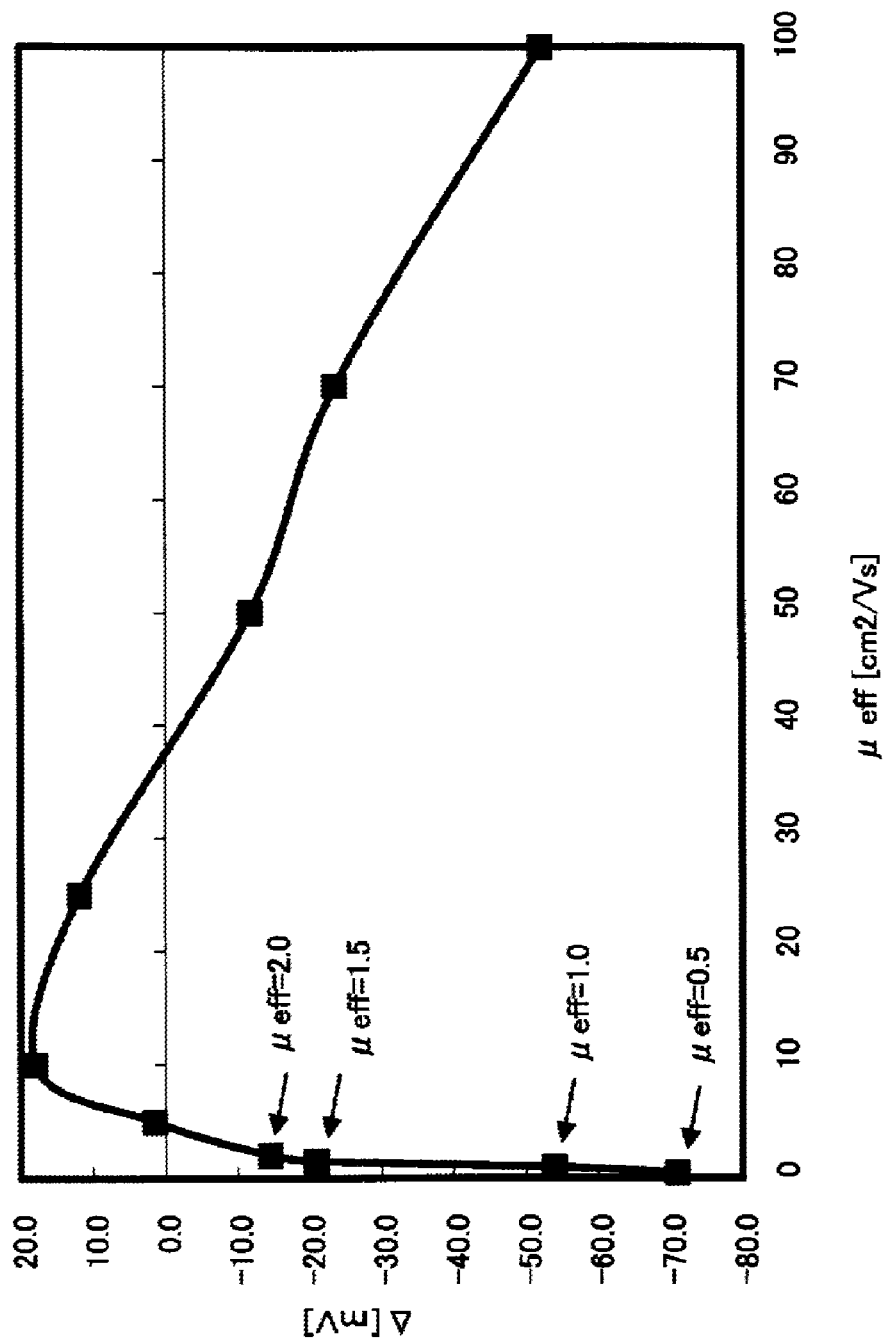
FIG. 25 A drawing which indicates the difference of the optimum counter electrode potential difference which is obtained by the relational formula of the present invention and the simulation for each field-effect mobility concerning the relation between the optimum counter electrode potential difference and the field-effect mobility.

In addition, as well as the case of the liquid crystal display device, also overcharging effect causes the in-plane ununiformity of the pixel electrode potential Vp1. FIG. 21 is the general equivalent circuit schematic converted from FIG. 20, that is, the parasitic capacitance between the gate and the drain of the first TFT 115 in FIG. 20 is omitted because the capacitance dose not influenced to the pixel electrode potential Vp1 as the gate and source are connected to the scanning signal line 111 and the display signal line 113 respectively and each of lines is applied the driving potential form its feeding electrode, moreover the channel of the second TFT 117 and the LED 119 in FIG. 20 are respectively replaced to variable resistance Rtft and Rel. When comparing FIG. 21 and FIG. 2 which indicates the equivalent circuit of the pixel of the liquid crystal display device 10, in the viewpoint of the charging to the load capacitance by the ON-state current of the first TFT 115, it is understood that the pixel of the 2T1C type organic EL display device and the pixel of the liquid crystal display device are equivalent. When standing at the similar viewpoint, in the pixels which are arranged the compensation circuit which comprises multiple TFTs and multiple capacitances, there are also pixels which are equivalent to 2T1C type when synthesizing the capacitance after replacing the TFT to the capacitance.

Besides, although it is omitted to avoid the complication of the drawing in FIG. 21, the scanning signal line 111, the display signal line 113 and the wiring of power supply of the variable resistance Rtft have resistance respectively, and each wiring intersects mutually through the insulator film because the pixel area is the matrix state, thereby the capacitance is formed. Therefore, the change of the signal potential which is applied to the feeding electrode of each wiring is propagated while distorting by each time constant. Therefore, the overcharge is generated by the punch-through in also organic EL display device, and the in-plane ununiformity of the pixel electrode potential Vp1 is generated as the overcharging effect.

When summarizing the above, as well as the case of the liquid crystal display device 10, or further, in the organic EL display device, it is important to control the pixel electrode potential Vp1 of node that the source electrode of the first TFT 115 and the gate electrode of the second TFT 117 are connected with uniform and predefined value. In order to decrease the shift of the threshold voltage Vth by the voltage stress which is the cause of the ununiformity of the pixel electrode potential Vp1, the method which incorporates the compensation circuit to the pixel attracts attention, and the various circuits are proposed.

However, because the introduction of the compensation circuit is accompanied with the complication of the pixel structure, the disadvantage such as the decrease of the yield or the limit of the output side setting of light from the LED exists, and further, the component of the compensation circuit does not satisfy the compensation condition by the process variation, and the uniformity of the pixel electrode potential Vp1 may decrease. On the other hand, the counterplan for the overcharging effect is not performed, it is feared that the ununiformity of the pixel electrode potential Vp1 increases further when using TAOS as the pixel TFT.

Under such condition, the design method by the present invention is able to attempt the restraint of the overcharging effect without accompanying with the complication of the pixel structure, and the uniformity of the pixel electrode potential Vp1 can be improved further by using the compensation circuit in combination. The case that the present invention is applied to the organic EL display device is explained as follows.

In the case of the liquid crystal display device, the improvement of the uniformity of the luminance was attempted by paying attention to the counter electrode potential Vcom for the pixel electrode potential Vp. In the case of the organic EL display device, the power supply voltage Vcom1 is given, and the ON-state current of the second TFT 117 and the injection current to the LED 119 are controlled by the pixel electrode potential Vp1. That is, the variable resistance Rtft and Rel and the source electrode potential Vq of the second TFT 117 are determined by giving the pixel electrode potential Vp1 suitably for the set power supply voltage Vcom1. Because the ON-state current of the second TFT 117 is determined by relative value of each electrode potential of the gate, the source and the drain, both attention to the variation of the power supply voltage Vcom1 and attention to the variation of the pixel electrode potential Vp1 are equivalent.

Accordingly, the pixel electrode potential Vp of the relational formula concerning the counter electrode potential Vcom which was explained about the liquid crystal display device 10 is defined by replacing the pixel electrode potential Vp1 in the organic EL display device to the pixel electrode potential Vp which was used in the liquid crystal display device 10. Here, the influence to the screen quality by the ununiformity of the pixel electrode potential Vp1 is recognized visually as such as the uneven luminance and this visibility rises in the halftone. Accordingly, the pixel electrode potential Vp which becomes 50% of the maximum display luminance is indicated as Vp,v50, and the restraint of the overcharge is attempted in Vp,v50.

In the case of the organic EL display device, because the inversion of the applied voltage polarity of the load capacitance is not accompanied, there is nothing like local optimum value of the counter electrode potential Vcom existing in the liquid crystal display device. Therefore, δVp is indicated as δVp=Vp,v50(far)−Vp,v50(near) for Vp,v50(near) which is the pixel electrode potential of the nearest pixel and Vp,v50 (far) which is the pixel electrode potential of the farthest pixel from the feeding electrode of the scanning signal line 111, and the relational formula between the δVp and the 50% punch-through voltage ΔVp,v50 is indicated as the formula (7) after the fashion of the formula (3).

$$\delta Vp = (\alpha \cdot \Delta Vp, v50 + \beta)\gamma \quad (7)$$

Here, the 50% punch-through voltage ΔVp,v50 is indicated as the next formula.

$$\Delta Vp, v50 = (Cgs1, v50 / Cload, v50) \Delta Vg$$

$$\Delta Vg = Vgh - Vgl$$

Cgs1,v50 and Cload,v50 are respectively the capacitance Cgs1 between the gate and the source of the first TFT 115 and the load capacitance for the first TFT 115 in the gate electrode potential V50 of the second TFT 117 that the screen luminance becomes 50% of the maximum luminance, and the Cload,v50 is indicated as the next formula.

$$Cload, v50 = Cgs1, v50 + Cst + Cgs2, v50 + Cgd2, v50 + Cother$$

Although the storage capacitance Cst is fixed capacitance and is constant, in the parasitic capacitance Cgs between the gate and the source and the parasitic capacitance Cgd between the gate and the drain, capacitance value changes depending on the applied voltage because of the parasitic capacitance of the TFT which has MIS structure. Therefore, although the value for V50 is indicated as Cgs2,v50 and Cgd2,v50, the change of the capacitance value for the applied voltage is small if the TFT is the ON-state, and it is able to be considered as the constant value. Cother is the sum total of the coupling capacitances which are formed between all electrodes with the same potential as the pixel electrode which are electrically connected with each other and such as wirings and electrodes which are arranged around them.

Next, when δVp for the design 50% punch-through voltage ΔVp,v50typ is indicated as δVp,typ, the variation of the δVp for the variation of the ΔVp,v50 is indicated as the formula (8) after the fashion of the formula (4).

$$\delta Vp = \eta(\Delta Vp, v50 - \Delta Vp, v50typ) + \delta Vp, typ \quad (8)$$

The η is the rate of the variation of the δVp for the variation of the 50% punch-through voltage ΔVp,v50. When the upper limit value of the allowable variation of the δVp is indicated as the ξ+ and the lower limit value is indicated as the ξ−, and when the allowable variation amount δ(ΔVp,v50)− of the direction that the 50% punch-through voltage ΔVp,v50 decreases from the designed value ΔVp,v50typ of the 50% punch-through voltage and the allowable variation amount δ(ΔVp,v50)+ of the direction that the ΔVp,v50 increases from the ΔVp,v50typ are respectively indicated as $$\delta(\Delta Vp, v50) - = \Delta Vp, v50typ - (\Delta Vp, v50 -) > 0$$

$$\delta(\Delta Vp, v50) + = (\Delta Vp, v50 +) - \Delta Vp, v50typ > 0,$$

as well as the case of the liquid crystal display device, if the design is performed such that the formula (5) and the formula (6) are satisfied, the variation of the pixel electrode potential Vp1 by the overcharge is restrained within the allowable range. The formula (5) and the formula (6) which were explained previously are indicated again next.

$$\delta(\delta Vp, v50) + \leq \{(\xi -) - (\alpha \cdot \Delta Vp, v50typ + \beta)\gamma\}/\eta \quad (5)$$

$$\delta(\delta Vp, v50) - \leq \{(\alpha \cdot \Delta Vp, v50typ + \beta)\gamma - (\xi +)\}/\eta \quad (6)$$

Here, the ξ+ and the ξ− are the values which are determined by satisfying the product specification concerning the in-plane uniformity of the luminance, and are different for each product.

By using the formulas (5) and (6), even if the active matrix display device has the transistor that the field-effect mobility is 1 cm2/Vs or more and 70 cm2/Vs or less, the design can be performed such that it is possible to manufacture with the alignment accuracy of the photo resist in the existing manufacturing process. Concretely, the verification is performed whether the formulas (5) and (6) are satisfied by the ΔVp, v50typ which is set first, and if it is not satisfied, the convergence is performed to satisfy the formulas while changing any of the gate electrode potential Vgh of the ON-state TFT, the gate electrode potential Vgl of the OFF-state TFT, the parasitic capacitance Cgs and the load capacitance Cload which are the control parameter of the ΔVp,v50typ or the combination of multiple elements within them. In that case, the gate electrode potential Vgl of the OFF-state TFT is fixed because of the process parameter, and because it is impossible to change the gate electrode potential Vgh of the ON-state TFT precisely, it is preferable to change the parasitic capacitance Cgs and the load capacitance Cload.

Currently, many compensation drive method are proposed for the organic EL display device, and the kinds such as the case which uses the compensation circuit in combination to the pixel or the case which does not use the compensation circuit in combination to the pixel are various. Most of them are possible to increase each absolute value of the allowable upper limit value ξ+ and the lower limit value ξ− for the in-plane differential δVp of the pixel electrode potential Vp by adding correction potential for correcting the uniformity of the display screen luminance to display signal potential, and the drive methods of this type accompany the rise of the cost in any case. The cost rise increases because correction potential generation circuit becomes complex as the ununiformity of the pixel electrode potential Vp becomes large and as the uniformity of the screen luminance as the product specification becomes high. It is necessary to improve the uniformity of the pixel electrode potential Vp as much as possible by the improving technology of the design or the manufacturing process to decrease the cost rise. In this case, even in the organic EL display device which is performed the compensation drive which adds the potential for correcting the uniformity of the screen luminance to the display signal potential despite using or not using the compensation circuit in combination, by satisfying the formulas (5) and (6) without performing the compensation drive, or by setting the absolute value of the η in the formulas (5) and (6) at 2 or less, the uniformity of the pixel electrode potential Vp can be improved. Therefore, the application of the present invention is certainly possible.

Further, as explained by using FIG. 21, the pixel of the organic EL display device is equivalent to the pixel of the liquid crystal display device in the point of performing the charge of the load capacitance by the first TFT, and the compensation drive which adds the correction potential for correcting the uniformity of the display screen luminance to the display signal potential is also applicable for the liquid crystal display device in principle. Therefore, even in the liquid crystal display device which is performed the compensation drive which adds the correction potential for correcting the uniformity of the display screen luminance to the display signal potential, so as to satisfy the formulas (5) and (6) without performing the compensation drive, or by setting the absolute value of the η at 2 or less, the uniformity of the pixel electrode potential Vp can be improved, and the restraint of the cost rise by the compensation drive can be attempted. Therefore, the application of the present invention is certainly possible.

Furthermore, even in the liquid crystal display device of the structure which controls the pixel electrode and the counter electrode respectively for each pixel independently on the same substrate, because the cost rise or the decrease of the yield is caused by such as the high breakdown voltage or the complication of the circuit which generates the counter electrode potential when the ununiformity of the pixel electrode potential Vp becomes large, it is preferable that the uniformity of the pixel electrode potential Vp is high. Therefore, even in the liquid crystal display device of the structure which controls the pixel electrode and the counter electrode respectively for each pixel independently on the same substrate, so as to satisfy the formulas (5) and (6) with the state where the same potential signal is fed to all counter electrodes, or by setting the absolute value of the η at 2 or less, the uniformity of the pixel electrode potential Vp can be improved. Therefore, the application of the present invention is certainly possible.

And, until now, although the present invention has been explained by the specific embodiments which were indicated in the drawings, the present invention is not limited in the embodiments which were indicated in the drawings, and as long as the effect of the present invention is shown, even in any structures which are known previously, the adoption of the present invention is certainly possible. Further, the formulas which give α, β, γ and η in the formula (3), the formula (4), the formula (7) and the formula (8) are not limited to the embodiments which are indicated in this specification, and as long as the effect of the present invention is shown, the adoption of the present invention is certainly possible even in the different other embodiments.

EXPLANATION OF THE NUMERALS 11a-11c scanning signal line
13a-13c display signal line
15a thin film transistor (TFT)
17a liquid crystal layer
19a pixel electrode
21a counter electrode
25a auxiliary capacitance line
Clc liquid crystal capacitance
Cs auxiliary capacitance
Cgs parasitic capacitance
Cload load capacitance
Cload,max maximum load capacitance
Vp pixel electrode potential
ΔVp punch-through voltage (decrease amount of pixel electrode potential)
ΔVp,v50 50% punch-through voltage
ΔVp,v50typ design 50% punch-through voltage
Vcom counter electrode potential
Vcom1 power supply voltage
Vcom,opt optimum counter electrode potential
δVcom counter electrode potential difference
δVcom,opt optimum counter electrode potential difference
δVcom,typ design counter electrode potential difference
Vcs auxiliary capacitance electrode potential
Vg scanning signal line potential
ΔVg variation amount of scanning signal line potential
Vs source electrode potential
Vd drain electrode potential
Vds voltage between source and drain
Vgs voltage between gate and source
Vgh gate electrode potential of ON-state TFT
Vgl gate electrode potential of OFF-state TFT
Vsig display signal line potential

The invention claimed is:

1. An active matrix liquid crystal display device, comprising:
   in each pixel area which is arranged by multiple scanning signal lines and multiple display signal lines each other through an insulating film, and surrounded by said scanning signal line and said display signal line, and arranged with matrix state,
   transistor which has source electrode, gate electrode which is connected to said scanning signal line and drain electrode which is connected to said display signal line and is 1 cm2/Vs or more and 70 cm2/Vs or less in electric field-effect mobility of semiconductor layer,
   pixel electrode which is connected to said source electrode,
   auxiliary capacitance line which is arranged almost in parallel with said scanning signal line,
   first substrate which includes auxiliary capacitance which is formed in crossover area between any of said pixel electrode, extending portion of said pixel electrode, or electrode which is electrically connected with said pixel electrode through the insulating film and said auxiliary capacitance line, or in crossover area in said scanning signal line of adjacent upper or lower pixel,
   second substrate which is arranged for said first substrate through liquid crystal layer, and
   counter electrode which is arranged on said first substrate or said second substrate so as to face said pixel electrode electrically through said liquid crystal layer, wherein, punch-through voltage $\Delta Vp$ is indicated as a formula (1A) when potential of said counter electrode is indicated as Vcom, gate electrode potential that said transistor becomes ON-state and OFF-state is respectively indicated as Vgh and Vgl, and capacitance between gate and source and load capacitance of said transistor are respectively indicated as Cgs and Cload, $$\Delta Vp = (Cgs/Cload)(Vgh-Vgl) \quad (1A)$$

$\delta$Vcom,typ which is designed value of $\delta$Vcom,opt is indicated as a formula (1B) when punch-through voltage for Vn is indicated as $\Delta Vp$,vn in the case that liquid crystal applied voltage that screen luminance becomes n % of maximum luminance is indicated as Vn, designed value of $\Delta Vp$,vn is indicated as $\Delta Vp$,vntyp, Vcom that flicker in Vn becomes the minimum in arbitrary position on display screen is indicated as Vcom,opt, value which subtracts Vcom,opt of nearest pixel from Vcom,opt of farthest pixel from feeding electrode of said scanning signal line is indicated as $\delta$Vcom,opt, and $\alpha$, $\beta$, $\gamma$ are respectively coefficients, $$\delta Vcom,typ = (\alpha \cdot \Delta Vp,vntyp + \beta)\gamma \quad (1B)$$

a formula (1c) and a formula (1D) are satisfied when upper limit value and lower limit value of allowable variation range of $\delta$Vcom,opt are respectively indicated as $\xi+$ and $\xi-$, $\Delta Vp$,vn for $\xi+$ and $\xi-$ are respectively indicated as $\Delta Vp$,vn− and $\Delta Vp$,vn+, and rate of variation amount of $\delta$Vcom,opt for variation amount of $\Delta Vp$,vn is indicated as $\eta$, $$(\Delta Vp,vn+) - \Delta Vp,vntyp \leq \{(\xi-) - (\alpha \cdot \Delta Vp,vntyp+\beta)\gamma\}/\eta \quad (1C)$$

$$\Delta Vp,vntyp - (\Delta Vp,vn-) \leq \{(\alpha \cdot \Delta Vp,vntyp+\beta)\gamma - (\xi+)\}/\eta \quad (1D).$$

2. The liquid crystal display device according to claim 1, wherein, said n is 50, said Vn is V50, and said $\Delta Vp$,vntyp is $\Delta Vp$,v50typ.

3. The liquid crystal display device according to claim 1 or claim 2, wherein, field-effect mobility of said semiconductor layer is 1.5 cm2/Vs or more and 50 cm2/Vs or less.

4. The liquid crystal display device according to claim 1, wherein, said semiconductor layer is amorphous metal oxide.

5. The liquid crystal display device according to any of claim 1 or claim 4, wherein, said semiconductor layer is organic matter.

6. The liquid crystal display device according to claim 1, wherein, absolute value of said $\eta$ is 2 or less.

7. The liquid crystal display device according to any of claim 1 or claim 6, wherein, in the case that said liquid crystal display device does not perform punch-through compensation drive, when threshold voltage of said transistor is indicated as Vth, units of Vth, Vgh, Vgl and $\Delta Vp$,vntyp are indicated as [V], unit of field-effect mobility $\mu$eff is indicated as [cm2/Vs], unit of time constant $\tau$g of said scanning signal line is indicated as [$\mu$s], $\kappa(\tau g)$ indicates that $\kappa$ is function of $\tau g$, [^] indicates exponential symbol, and log e indicates natural logarithm, said $\alpha$, $\beta$, $\gamma$ and $\eta$ are $$\alpha = A \cdot \exp(-1/(B \cdot \mu eff)) + 0.2$$

$$A = \{0.58\exp(-1/Vgh) - 0.591\}Vth + \{7.924\exp(-1/Vgh) - 7.23\}$$

$$B = Ba\{\exp(Bb(Vgh-14)) - 1\} + Bc$$

$$Ba = 15\exp(-0.455Vth)$$

$$Bb = 0.00667Vth + 0.01$$

$$Bc = 1.2\exp(-0.35Vth) - 0.47$$

$$\beta = C \cdot \exp(-1/(D \cdot \mu eff)) - 0.19$$

$$C = -0.002Vth + 0.337\exp(-1/Vgh) - 0.148$$

$$D = \{0.06\exp(-Vgh+14) + 0.00042\}\exp(Vth) - 0.0051Vgh + 0.362$$

$$\gamma = \{E \cdot \exp(-F/\tau g) + G \cdot \tau g\}vc$$

$$E = \{-0.00032\mu eff + 0.01(\exp(-1.17/Vth)+1)\}Vgh + 0.008\mu eff + 0.722\exp(-0.101Vth)$$

$$F = \{2.71\exp(-0.0272\mu eff) + 0.597\exp(-1.37/Vth)\}/Vgh + (0.0667Vth + 0.3)\exp(-0.268\mu eff)$$

$$G = \{-0.0479\mu eff + 1.4\exp(-1.35/Vth) + 1.75\}/Vgh + 0.0012\mu eff + 0.0701\exp(-0.301Vth) - 0.1$$

$$vc = 0.620\exp(0.0353Vgh)(-Vgl)\char`^(-0.0203Vgh+0.275)$$

$$\eta = \eta 0 \cdot \gamma 0$$

$$\eta 0 = P \cdot \exp(-1/\Delta Vp,vntyp) + Q$$

$$P = \{0.115\exp(-0.164Vgh) \cdot \exp(Vth) - 0.0061Vgh + 0.460\}\mu eff\char`^(0.559)$$

$$Q = \exp(-1/(\mu eff + Qa)) + Qb$$

$$Qa = 0.128Vgh - 0.005\exp(0.2Vth + 4.7) + 0.35$$

$$Qb = (0.0008Vth + 0.0183)Vgh - 0.0554Vth - 1.88$$

$$\gamma 0 = ve \cdot \kappa(\tau g)/\kappa(\tau g = 2.5)$$

$$\kappa(\tau g) = \exp(-R/\tau g) + S \cdot \tau g + T$$

$$R = Ra1 \cdot \exp(Ra2 \cdot \mu eff) \cdot \exp(-1/(Vgh-10)) + 0.5\exp(-Rc2/\mu eff) + Rc3$$

$$Ra1 = 0.214\exp(-1.37/Vth) + 0.351$$

$Ra2=0.153\exp(-1.37/Vth)-0.216$ $Rc2=1.29\exp(0.388Vth)$ $Rc3=0.544\exp(0.0147Vth)-1$ $S=\{0.000376\log e(\mu eff)-0.0000667Vth-0.00123\}Vgh+Sb$ $Sb=(0.00237Vth+0.0345)\exp(Sb2\cdot\mu eff)$ $Sb2=0.00258\exp(0.388Vth)-0.05$ $T=Ta1\cdot Vgh\cdot\mu eff^{Ta2}+Tb1\cdot\log e(\mu eff)+Tb2$ $Ta1=0.007\exp(-1.6/Vth)+0.0258$ $Ta2=0.0223\exp(0.265Vth)-0.1$ $Tb1=-0.0001Vth+0.0597$ $Tb2=0.847\exp(-0.0966Vth)-3.00$ $ve=(-0.0242Vgh+1.17)(-Vgl)^{(0.0006Vgh^{\wedge}1.96)}$.

8. The liquid crystal display device according to any of claim 1 or claim 6, wherein, in the case that said liquid crystal display device performs punch-through compensation drive, when threshold voltage of said transistor is indicated as Vth, units of Vth, Vgh, Vgl and ΔVp,vntyp are indicated as [V], unit of field-effect mobility μeff is indicated as [cm2/Vs], unit of scanning signal line time constant τg is indicated as [μs], κ(τg) indicates that κ is function of τg, [^] indicates exponential symbol, and log e indicates natural logarithm, said α, β and η are $\alpha=A\cdot\mu eff+B$ $A=0.00001[\{4\exp(-0.462Vth)-15\}Vgh+20.2\exp(0.0361Vth)]$ $B=0.0001\{(4.33Vth+25.2)Vgh-203Vth+852\}$ $\beta=C\cdot\log e(\mu eff)+D$ $C=0.0001(16.2Vgh-0.6Vth-108)$ $D=-(0.0118Vth+0.105)\log e(Vgh)+0.0374Vth+0.0625$ $\eta=\eta 0\cdot\gamma 0$ $\eta 0=P\cdot\exp(\Delta Vp,vntyp)+Q$ $P=-Pa1\cdot Vgh^{(Pa2)}\cdot\mu eff^{(Pb1\cdot Vgh+Pb2)}$ $Pa1=4\exp(1.12Vth)+109$ $Pa2=-5\exp(-1/(0.0916Vth))-2.57$ $Pb1=0.00007Vth+0.0096$ $Pb2=-0.0146Vth-0.204$ $Q=-\{(0.0001Vth-0.0123)Vgh+0.0238Vth+1.08\}\mu eff^{Qb}$ $Qb=(4.46Vth+43.0)Vgh^{(-0.0289Vth-2.16)}+0.0118Vth-0.185$ $\gamma 0=ve\cdot\kappa(\tau g)/\kappa(\tau g=2.5)$ $\kappa(\tau g)=\exp(-R/\tau g)+S\tau g+T$ $R=Ra1\cdot\exp(Ra2\cdot\mu eff)\cdot\exp(-1/(Vgh-10))+0.5\exp(-Rc2/\mu eff)+Rc3$ $Ra1=0.214\exp(-1.37/Vth)+0.351$ $Ra2=0.153\exp(-1.37/Vth)-0.216$ $Rc2=1.29\exp(0.388Vth)$ $Rc3=0.544\exp(0.0147Vth)-1$ $S=\{0.000376\log e(\mu eff)-0.0000667Vth-0.00123\}Vgh+Sb$ $Sb=(0.00237Vth+0.0345)\exp(Sb2\cdot\mu eff)$ $Sb2=0.00258\exp(0.388Vth)-0.05$ $T=Ta1\cdot Vgh\cdot\mu eff^{Ta2}+Tb1\cdot\log e(\mu eff)+Tb2$ $Ta1=0.007\exp(-1.6/Vth)+0.0258$ $Ta2=0.0223\exp(0.265Vth)-0.1$ $Tb1=-0.0001Vth+0.0597$ $Tb2=0.847\exp(-0.0966Vth)-3.00$ $ve=(-0.0242Vgh+1.17)(-Vgl)^{(0.0006Vgh^{\wedge}1.96)}$.

9. An active matrix organic EL display device, wherein, in each pixel area which is arranged by multiple scanning signal lines and multiple display signal lines each other through insulating film on insulating substrate, and surrounded by said scanning signal line and said display signal line, and arranged with matrix state, first transistor that field-effect mobility of semiconductor layer is 1 cm2/Vs or more and 70 cm2/Vs or less, second transistor, storage capacitance, power source wiring and LED element which comprises organic matter are arranged, gate electrode and drain electrode of said first transistor are respectively connected to said scanning signal line and said display signal line, source electrode of said first transistor is connected to one electrode of said storage capacitance and gate electrode of said second transistor, drain electrode of said second transistor and other electrode of said storage capacitance are connected to said power source wiring, and source electrode of said second transistor is connected to said LED element, wherein, punch-through voltage ΔVp is indicated as a formula (2A) when potential of said power source wiring is indicated as Vcom, potential of said scanning signal line that said first transistor becomes ON-state and OFF-state is respectively indicated as Vgh and Vgl, and capacitance between gate and source and load capacitance of said first transistor are respectively indicated as Cgs and Cload, $\Delta Vp=(Cgs/Cload)(Vgh-Vgl)$     (2A)

δVp,typ which is designed value of δVp is indicated as a formula (2B) when gate electrode potential of said second transistor in the case that screen luminance becomes n % of maximum luminance is indicated as Vp,vn, punch-through voltage for Vp,vn is indicated as ΔVp,vn, designed value of ΔVp,vn is indicated as ΔVp,vntyp, value which subtracts Vp,vn of nearest pixel from Vp,vn of farthest pixel from feeding electrode of said scanning signal line is indicated as δVp, and α, β, γ are respectively constants, $$\delta Vp, typ = (\alpha \cdot \Delta Vp, vntyp + \beta)\gamma \quad (2B),$$

and a formula (2c) and a formula (2D) are satisfied when upper limit value and lower limit value of allowable variation range of δVp are respectively indicated as ξ+ and ξ−, ΔVp,vn for ξ+ and ξ− are respectively indicated as ΔVp,vn− and ΔVp,vn+, and rate of variation amount of δVp for variation amount of ΔVp,vn is indicated as η, $$(\Delta Vp, vn+) - \Delta Vp, vntyp \leq \{(\xi-) - (\alpha \cdot \Delta Vp, vntyp + \beta)\gamma\}/\eta \quad (2C)$$

$$\Delta Vp, vntyp - (\Delta Vp, vn-) \leq \{(\alpha \cdot \Delta Vp, vntyp + \beta)\gamma - (\xi+)\}/\eta \quad (2D).$$

10. The organic EL display device, according to claim 9, wherein, said n is 50, said Vn is V50, and said ΔVp,vntyp is ΔVp,v50typ.

11. The organic EL display device, according to claim 9 or claim 10, wherein, field-effect mobility of semiconductor layer of said first transistor is 1.5 cm2/Vs or more and 50 cm2/Vs or less.

12. The organic EL display device, according to claim 9, wherein, semiconductor layer of said first transistor is amorphous metal oxide.

13. The organic EL display device, according to claim 9, wherein, semiconductor layer of said first transistor is organic matter.

14. The organic EL display device, according to any of claim 9 or claim 13, wherein, absolute value of said η is 2 or less.

15. The organic EL display device according to any of claim 9 or claim 13, wherein, in the case that said organic EL display device does not perform punch-through compensation drive, when threshold voltage of said first transistor is indicated as Vth, units of Vth, Vgh, Vgl and ΔVp,vntyp are indicated as [V], unit of field-effect mobility μeff is indicated as [cm2/Vs], unit of time constant τg of said scanning signal line is indicated as [μs], κ(τg) indicates that κ is function of τg, [^] indicates exponential symbol, and log e indicates natural logarithm, said α, β, γ and η are $$\alpha = A \cdot \exp(-1/(B \cdot \mu eff)) + 0.2$$

$$A = \{0.58\exp(-1/Vgh) - 0.591\}Vth + \{7.924\exp(-1/Vgh) - 7.23\}$$

$$B = Ba\{\exp(Bb(Vgh-14)) - 1\} + Bc$$

$$Ba = 15\exp(-0.455Vth)$$

$$Bb = 0.00667Vth + 0.01$$

$$Bc = 1.2\exp(-0.35Vth) - 0.47$$

$$\beta = C \cdot \exp(-1/(D \cdot \mu eff)) - 0.19$$

$$C = -0.002Vth + 0.337\exp(-1/Vgh) - 0.148$$

$$D = \{0.06\exp(-Vgh+14) + 0.00042\}\exp(Vth) - 0.0051Vgh + 0.362$$

$$\gamma = \{E \cdot \exp(-F/\tau g) + G \cdot \tau g\}vc$$

$$E = \{-0.00032\mu eff + 0.01(\exp(-1.17/Vth) + 1)\}Vgh + 0.008\mu eff + 0.722\exp(-0.101Vth)$$

$$F = \{2.71\exp(-0.0272\mu eff) + 0.597\exp(-1.37/Vth)\}Vgh (0.0667Vth + 0.3)\exp(-0.268\mu eff)$$

$$G = \{-0.0479\mu eff + 1.4\exp(-1.35/Vth) + 1.75\}/Vgh + 0.0012\mu eff + 0.0701\exp(-0.301Vth) - 0.1$$

$$vc = 0.620\exp(0.0353Vgh)(-Vgl)^{\wedge}(-0.0203Vgh + 0.275)$$

$$\eta = \eta 0 \cdot \gamma 0$$

$$\eta 0 = P \cdot \exp(-1/\Delta Vp, vntyp) + Q$$

$$P = \{0.115\exp(-0.164Vgh) \cdot \exp(Vth) - 0.00610Vgh + 0.460\}\mu eff^{\wedge}(-0.559)$$

$$Q = \exp(-1/(\mu eff + Qa)) + Qb$$

$$Qa = 0.128Vgh - 0.005\exp(0.2Vth + 4.7) + 0.35$$

$$Qb = (0.0008Vth + 0.0183)Vgh - 0.0554Vth - 1.88$$

$$\gamma 0 = ve \cdot \kappa(\tau g)/\kappa(\tau g = 2.5)$$

$$\kappa(\tau g) = \exp(-R/\tau g) + S \cdot \tau g + T$$

$$R = Ra1 \cdot \exp(Ra2 \cdot \mu eff) \cdot \exp(-1/(Vgh - 10)) + 0.5\exp(-Rc2/\mu eff) + Rc3$$

$$Ra1 = 0.214\exp(-1.37/Vth) + 0.351$$

$$Ra2 = 0.153\exp(-1.37/Vth) - 0.216$$

$$Rc2 = 1.29\exp(0.388Vth)$$

$$Rc3 = 0.544\exp(0.0147Vth) - 1$$

$$S = \{0.000376 \log e(\mu eff) - 0.0000667Vth - 0.00123\}Vgh + Sb$$

$$Sb = (0.00237Vth + 0.0345)\exp(Sb2 \cdot \mu eff)$$

$$Sb2 = 0.00258\exp(0.388Vth) - 0.05$$

$$T = Ta1 \cdot Vgh \cdot \mu eff^{\wedge}Ta2 + Tb1 \cdot \log e(\mu eff) + Tb2$$

$$Ta1 = 0.007\exp(-1.6/Vth) + 0.0258$$

$$Ta2 = 0.0223\exp(0.265Vth) - 0.1$$

$$Tb1 = -0.0001Vth + 0.0597$$

$$Tb2 = 0.847\exp(-0.0966Vth) - 3.00$$

$$ve = (-0.0242Vgh + 1.17)(-Vgl)^{\wedge}(0.0006Vgh^{\wedge}1.96).$$

16. The organic EL display device according to any of claim 9 or claim 13, wherein, in the case that said organic EL display device performs punch-through compensation drive, when threshold voltage of said first transistor is indicated as Vth, units of Vth, Vgh, Vgl and ΔVp,vntyp are indicated as [V], unit of field-effect mobility μeff is indicated as [cm2/Vs], unit of time constant τg of said scanning signal line is indicated as [μs], κ(τg) indicates that κ is function of τg, [^] indicates exponential symbol, and log e indicates natural logarithm, said α, β, η are $$\alpha = A \cdot \mu eff + B$$

$$A = 0.00001[\{4\exp(-0.462Vth) - 15\}Vgh + 20.2\exp(0.0361Vth)]$$

$$B = 0.0001\{(4.33Vth + 25.2)Vgh - 203Vth + 852\}$$

$$\beta = C \cdot \log e(\mu eff) + D$$

$$C = 0.0001(16.2Vgh - 0.6Vth - 108)$$

$D=-(0.0118Vth+0.105)\log e(Vgh)+0.0374Vth+0.0625$ $\eta=\eta 0 \cdot \gamma 0$ $\eta 0 = P \cdot \exp(\Delta Vp, vntyp)+Q$ $P=-Pa1 \cdot Vgh\hat{\ }(Pa2) \cdot \mu eff\hat{\ }(Pb1 \cdot Vgh+Pb2)$ $Pa1=4\exp(1.12Vth)+109$ $Pa2=-5\exp(-1/(0.0916Vth))-2.57$ $Pb1=0.00007Vth+0.0096$ $Pb2=-0.0146Vth-0.204$ $Q=-\{(0.0001Vth-0.0123)Vgh+0.0238Vth+1.08\}\mu eff\hat{\ }Qb$ $Qb=(4.46Vth+43.0)Vgh\hat{\ }(-0.0289Vth-2.16)+0.0118Vth-0.185$ $\gamma 0 = ve \cdot \kappa(\tau g)/\kappa(\tau g=2.5)$ $\kappa(\tau g)=\exp(-R/\tau g)+S\tau g+T$ $R=Ra1 \cdot \exp(Ra2 \cdot \mu eff) \cdot \exp(-1/(Vgh-10))+0.5\exp(-Rc2/\mu eff)+Rc3$ $Ra1=0.214\exp(-1.37/Vth)+0.351$ $Ra2=0.153\exp(-1.37/Vth)-0.216$ $Rc2=1.29\exp(0.388Vth)$ $Rc3=0.544\exp(0.0147Vth)-1$ $S=\{0.000376 \log e(\mu eff)-0.0000667Vth-0.00123\}Vgh+Sb$ $Sb=(0.00237Vth+0.0345)\exp(Sb2 \cdot \mu eff)$ $Sb2=0.00258\exp(0.388Vth)-0.05$ $T=Ta1 \cdot Vgh \cdot \mu eff\hat{\ }Ta2+Tb1 \cdot \log e(\mu eff)+Tb2$ $Ta1=0.007\exp(-1.6/Vth)+0.0258$ $Ta2=0.0223\exp(0.265Vth)-0.1$ $Tb1=-0.0001Vth+0.0597$ $Tb2=0.847\exp(-0.0966Vth)-3.00$ $ve=(-0.0242Vgh+1.17)(-Vgl)\hat{\ }(0.0006Vgh\hat{\ }1.96)$.

17. A method for manufacturing an active matrix liquid crystal display device comprising, in each pixel area which is arranged by multiple scanning signal lines and multiple display signal lines each other through insulating film, and surrounded by said scanning signal line and said display signal line, and arranged with matrix state, transistor which has source electrode, gate electrode which is connected to said scanning signal line and drain electrode which is connected to said display signal line and is 1 cm2/Vs or more and 70 cm2/Vs or less in electric field-effect mobility of semiconductor layer, pixel electrode which is connected to said source electrode, auxiliary capacitance line which is arranged almost in parallel with said scanning signal line, first substrate which includes auxiliary capacitance which is formed in crossover area between any of said pixel electrode, extending portion of said pixel electrode, or electrode which is electrically connected to said pixel electrode through insulating film and said auxiliary capacitance line, or in crossover area in said scanning signal line of adjacent upper or lower pixel, second substrate which is arranged for said first substrate through liquid crystal layer, and counter electrode which is arranged on said first substrate or said second substrate so as to face said pixel electrode electrically through said liquid crystal layer, comprising steps of:

determining punch-through voltage $\Delta$Vp by using a formula (1A) when potential of said counter electrode is indicated as Vcom, gate electrode potential that said transistor becomes ON-state and OFF-state is respectively indicated as Vgh and Vgl, and capacitance between gate and source and load capacitance of said transistor are respectively indicated as Cgs and Cload, determining $\delta$Vcom,typ which is designed value of $\delta$Vcom,opt by using a formula (1B) when punch-through voltage for Vn is indicated as $\Delta$Vp,vn in the case that liquid crystal applied voltage that screen luminance becomes n % of maximum luminance is indicated as Vn, designed value of $\Delta$Vp,vn is indicated as $\Delta$Vp,vntyp, Vcom that flicker in Vn becomes the minimum in arbitrary position on display screen is indicated as Vcom,opt, value which subtracts Vcom,opt of nearest pixel from Vcom,opt of farthest pixel from feeding electrode of said scanning signal line is indicated as $\delta$Vcom,opt, and $\alpha$, $\beta$, $\gamma$ are respectively coefficients, deciding whether a formula (1C) and a formula (1D) are satisfied when upper limit value and lower limit value of allowable variation range of $\delta$Vcom,opt are respectively indicated as $\xi+$ and $\xi-$, $\Delta$Vp,vn for $\xi+$ and $\xi-$ are respectively indicated as $\Delta$Vp,vn$-$ and $\Delta$Vp,vn$+$, and rate of variation amount of $\delta$Vcom,opt for variation amount of $\Delta$Vp,vn is indicated as $\eta$, deciding again whether the formula (1C) and the formula (1D) are satisfied by changing value of each parameter when a formula (1C) and a formula (1D) are not satisfied, wherein, the formula (1A), the formula (1B), the formula (1C) and the formula (1D) are $$\Delta Vp=(Cgs/Cload)(Vgh-Vgl) \quad (1A)$$

$$\delta Vcom,typ=(\alpha \cdot \Delta Vp,vntyp+\beta)\gamma \quad (1B)$$

$$(\Delta Vp,vn+)-(\Delta Vp,vntyp \leq \{(\xi-)-(\alpha \cdot \Delta Vp,vntyp+\beta)\gamma\}/\eta \quad (1C)$$

$$\Delta Vp,vntyp-(\Delta Vp,vn-) \leq \{(\alpha \cdot \Delta Vp,vntyp+\beta)\gamma-(\xi+)\}/\eta \quad (1D).$$

18. The method for manufacturing according to claim 17, wherein, said step of deciding again whether a formula (1C) and a formula (1D) are satisfied comprises a step of changing values of Cgs and Cload.

19. A method for manufacturing an active matrix organic EL display device, wherein, in each pixel area which is arranged by multiple scanning signal lines and multiple display signal lines each other through insulating film on insulating substrate, and surrounded by said scanning signal line and said display signal line, and arranged with matrix state, first transistor that field-effect mobility is 1 cm2/Vs or more and 70 cm2/Vs or less, second transistor, storage capacitance, power source wiring and LED element which comprises organic matter are arranged, gate electrode and drain electrode of said first transistor are respectively connected to said scanning signal line and said display signal line, source electrode of said first transistor is connected to one electrode of said storage capacitance and gate electrode of said second transistor, drain electrode of said second transistor and other electrode of said storage capacitance are connected to said power source wiring, and source electrode of said second transistor is connected to said LED element, comprising steps of:

determining punch-through voltage $\Delta Vp$ by a formula (2A) when potential of said power source wiring is indicated as Vcom, potential of said scanning signal line that said first transistor becomes ON-state and OFF-state is respectively indicated as Vgh and Vgl, and capacitance between gate and source and load capacitance of said first transistor are respectively indicated as Cgs and Cload, determining $\delta Vp,typ$ which is designed value of $\delta Vp$ by a formula (2B) when gate electrode potential of said second transistor in the case that screen luminance becomes n % of maximum luminance is indicated as Vp,vn, punch-through voltage for Vp,vn is indicated as $\Delta Vp,vn$, designed value of $\Delta Vp,vn$ is indicated as $\Delta Vp,vntyp$, value which subtracts Vp,vn of nearest pixel from Vp,vn of farthest pixel from feeding electrode of said scanning signal line is indicated as $\delta Vp$, and $\alpha$, $\beta$, $\gamma$ are respectively constants, deciding whether a formula (2C) and a formula (2D) are satisfied when upper limit value and lower limit value of allowable variation range of $\delta Vp$ are respectively indicated as $\xi+$ and $\xi-$, $\Delta Vp,vn$ for $\xi+$ and $\xi-$ are respectively indicated as $\Delta Vp,vn-$ and $\Delta Vp,vn+$, and rate of variation amount of $\delta Vp$ for variation amount of $\Delta Vp,vn$ is indicated as $\eta$, deciding again whether the formula (2C) and the formula (2D) are satisfied by changing value of each parameter when the formula (2C) and the formula (2D) are not satisfied, wherein, said formula (2A), formula (2B), formula (2C) and formula (2D) are $$\Delta Vp = (Cgs/Cload)(Vgh-Vgl) \tag{2A}$$

$$\delta Vp,typ = (\alpha \cdot \Delta Vp,vntyp + \beta)\gamma \tag{2B}$$

$$(\Delta Vp,vn+) - \Delta Vp,vntyp \leq \{(\xi-)-(\alpha \cdot \Delta Vp,vntyp+\beta)\gamma\}/\eta \tag{2C}$$

$$\Delta Vp,vntyp - (\Delta Vp,vn-) \leq \{(\alpha \cdot \Delta Vp,vntyp+\beta)\gamma-(\xi+)\}/\eta \tag{2D}.$$

20. The method for manufacturing according to claim 19, wherein, said step of deciding again whether a formula (2C) and a formula (2D) are satisfied comprises a step of changing values of Cgs and Cload.

21. The method for manufacturing according to any of claim 17 to claim 20, wherein, said n is range of 15-70.

22. The method for manufacturing according to claim 17, wherein, field-effect mobility of said semiconductor layer is 1.5 cm2/Vs or more and 50 cm2/Vs or less.

23. The method for manufacturing according to any of claim 17 or claim 22, wherein, said semiconductor layer is amorphous metal oxide.

24. The method for manufacturing according to any of claim 17 or claim 22, wherein, said semiconductor layer is organic matter.

* * * * *